United States Patent

Kuboya et al.

[11] Patent Number: 5,733,710
[45] Date of Patent: Mar. 31, 1998

[54] METHOD FOR MANUFACTURING A MASTER DIE FOR A DIFFUSION PLATE AND DIFFUSION PLATE MANUFACTURED BY SAID METHOD

[75] Inventors: Hiroshi Kuboya, Tokyo; Toshiharu Takahashi, Yamagata-ken; Makoto Iki, Tokyo; Moriyasu Shirayanagi, Tokyo; Koichi Maruyama, Tokyo; Teruaki Hiyamuta, Tokyo; Takayuki Sensui, Tokyo, all of Japan

[73] Assignee: Asahi Kogaku Kogyo Kabushiki Kaisha, Tokyo, Japan

[21] Appl. No.: 498,653

[22] Filed: Jul. 3, 1995

Related U.S. Application Data

[63] Continuation of Ser. No. 411,862, Mar. 28, 1995, abandoned, which is a continuation of Ser. No. 339,295, Nov. 10, 1994, abandoned, which is a continuation of Ser. No. 985,251, Dec. 3, 1992, abandoned.

[30] Foreign Application Priority Data

| Dec. 3, 1991 | [JP] | Japan | 3-357495 |
| Feb. 27, 1992 | [JP] | Japan | 4-090392 |
| Oct. 1, 1992 | [JP] | Japan | 4-263853 |

[51] Int. Cl.⁶ .................................................. G03F 7/22
[52] U.S. Cl. .......................... 430/312; 430/329; 430/394; 430/396
[58] Field of Search .................... 430/311, 313, 430/312, 320, 394, 396, 397; 280/492.1

[56] References Cited

U.S. PATENT DOCUMENTS

| 2,510,344 | 6/1950 | Laiu | 359/742 |
| 4,336,978 | 6/1982 | Suzuki | 359/599 |
| 4,427,265 | 1/1984 | Suzuki et al. | 359/599 |
| 4,441,798 | 4/1984 | Watanabe et al. | 354/200 |
| 4,523,807 | 6/1985 | Suzuki . | |
| 4,560,264 | 12/1985 | Kitazawa et al. . | |
| 4,567,123 | 1/1986 | Ohtaka et al. . | |
| 5,081,545 | 1/1992 | Sugawara et al. . | |
| 5,085,977 | 2/1992 | Sugawara et al. . | |
| 5,119,235 | 6/1992 | Umeda et al. | 354/200 |
| 5,155,635 | 10/1992 | Kakiuchi . | |
| 5,177,637 | 1/1993 | Tsukada | 359/599 |
| 5,308,741 | 5/1994 | Kemp | 430/312 |
| 5,439,764 | 8/1995 | Alter | 430/5 |

FOREIGN PATENT DOCUMENTS

| 55-090931 | 7/1980 | Japan . | |
| 57-148728 | 9/1982 | Japan . | |
| 0133533 | 7/1984 | Japan | 359/455 |
| 63-221329 | 9/1988 | Japan . | |
| 2226201 | 9/1990 | Japan . | |

*Primary Examiner*—Kathleen Duda
*Attorney, Agent, or Firm*—Greenblum & Bernstein P.L.C.

[57] ABSTRACT

A diffusion plate includes a plurality of superimposed basic patterns, each having a large number of microstructures. The microstructures are located in two dimensional periodic arrangements, and lattice vectors, corresponding to the periodic arrangement of the microstructures, vary in accordance with the pattern. The invention also discloses a method for manufacturing a master die for such a diffusion plate, and a focusing screen using the diffusion plate.

15 Claims, 106 Drawing Sheets

F NO=
2.0
2.8
4.0
5.6
8.0

F NO=
2.0
2.8
4.0
5.6
8.0

5,733,710

METHOD FOR MANUFACTURING A MASTER DIE FOR A DIFFUSION PLATE AND DIFFUSION PLATE MANUFACTURED BY SAID METHOD

This application is a continuation, of application Ser. No. 08/411,862, filed Mar. 28, 1995, now abandoned, which is a continuation of application Ser. No. 08/339,295, filed Nov. 10, 1994, now abandoned, which is a continuation of application Ser. No. 07/985,251, filed Dec. 3, 1992, now abandoned.

BACKGROUND OF THE INVENTION

1. Field of the Invention

The present invention relates to a diffusion plate which is used, for example, as a focusing screen in a single lens reflex camera, and a method for manufacturing a master die for such a diffusion plate.

2. Description of Related Art

In a known single lens reflex camera or the like, a focusing screen is located at a position that is optically equivalent to a film plane, so that a photographer can compose an image, having a desired focus, by observing the image through a view finder.

It is known to make the focusing screen using a diffusion plate having microscopic projections and indentations (i.e., an uneven surface) to observe an unsharp image formed on the focusing screen (i.e., diffusion plate), owing to the characteristic of the diffusion plate to diffuse light.

In a known method to prepare such a diffusion plate, the outer surface of a master die is subject to sanding or sand blasting to form micro projections and indentations thereon which are then transferred or copied onto a plastic optical element of acrylic resin, etc.

The diffusion plate thus prepared has micro projections and indentations of irregular shape forming a combination of micro prisms having acute apex angles. Consequently, part of the light incident upon the diffusion plate, from a taking lens side, is refracted or bent by the apexes at acute angles. Accordingly, much of the light is lost through the view finder before reaching the photographer's eye. Furthermore, when a diaphragm is stopped-down, the granularity of the diffusion plate becomes visible, resulting in a poor image quality.

To eliminate the drawbacks mentioned above, it is known to prepare a master die for a diffusion plate with an uneven surface having a regular micropattern of smooth apexes using optical means, such as a photoresist process, instead of mechanical means, such as sanding, sand blasting etc. A molding die is manufactured by copying the master die using an electro forming process, so that the regular micropattern can be transferred to an optical element (diffusion plate), as disclosed for example in Japanese Unexamined Patent Publication No. SHO 55-90931 or SHO 57-148728.

As is well known, the diffusibility is represented by a Fourier transform of a transmission function of a diffusion plate. The transmission function f(x, y) of a conventional diffusion plate having a regular (two dimensional periodical) pattern is obtained by;

$$f(x,y) = g(x,y) ** \sum_{n=-\infty}^{\infty} \sum_{m=-\infty}^{\infty} \delta(x - p_x m - q_x n)\delta(y - p_y m - q_y n)$$

wherein g(x, y) designates the transmission function of a microstructure, and $p=(p_x, p_y)$ and $q=(q_x, q_y)$ the two dimension periodic lattice vectors, $\delta$ the Dirac's $\delta$ function, and ** the two dimensional convolution integration, respectively. In this specification, p, q, and r, where referred to, represent vectors.

The Fourier transform $f(\omega_x, \omega_y)$ of f(x, y) is given by the following discrete function.

$$F((\omega_x,\omega_y)) = \int_{-\infty}^{\infty}\int_{-\infty}^{\infty} f(x,y)\exp\{-j2\pi(\omega_x x + \omega_y y)\}dxdy =$$

$$G(\omega_x,\omega_y)|D| \sum_{n=-\infty}^{\infty} \sum_{m=-\infty}^{\infty} \delta(\omega_x - a_1 n - a_2 m)\delta(\omega_y - b_1 n - b_2 m)$$

wherein $G(\omega_x, \omega_y)$ designates the Fourier transform of the function g(x, y), and $(a_1, b_1)$ and $(a_2, a_b)$ the two dimensional lattice vectors of the diffusibility.

There is a relationship between $(p_x, p_y)$ and $(q_x, q_y)$ as follows.

$$D=a_1 b_2 - a_2 b_1 = (-p_x q_y - p_y q_x)^{-1}$$

$$a_1 = p_y D, \; b_1 = -p_x D, \; a_2 = q_y D, \; b_2 = q_x D$$

$\omega_x$ and $\omega_y$ are given by;

$$\alpha = \lambda\omega_x, \; \beta = \lambda\omega_y, \; \gamma = (1-\alpha^2-\beta^2)^{1/2}$$

wherein $(\alpha, \beta, \gamma)$ designates the direction cosine in the observation direction of the diffusion, and $\gamma$ the wavelength, respectively.

Therefore, the conventional diffusion plate having a regular (two dimensional periodical) pattern functions as a diffraction grating. Accordingly, the discrete diffusibility is inevitable. Consequently, an off-axis aberration, in which multi-lined images appear when a defocused (out of focus) image is viewed, takes place. Furthermore, since the diffraction angle varies depending on the wavelength, if the pitch (i.e., lengths p and q of the two dimensional lattice vectors) is small and the diffraction angle is large, there is a conspicuous irregularity in color of the observed image.

It is possible to prevent the multi-lined image and irregularity of color by increasing the pitch, but the increased pitch causes a periodic structure of the mat to appear within the field of view of the view finder, obstructing the view.

FIG. 1 shows a known diffusion plate having a pattern of microlenses having a maximum density arrangement. The microlenses are arranged at a pitch of 16 µm, for example. Each microlens has 10 µm diameter and 1.6 µm height.

FIGS. 2 through 10 show diagrams of various optical properties of the diffusion plate shown in FIG. 1.

FIGS. 2 through 4 show diffusion properties (diffraction patterns) of the plate by showing defocused images of point light sources having wavelengths of 450 nm, 550 nm, and 650 nm, respectively. In FIGS. 2 through 4, the diameters of the small circles (points) g correspond to the intensity of diffracted light in the directions of the diameters, and the large circles h represent the F numbers of the bundles of rays incident on the diffusion plate, i.e., 2.0, 2.8, 4.0, 5.6, and 8.0, as viewed from the side of the outermost circle, respectively.

FIGS. 5 through 7 show the quantity of light (at wavelengths of 450 nm, 550 nm, and 650 nm, respectively) (represented by the ordinate of the graph) contained in the large circles (encircled power) depicted in FIGS. 2–4, respectively. The circles have radii represented by the values on the abscissa of the graph. The above assumes that the total quantity of light transmitted through the diffusion plate, as shown in FIG. 1, is 1.0.

FIGS. 8 through 10 show defocused image intensities of the line light sources (line diffraction patterns in which the longitudinal line light source is represented by the solid lines and the lateral line light source is represented by the imaginary lines) at wavelengths of 450 nm, 550 nm, and 650 nm, respectively. The abscissa represents the radii of diffraction of the diffraction patterns (diffusion angle of the diffusion plate), and the ordinate represents the relative intensity of the light, on the assumption that the peak intensity is 1.0, respectively.

FIG. 11 shows a structure of another known diffusion plate, having a square arrangement of microlenses (microstructures) having 10 μm diameter and 1.6 μm height at a uniform pitch of 16 μm.

FIGS. 12 through 20 show diagrams of various optical properties of the diffusion plate shown in FIG. 11.

FIGS. 12 through 14 show diffusion properties of the plate by showing defocused images of a point light having a wavelength of 450 nm, 550 nm, and 650 nm, respectively. In FIGS. 2 through 4, the diameters of the small circles (points) g correspond to the intensity of diffracted light in the directions of the diameters, and the large circles h represent the F numbers of the bundle of rays incident on the diffusion plate, i.e., 2.0, 2.8, 4.0, 5.6, and 8.0, as viewed from the side of the outermost circle, respectively.

FIGS. 15 through 17 show the quantity of light (represented by the ordinate) contained in the circles having radii represented by the abscissa, at the wavelengths of 450 nm, 550 nm, and 650 nm, on the assumption that the total quantity of light transmitted through the diffusion plate, as shown in FIG. 11, is 1.0.

FIGS. 18 through 20 show defocused image intensities of the line light sources (longitudinal line light source represented by the solid lines and lateral line light source represented by the imaginary lines) at the wavelengths of 450 nm, 550 nm, and 650 nm, respectively. The abscissa represents the radius of diffraction, and the ordinate represents the relative intensity of light, on the assumption that the peak intensity is 1.0.

As can be seen from the drawings discussed above, the known two-dimensional periodic diffusion plates have a discrete diffusion property which largely depends on the wavelength, resulting in a deteriorated aberration property and irregularity in color.

SUMMARY OF THE INVENTION

The primary object of the present invention is to provide a diffusion plate, which is free from the drawbacks which occur in the sanded mat or the periodic mat, and which can obtain a brighter field of view without causing an off-axis aberration (multi-lined image) or irregularity in color.

Another object of the present invention is to provide a diffusion plate in which the mat structure cannot be seen in the view finder.

The present invention is also addressed to a method for easily manufacturing such a diffusion plate.

According to an aspect of the present invention, there is provided a diffusion plate including a plurality of superimposed basic microstructure patterns, wherein the microstructures are located in two dimensional periodic arrangements, and wherein lattice vectors, corresponding to the periodic arrangement of the microstructures, vary in accordance with the pattern.

According to another aspect of the present invention, there is provided a diffusion plate including members having diffusion surfaces on which microstructures are formed in a predetermined arrangement, wherein the members are superimposed, and wherein the microstructures of the members are located in a two dimensional periodic arrangement and have lattice vectors that vary depending on the members.

According to still another aspect of the present invention, there is provided a focusing screen comprising a diffusion plate having a diffusion surface, and a Fresnel lens located adjacent to the diffusion plate, wherein a diffusion surface is provided on the surface of the Fresnel lens opposite the diffusion plate.

A focusing screen includes a diffusion plate, having a plurality of superimposed basic microstructure patterns, and a Fresnel lens located close to the diffusion plate. The microstructures are located in two dimensional periodic arrangements. The lattice vectors, corresponding to the periodic arrangement of the microstructures, vary in accordance with the pattern. The microstructures of at least one of the basic patterns contain a random fluctuation of microstructures added to the reference two dimensional period.

The invention is also directed to a method for preparing a master die for a diffusion plate including steps of providing a substrate, with a photosensitive material coated thereon, opposite a mask having a micro pattern at a predetermined distance, and illuminating the mask from behind with light, thereby projecting the micro pattern onto the photosensitive material to be exposed. The steps further include developing the photosensitive material to form the microstructures on the substrate, wherein the substrate or the mask is rotated in a predetermined direction, within a plane, to at least two angular positions of the mask, relative to the substrate, so that the exposures are effected at each of the at least two relative angular positions to form a desired microstructure on the substrate.

The master die is for preparing a plastic molding die which can be used to prepare a diffusion plate according to the present invention.

The transmission function f(x, y) of a diffusion plate, according to the present invention, is obtained by the multiplication of those $f_1(x, y)$, $f_2(x, y)$, $f_3(x, y)$, ... of basic patterns which constitute the diffusion plate, as follows.

$$f(x, y)=f_1(x, y)f_2(x, y)f_3(x, y) \cdots$$

Accordingly, the diffusion property of the diffusion plate, i.e., the Fourier transform of f(x, y) is obtained by the following equation;

$$F(\omega_x, \omega_y)=F_1(\omega_x, \omega_y)  F_2(\omega_x, \omega_y)  F_3(\omega_x, \omega_y) ** \cdots$$

wherein; $F_1(\omega_x, \omega_y)$, $F_2(\omega_x, \omega_y)$, $F_3(\omega_x, \omega_y)$ ... designate the Fourier transforms of the transmission functions $f_1(x, y)$, $f_2(x, y)$, $f_3(x, y)$ ... of the basic patterns.

The diffusion properties of the respective basic patterns are discrete, but the resultant diffusion property of the diffusion plate, obtained as a result of the convolution integration, has a higher density than those of the basic patterns. This is due to the variation in the two-dimensional lattice vectors. As a result of this, the aberration property can be improved.

Discreteness, by convolution integration, is improved as follows.

It is assumed that discreteness of the basic pattern A is represented by seven discrete spectra, as shown in FIG. 21. The basic pattern B is represented by seven discrete spectra which are obtained by turning the basic pattern A by 90°, as shown in FIG. 22, respectively. The resultant discrete spectra C of the diffusion plate, consisting of the basic patterns A and B, are obtained by the convolution integration of FIGS. 21 and 22, as shown in FIG. 23, in which there are 49 (=7×7) discrete spectra.

It is apparent that the discreteness of the diffusion property, as shown in FIGS. 21 and 22, is improved by the arrangement illustrated in FIG. 23.

The present disclosure relates to the subject matter contained in Japanese patent application Nos. HEI 03-357495 (filed on Dec. 3, 1991), HEI 04-90392 (filed on Feb. 27, 1992), and HEI 04-263853 (filed on Oct. 1, 1992) which are expressly incorporated herein by reference in their entirety.

BRIEF DESCRIPTION OF THE DRAWINGS

The invention will be described below in detail with reference to the accompanying drawings, in which;

FIGS. 56, 57, and 58 are diagrams showing distributions of light diffused by the diffusion plate, as shown in FIG. 52 at wavelengths of 450 nm, 550 nm, and 650 nm, respectively, wherein the abscissa represents the radii of circles and the ordinate represents the quantity of light contained in the circles;

DETAILED DESCRIPTION OF THE PREFERRED EMBODIMENTS

Figure 113:
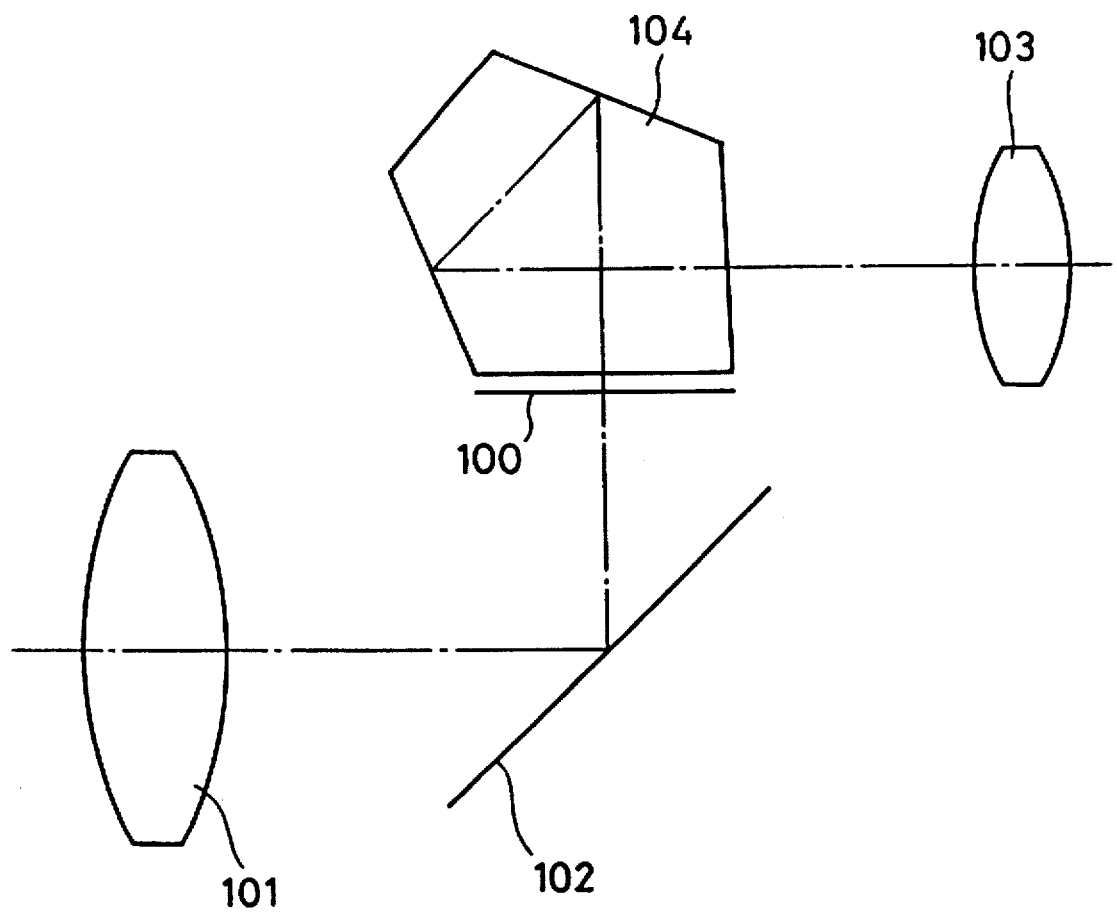

The illustrated embodiments, which will be discussed below, are applied to a diffusion plate which is used as a focusing screen provided in, for example, a view finder of a single lens reflex camera. In FIG. 113, a bundle of rays, reflected from an object to be photographed, are transmitted through a taking lens 101 and reflected by a quick return mirror 102, before being converged onto a focusing screen 100, so that a photographer can observe an image of the object through an eyepiece 103 and a pentagonal prism 104 of a view finder.

Embodiment 1

Figure 24:
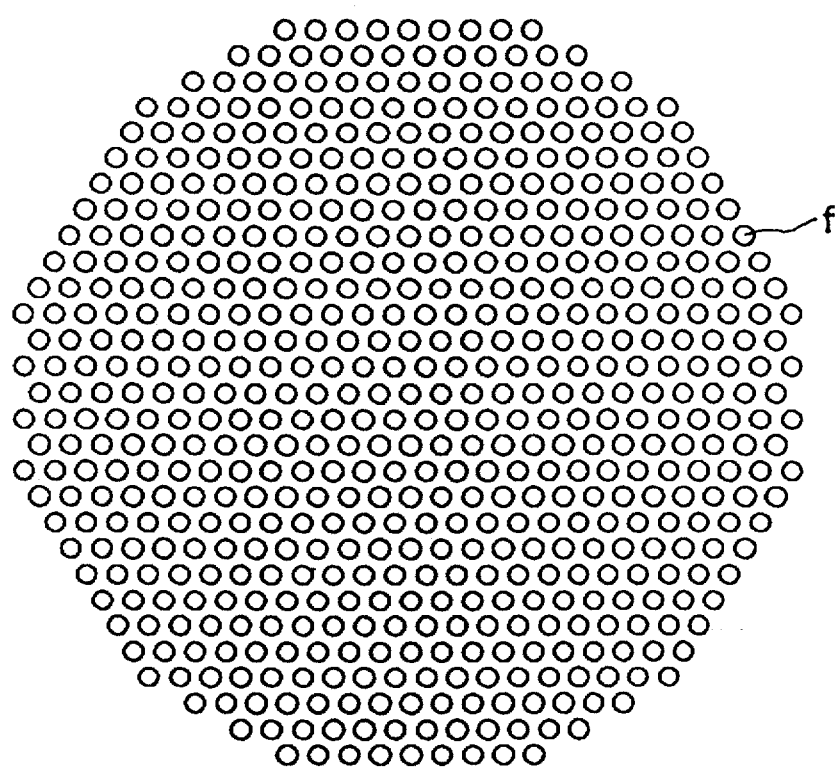
FIGS. 24 and 25 are schematic diagrams of two basic patterns in a first embodiment of the present invention.
Figure 25:
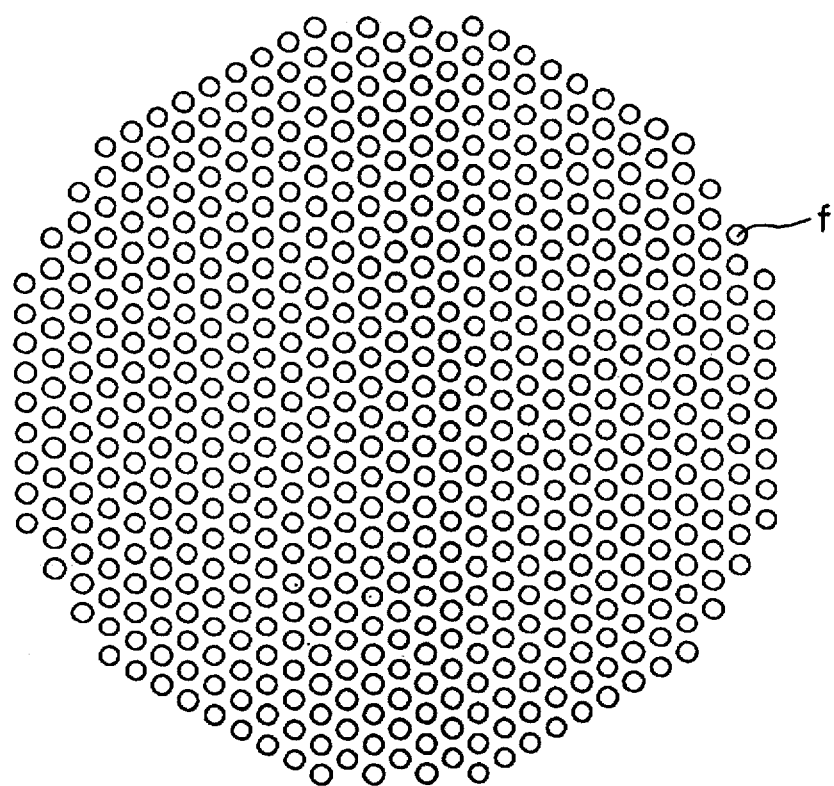

FIG. 24 shows a basic pattern of a diffusion plate, according to a first embodiment, in which microlenses f (micro structures) of 1.2 μm height and 10 μm diameter are arranged with the highest possible density at a pitch of 16 μm. FIG. 25 shows another basic pattern of a diffusion plate, according to a first embodiment, in which microlenses f (microstructures) of 1.2 μm height are arranged in a manner having the highest density possible. The microlenses are arranged having a pitch of 16 μm, similar to FIG. 24, but there is a difference of 30° in the orientation between FIG. 24 and FIG. 25.

Figure 26:
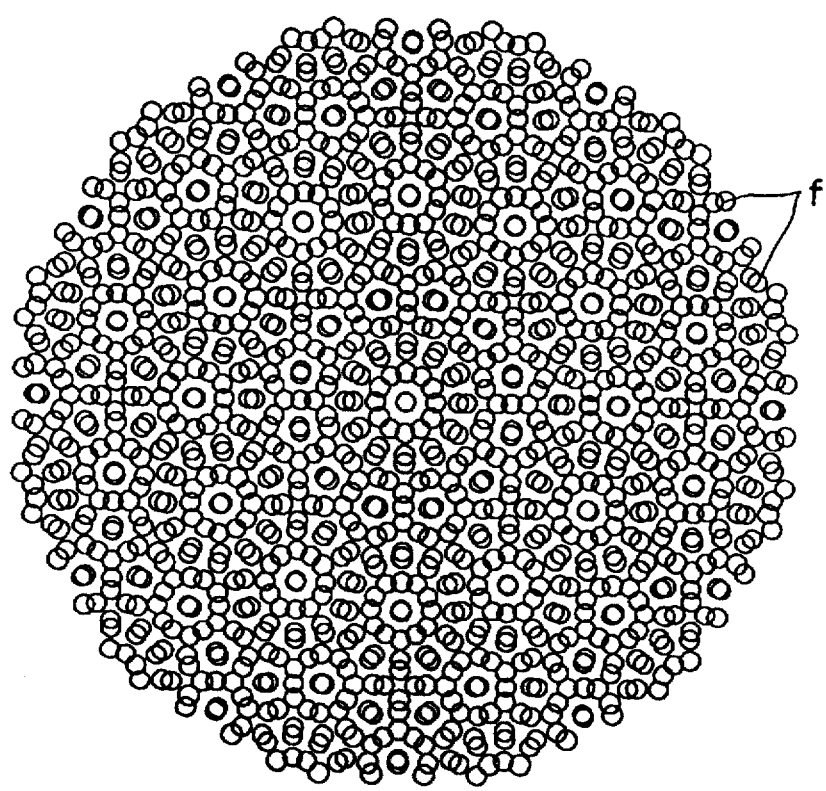
FIG. 26 is a schematic view of a diffusion plate structure made by a combination of the arrangements, as shown in FIGS. 24 and 25, according to a first embodiment of the present invention.

FIG. 26 shows a resultant pattern of a diffusion plate which is a combination of the basic patterns shown in FIGS.

24 and 25. Note that there is no periodicity in the resultant pattern of the superimposed basic patterns. Although the resultant pattern may appear periodic, it is not.

Figure 27:
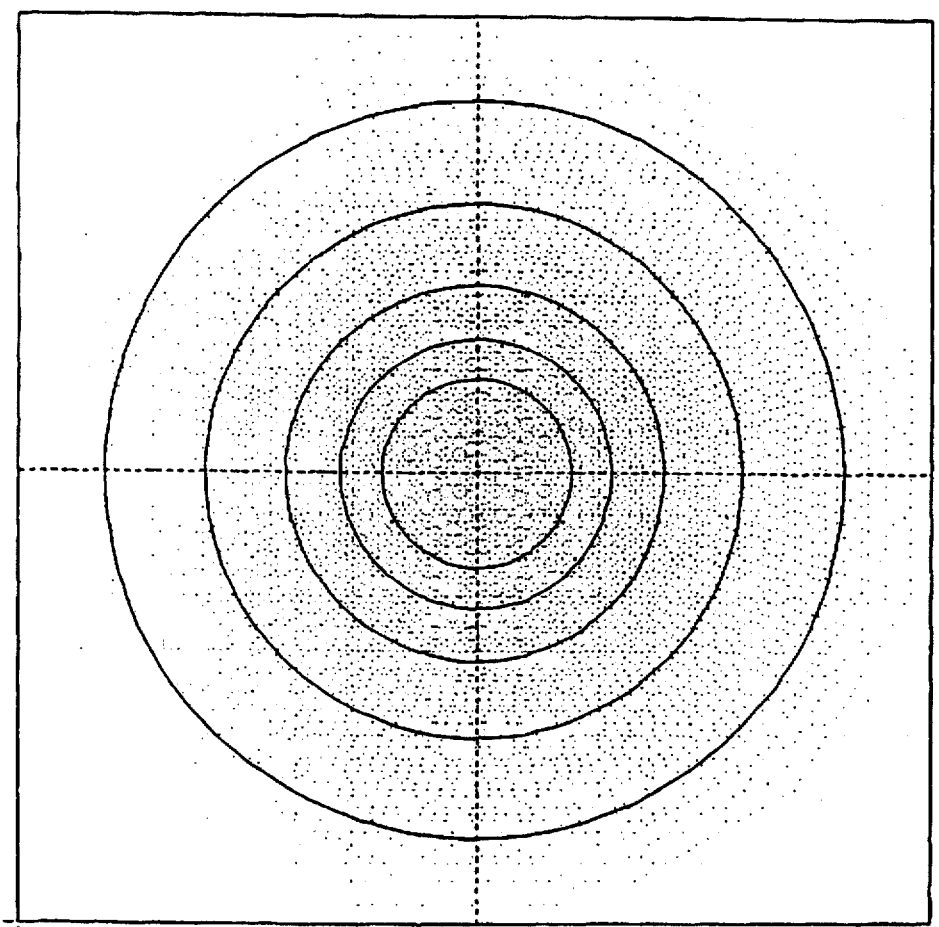
FIGS. 27, 28, and 29 are diagrams which show defocused images of a point light source produced by the diffusion plate, as shown in FIG. 26, at wavelengths of 450 nm, 550 nm, and 650 nm, respectively.
Figure 28:
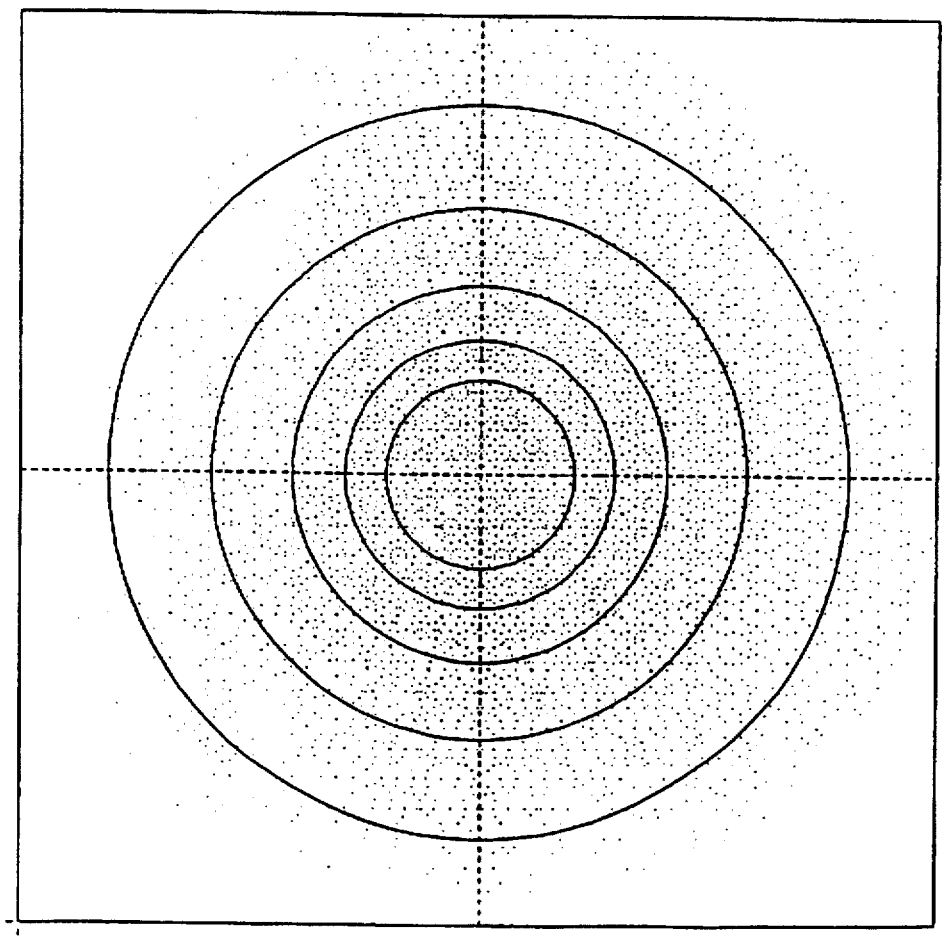
Figure 29:
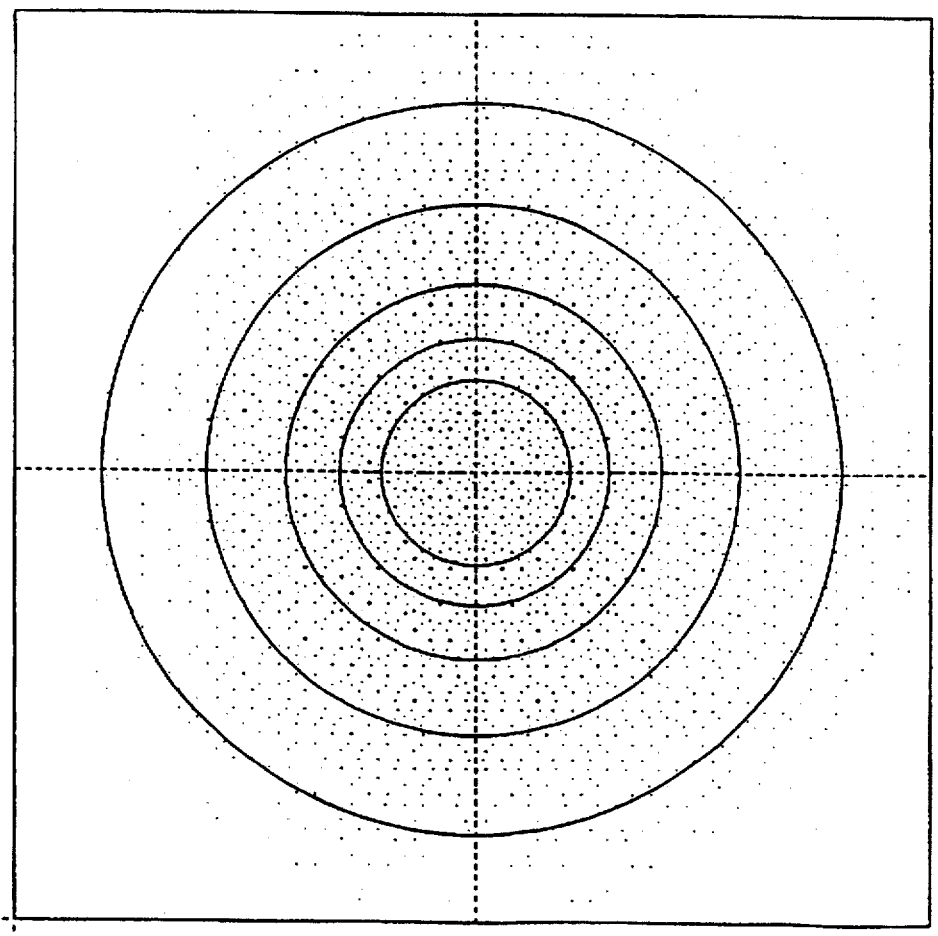

FIGS. 27 through 35 show optical properties of the diffusion plate, as shown in FIG. 26. FIGS. 27 through 29 show diffusion properties, i.e., an unsharpness (defocus) of a point light source at the wavelengths of 450 nm, 550 nm, and 650 nm, respectively. In FIGS. 27 through 29, the diameters of the small circles (points) correspond to the intensity of diffracted light in the directions of the diameters thereof, and the large circles correspond to the F numbers of a bundle of rays incident upon the diffusion plate. The F numbers are 2.0, 2.8, 4.0, 5.6, and 8.0, respectively, as viewed from the outermost circle.

Figure 30:
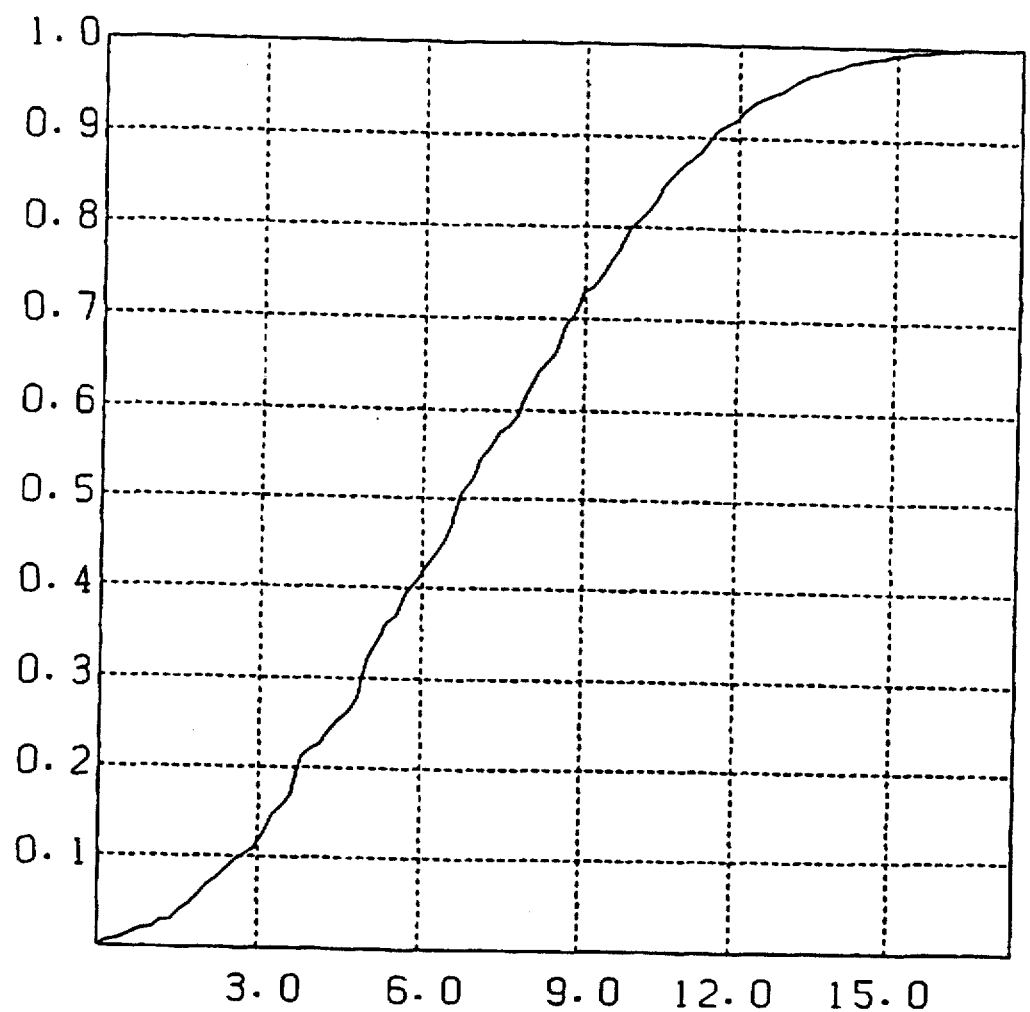
FIGS. 30, 31, and 32 are diagrams showing distributions of the light diffused by the diffusion plate, as shown in FIG. 26, at wavelengths of 450 nm, 550 nm, and 650 nm, respectively, wherein the abscissa represents the radii of circles and the ordinate represents the quantity of light contained in the circles.
Figure 31:
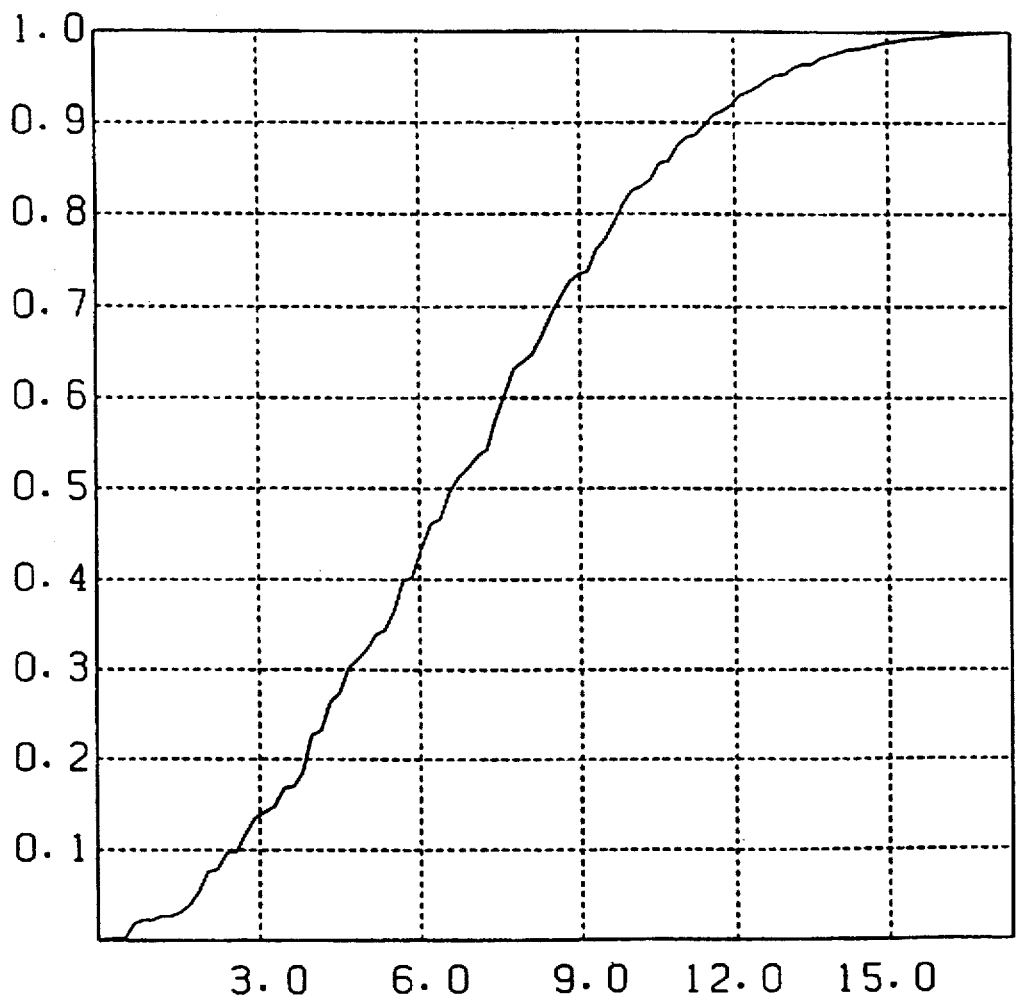
Figure 32:
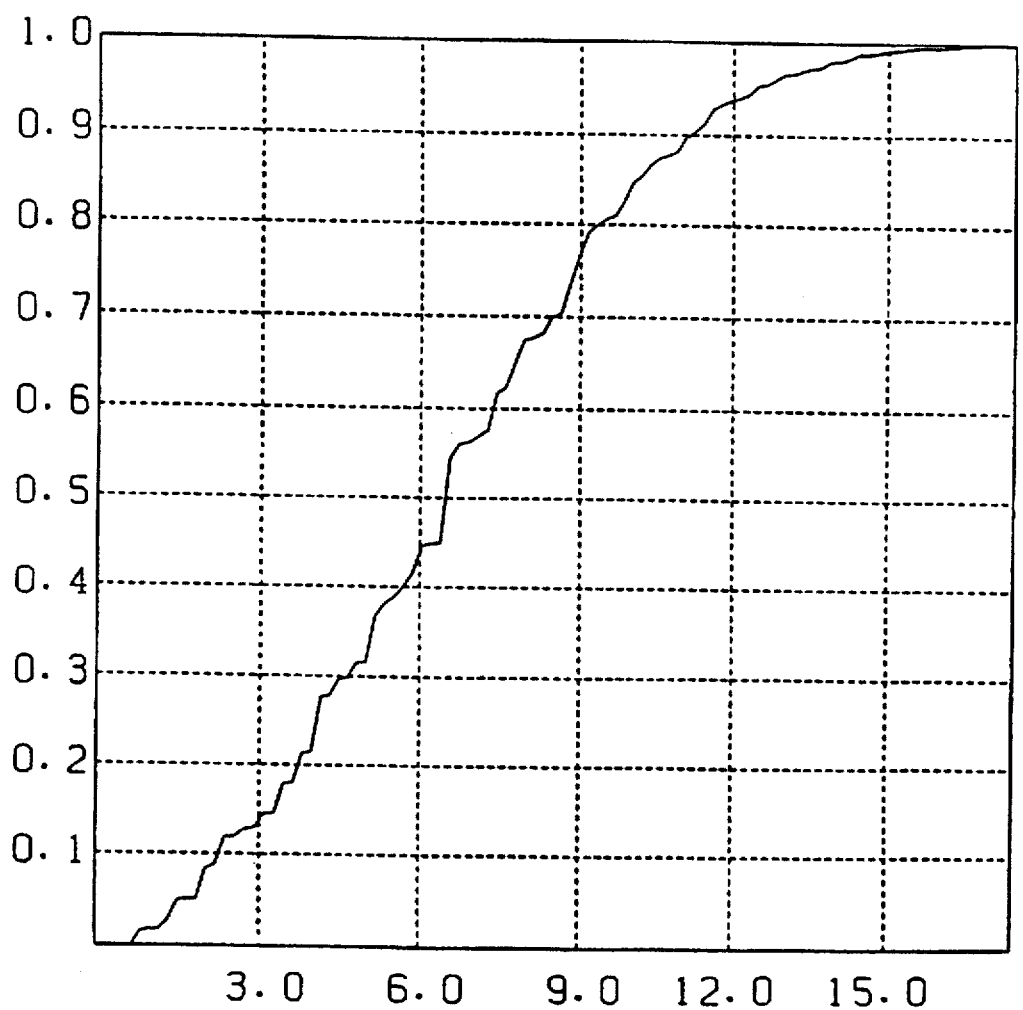

FIGS. 30 through 32 show the quantity of light contained in the circles at the wavelengths of 450 nm, 550 nm, and 650 nm, respectively. In FIGS. 30 through 32, the abscissa represents the radii of the circles, and the ordinate represents the quantity of light contained in the circles. The graphs assume that the total quantity of light transmitted through the diffusion plate, as shown in FIG. 26, is 1.0.

Figure 33:
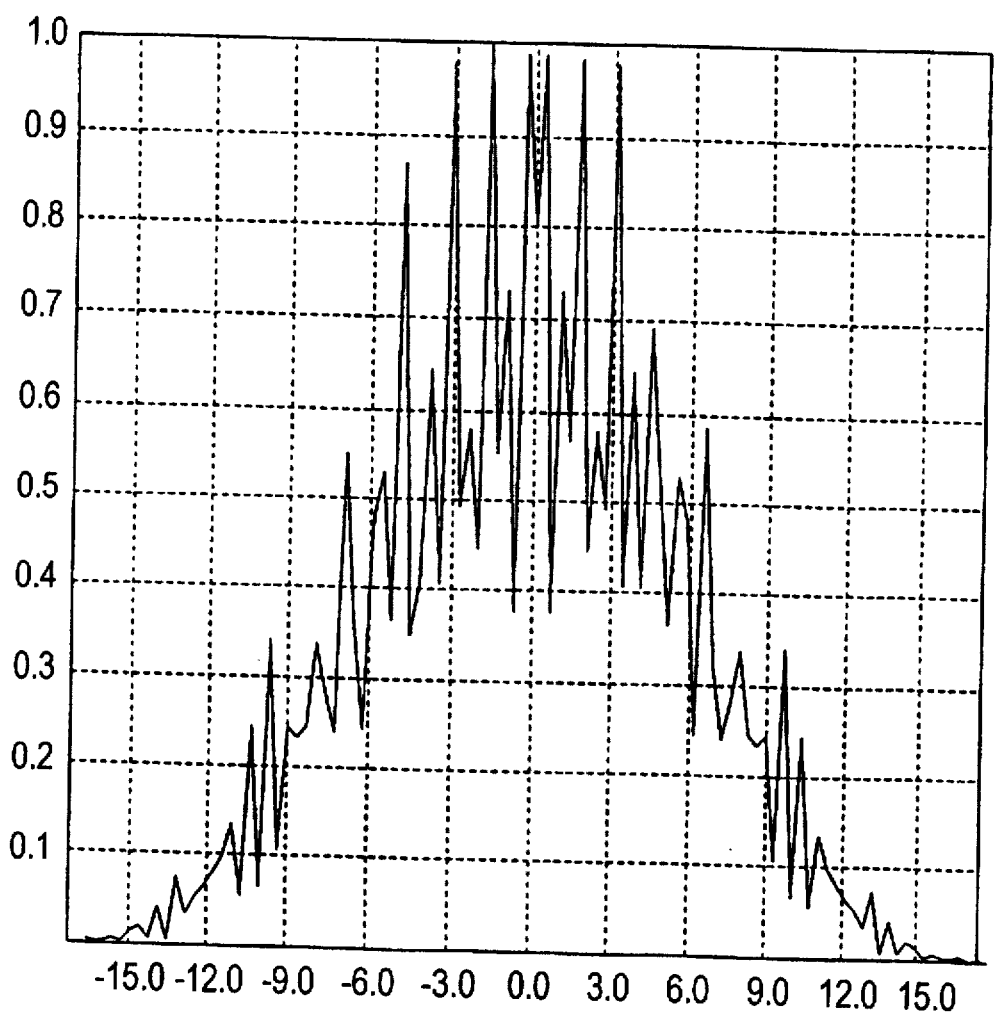
FIGS. 33, 34, and 35 are diagrams showing defocused images in the vertical and horizontal directions, obtained by integrating the functions illustrated in FIGS. 30, 31, and 32, respectively.
Figure 34:
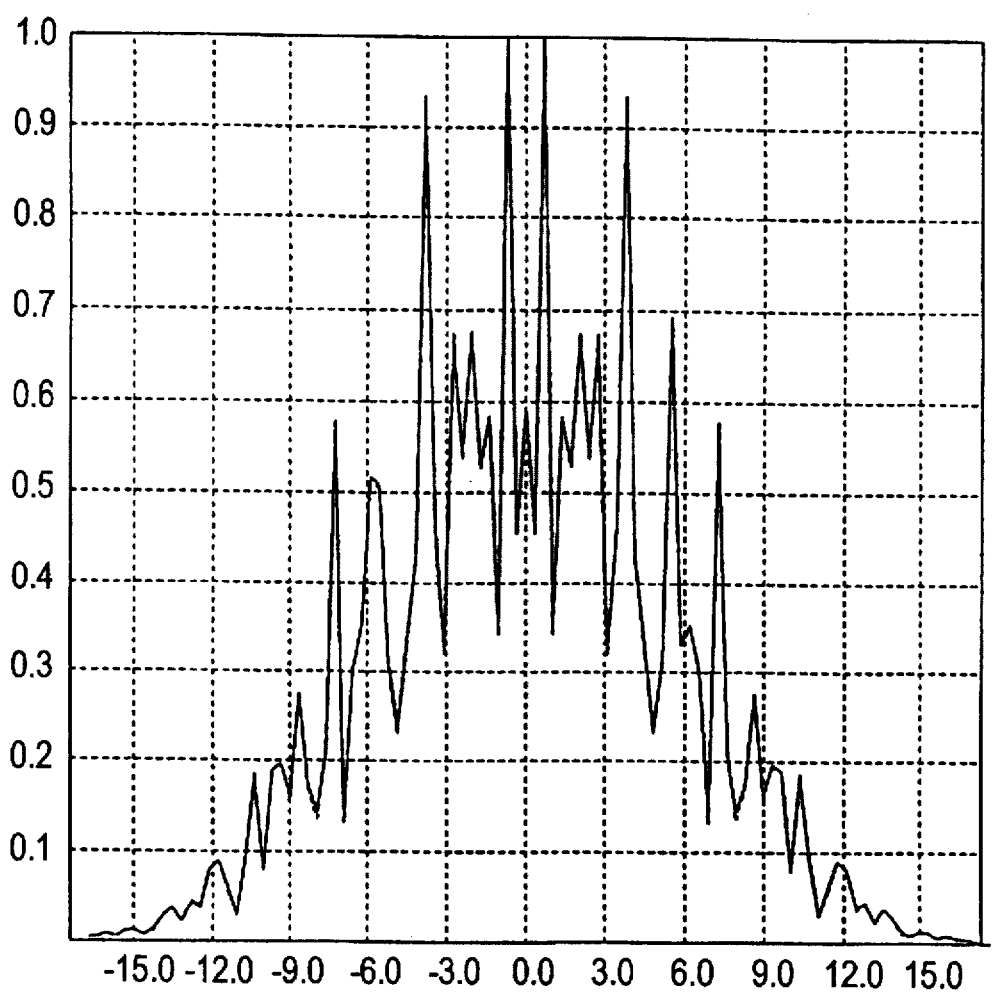
Figure 35:
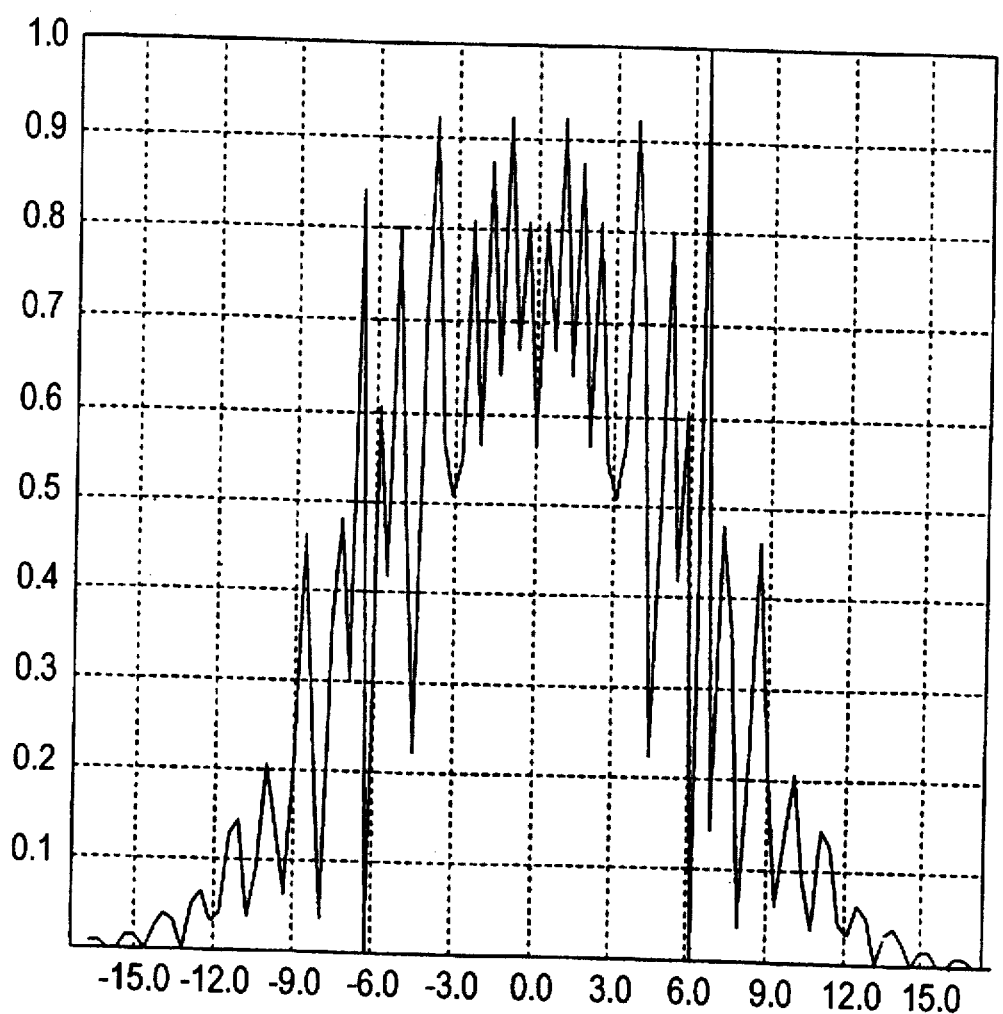

FIGS. 33 through 35 show defocused image intensities of the line light sources at wavelengths of 450 nm, 550 nm, and 650 nm, respectively. The solid lines designate the vertical line light sources and the imaginary lines designate the horizontal line light sources, respectively. In FIGS. 33 through 35, the abscissae represent the radii of diffraction of the diffraction patterns, and the ordinates represent the relative light intensity, respectively, on the assumption that the peak intensity is 1.0. In FIGS. 33 through 35, since there is no difference in the distribution depending on the direction of the line light sources, the solid lines and the imaginary lines overlap.

In comparison with the prior art shown in FIGS. 2 through 10, the diffusion property of the diffusion plate, as shown in FIGS. 27 through 35, is indiscrete and less dependent on the wavelength, so that the diffusion property can be improved in the present invention.

Figure 1:
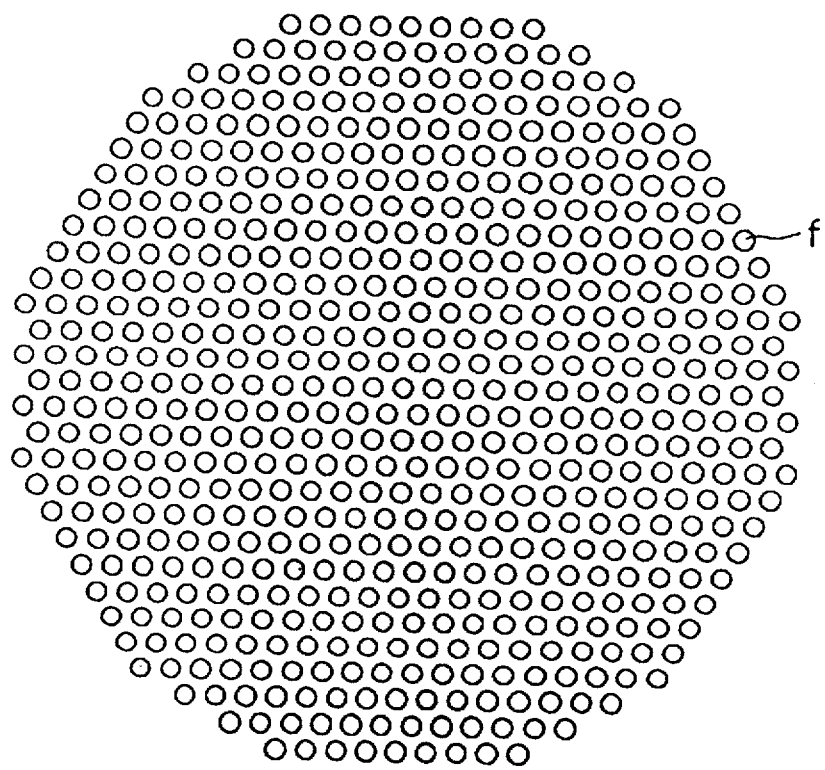
FIG. 1 is a schematic view of a structure of a known diffusion plate having the highest possible density arrangement of micro lenses.
Figure 2:
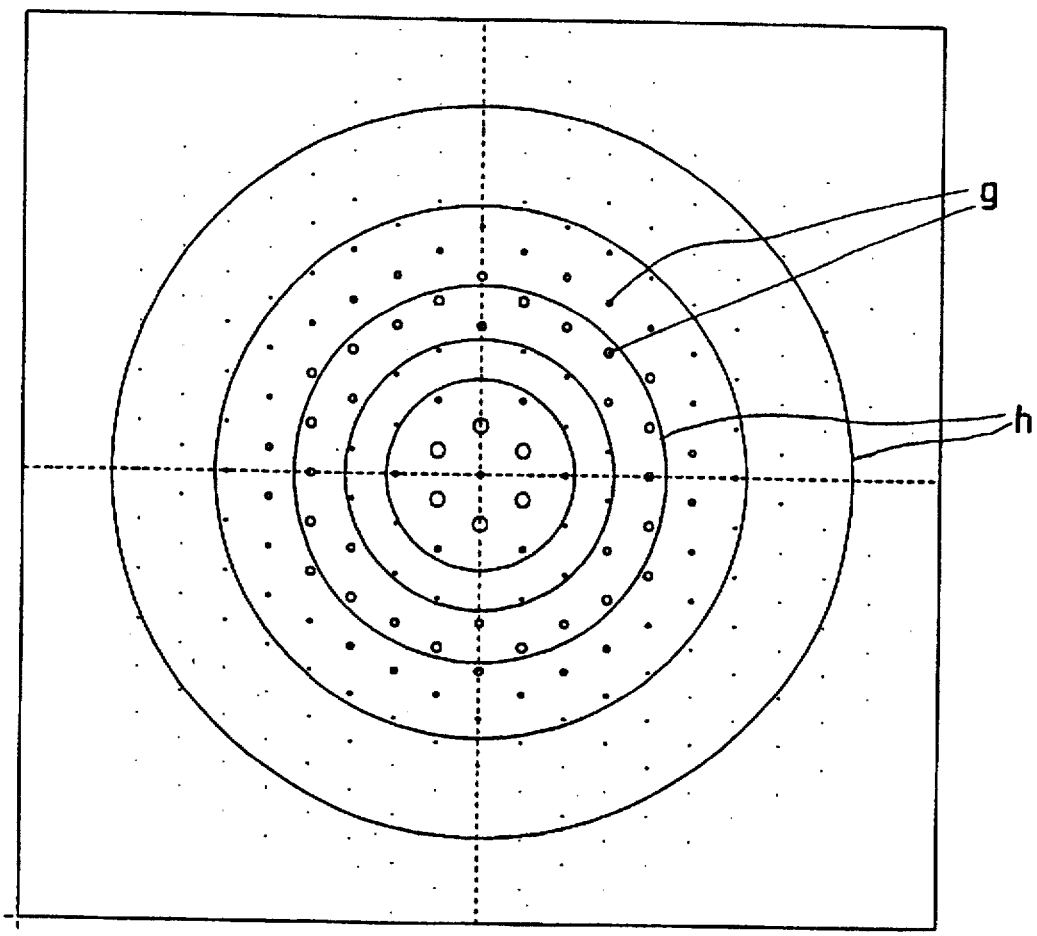
FIGS. 2, 3, and 4 are diagrams which show defocused images of a point light source by the diffusion plate, as shown in FIG. 1, at wavelengths of 450 nm, 550 nm, and 650 nm, respectively.
Figure 3:
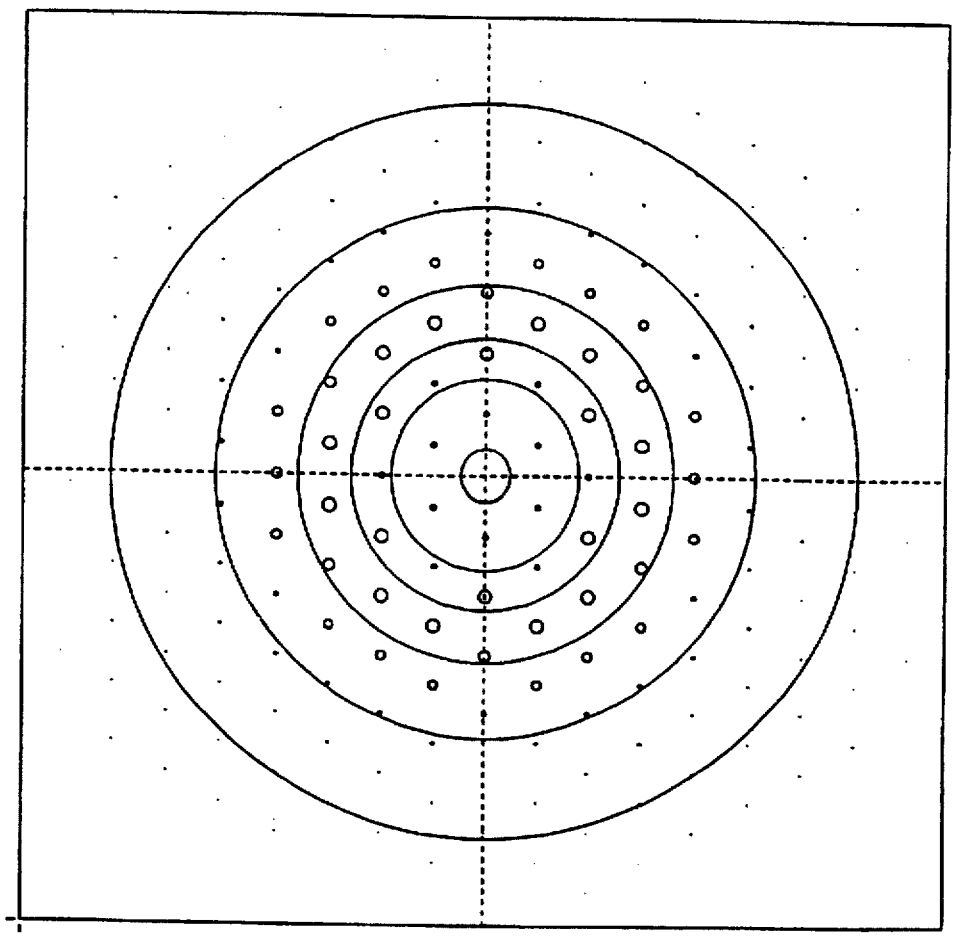
Figure 4:
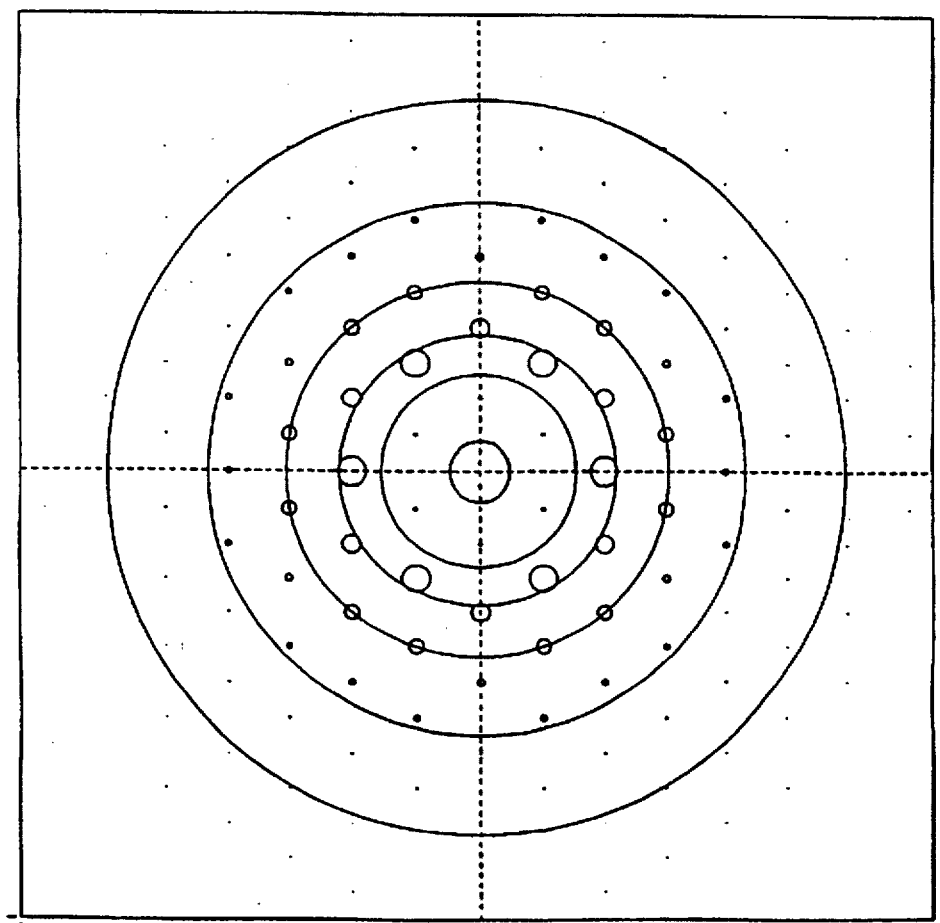
Figure 5:
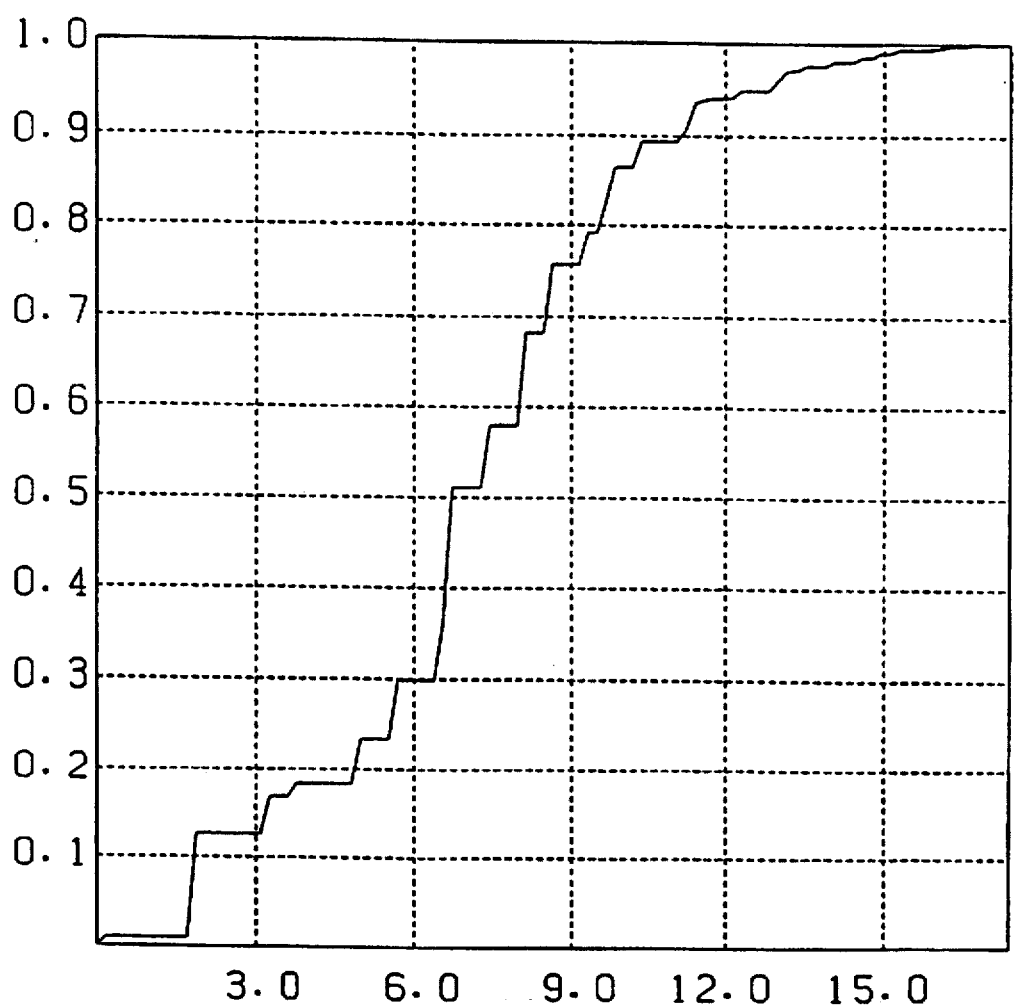
FIGS. 5, 6, and 7 are diagrams showing distributions of light diffused by the diffusion plate, as shown in FIG. 1, at wavelengths of 450 nm, 550 nm, and 650 nm, respectively, wherein the abscissa represents the radii of circles and the ordinate represents the quantity of light contained in the circles.
Figure 6:
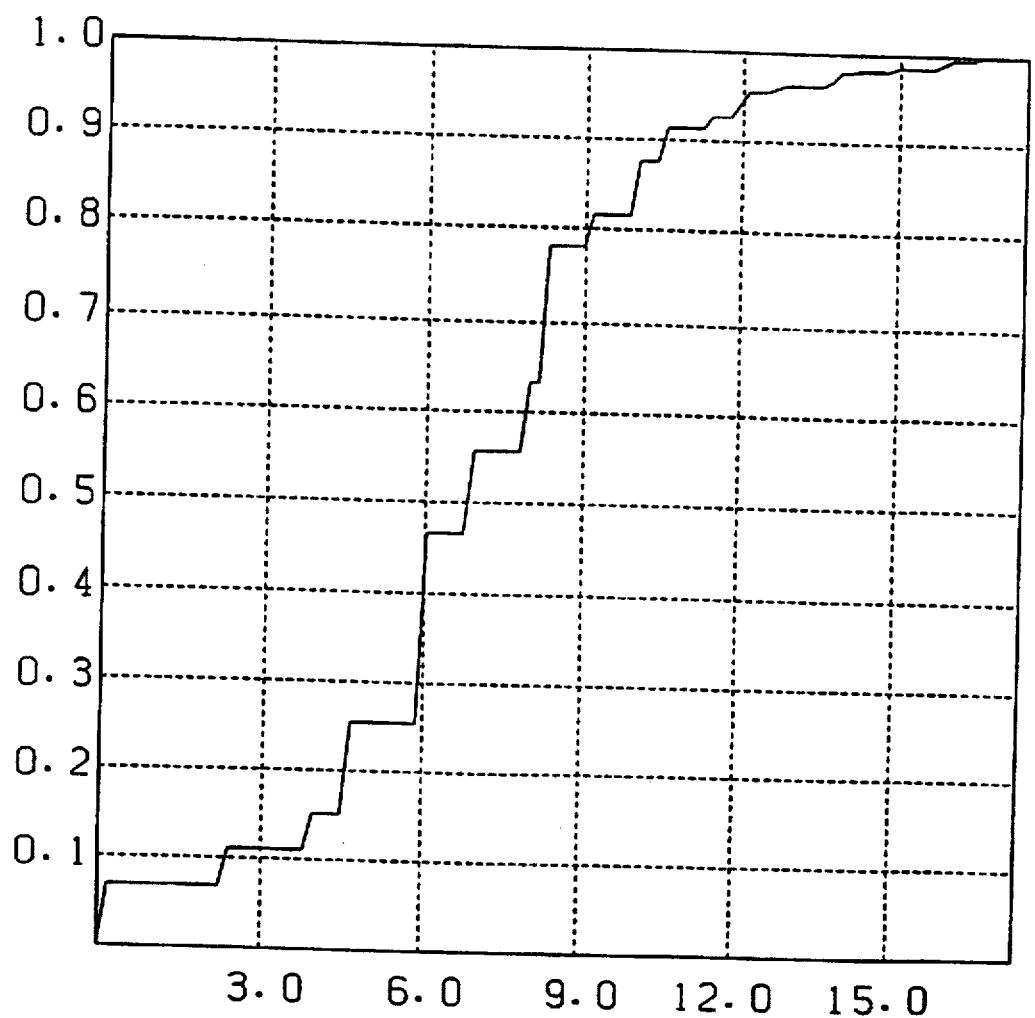
Figure 7:
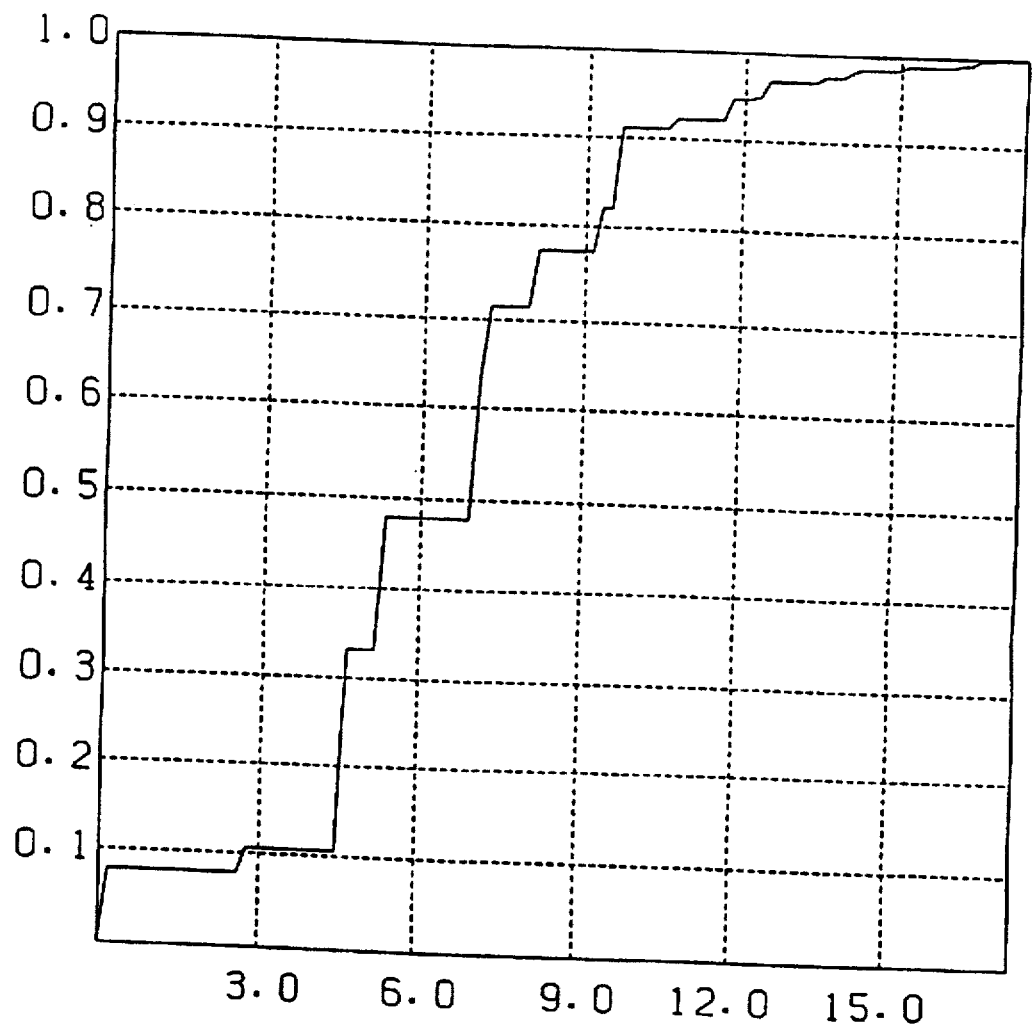
Figure 8:
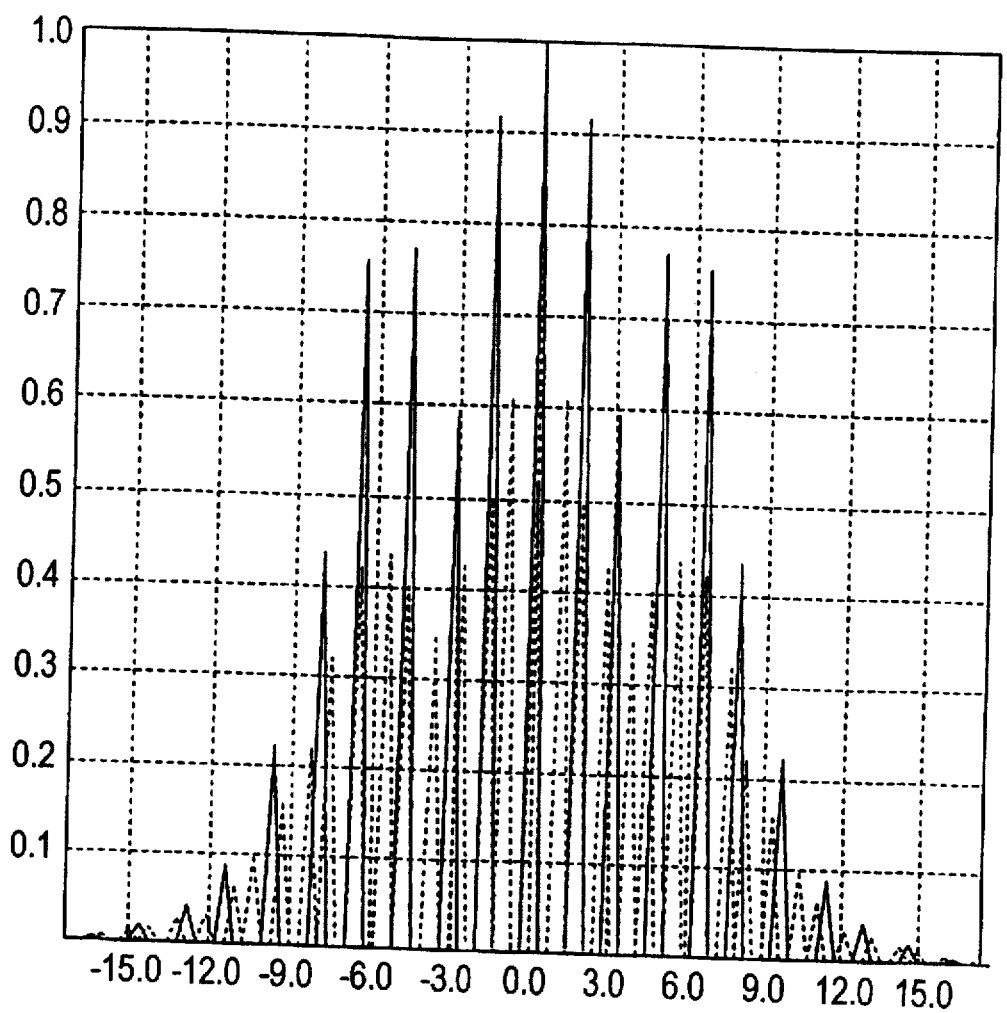
FIGS. 8, 9, and 10 are diagrams showing defocused image intensities in the vertical and horizontal directions, obtained by integrating the functions illustrated in FIGS. 5, 6, and 7, respectively.
Figure 9:
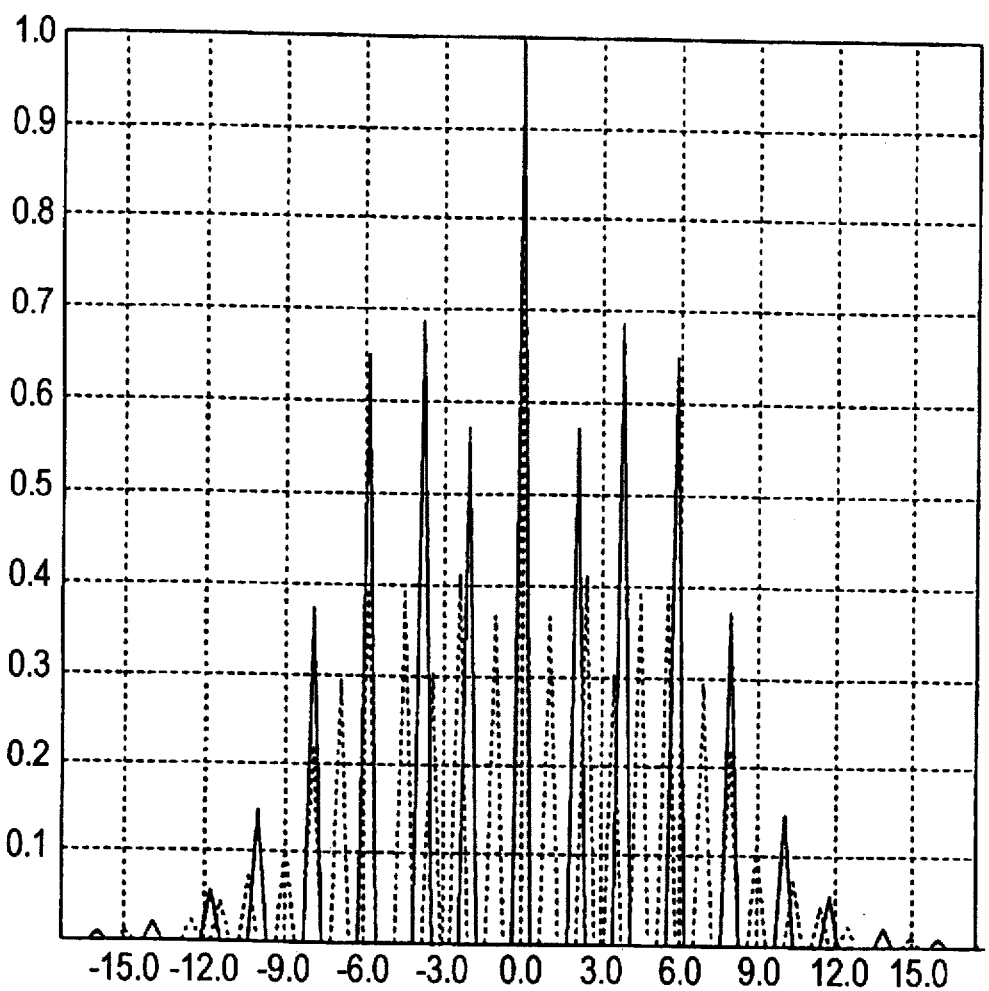
Figure 10:
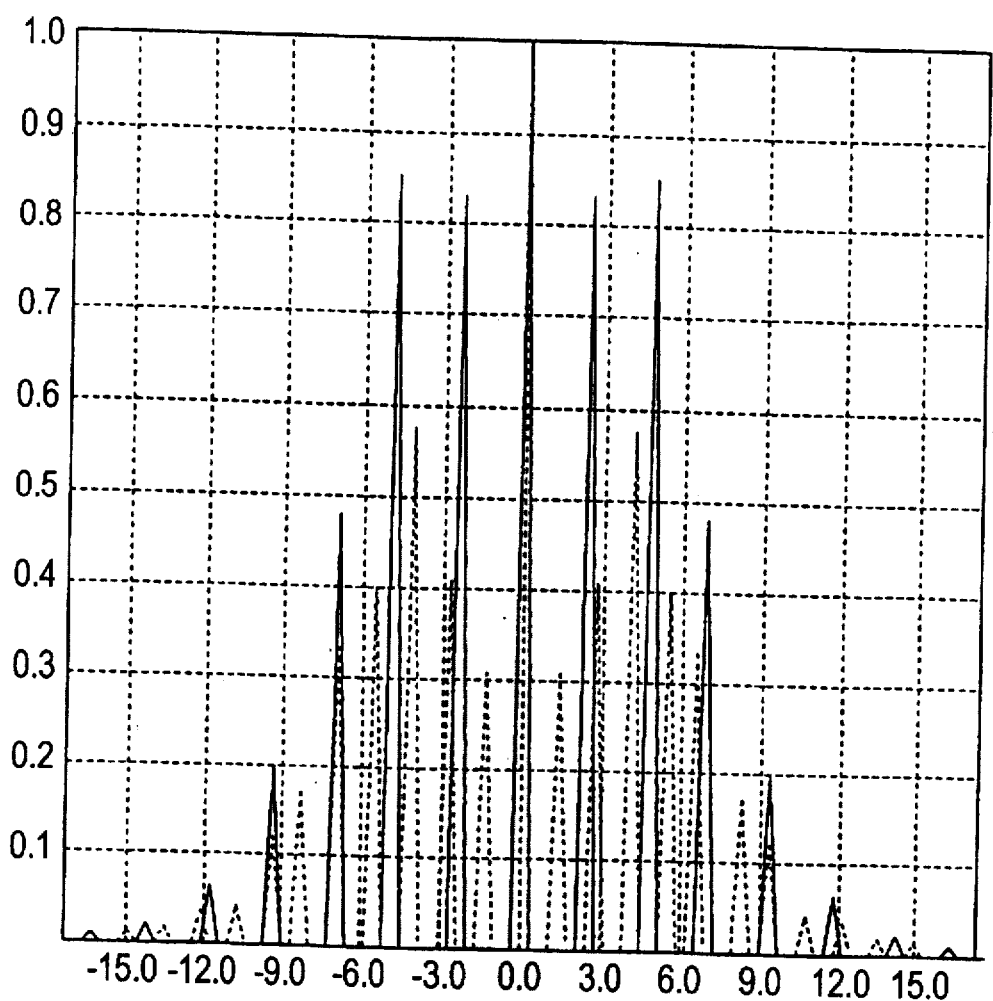
Figure 11:
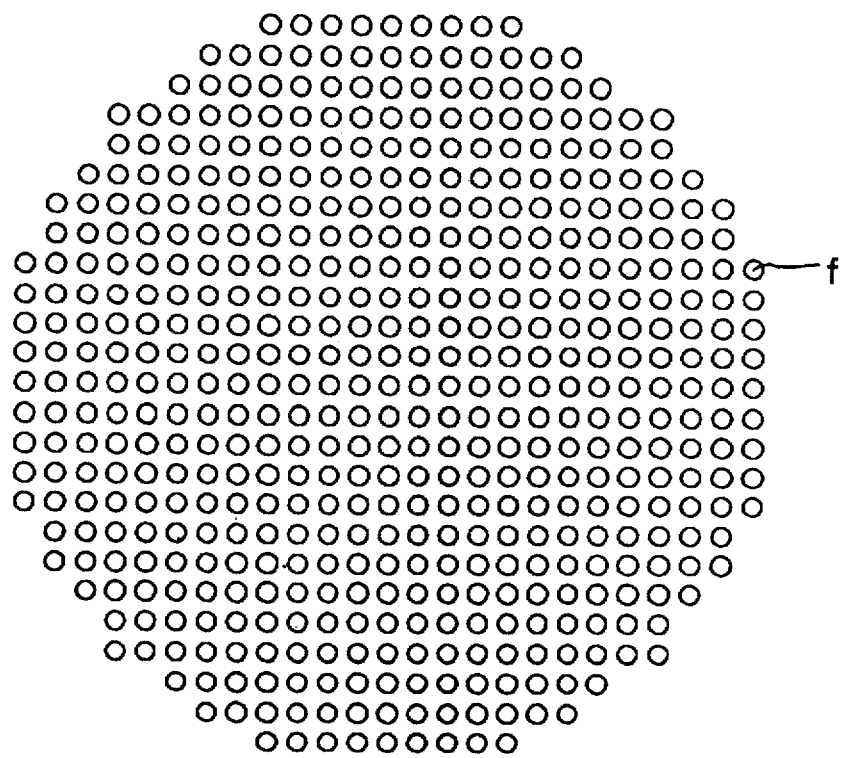
FIG. 11 is a schematic view of a structure of another known diffusion plate having a square arrangement of microlenses.
Figure 12:
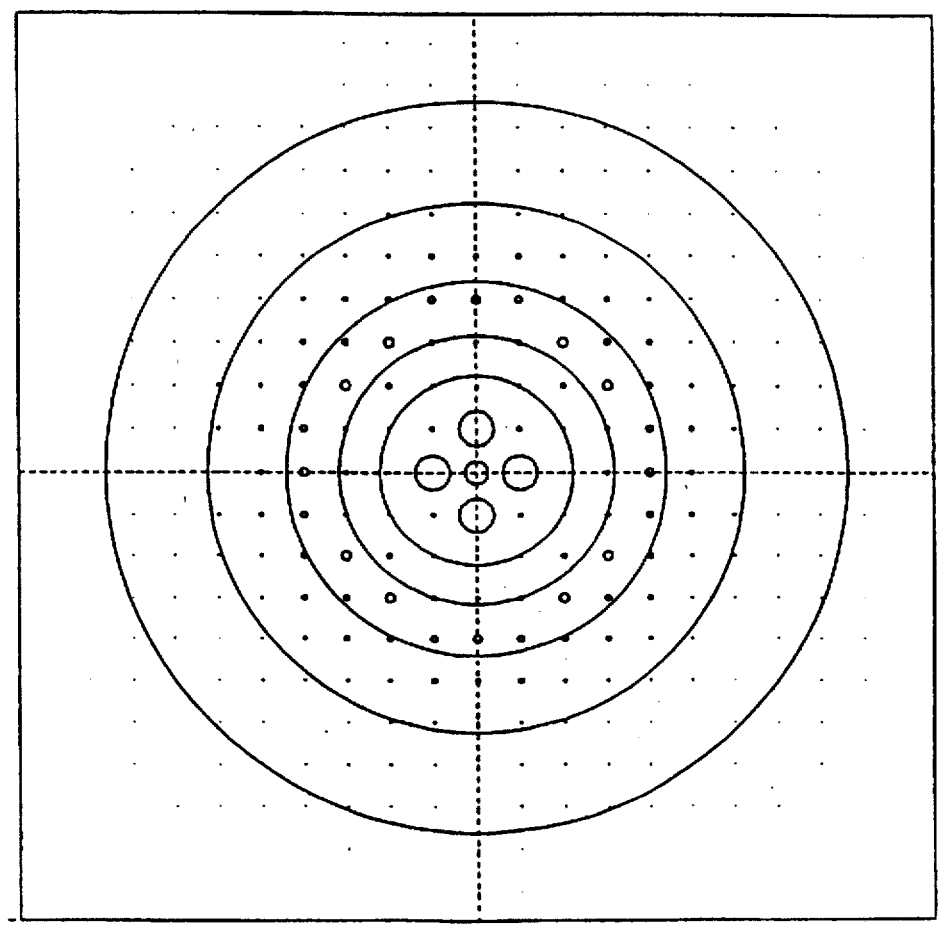
FIGS. 12, 13, and 14 are diagrams which show defocused images of a point light source by the diffusion plate, as shown in FIG. 11, at wavelengths of 450 nm, 550 nm, and 650 nm, respectively.
Figure 13:
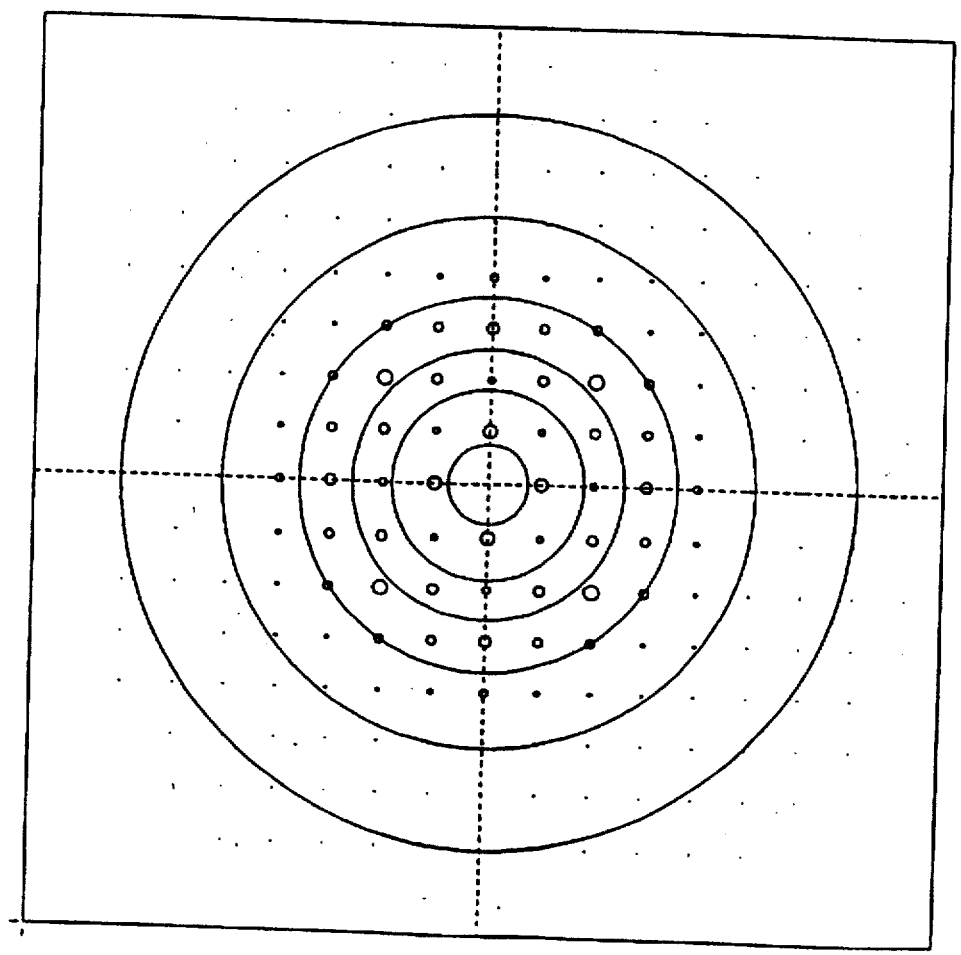
Figure 14:
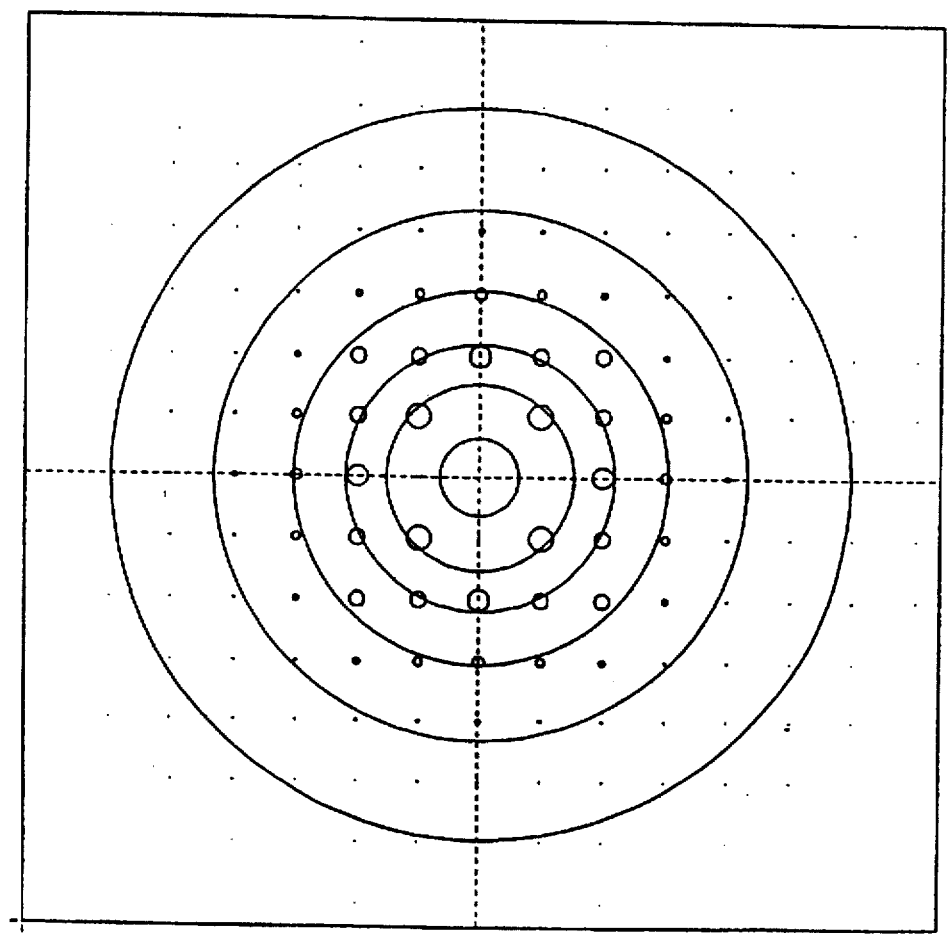
Figure 15:
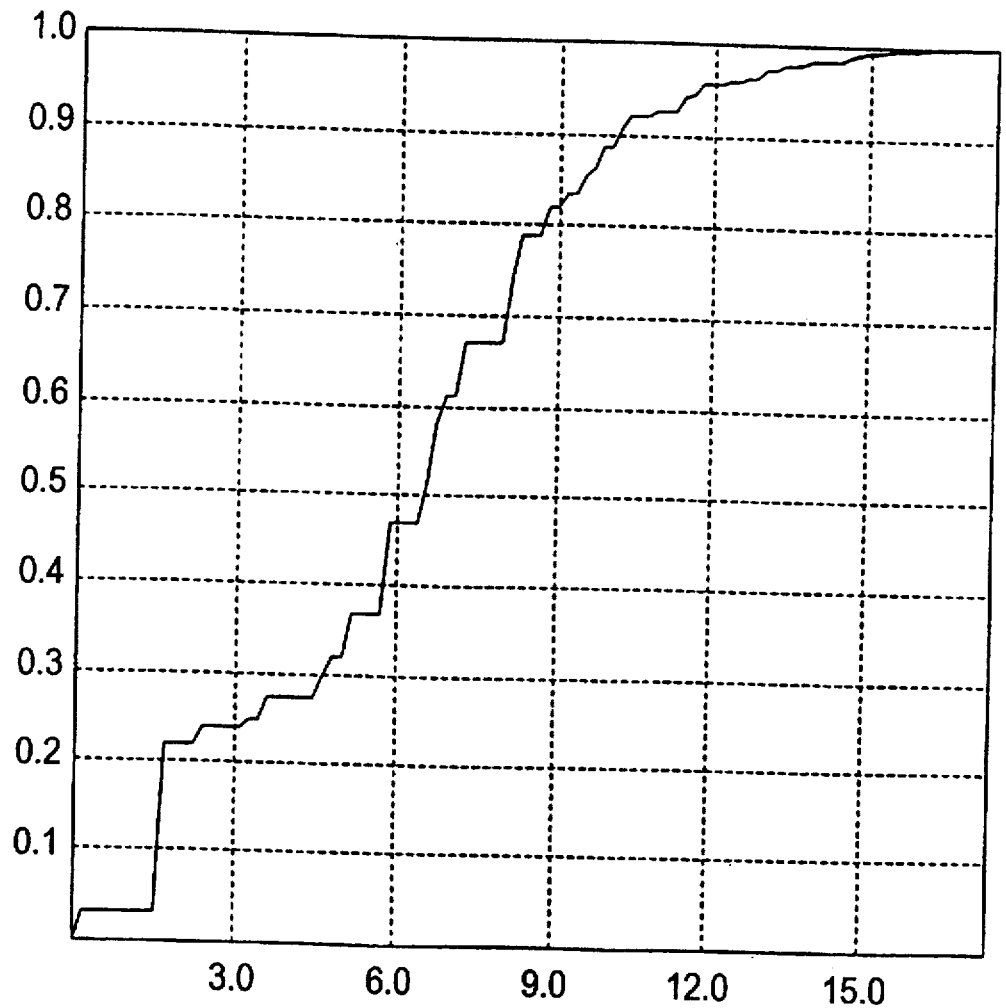
FIGS. 15, 16, and 17 are diagrams showing distributions of light diffused by the diffusion plate, as shown in FIG. 11, at wavelengths of 450 nm, 550 nm, and 650 nm, respectively, wherein the abscissa represents the radii of circles and the ordinate represents the quantity of light contained in the circles.
Figure 16:
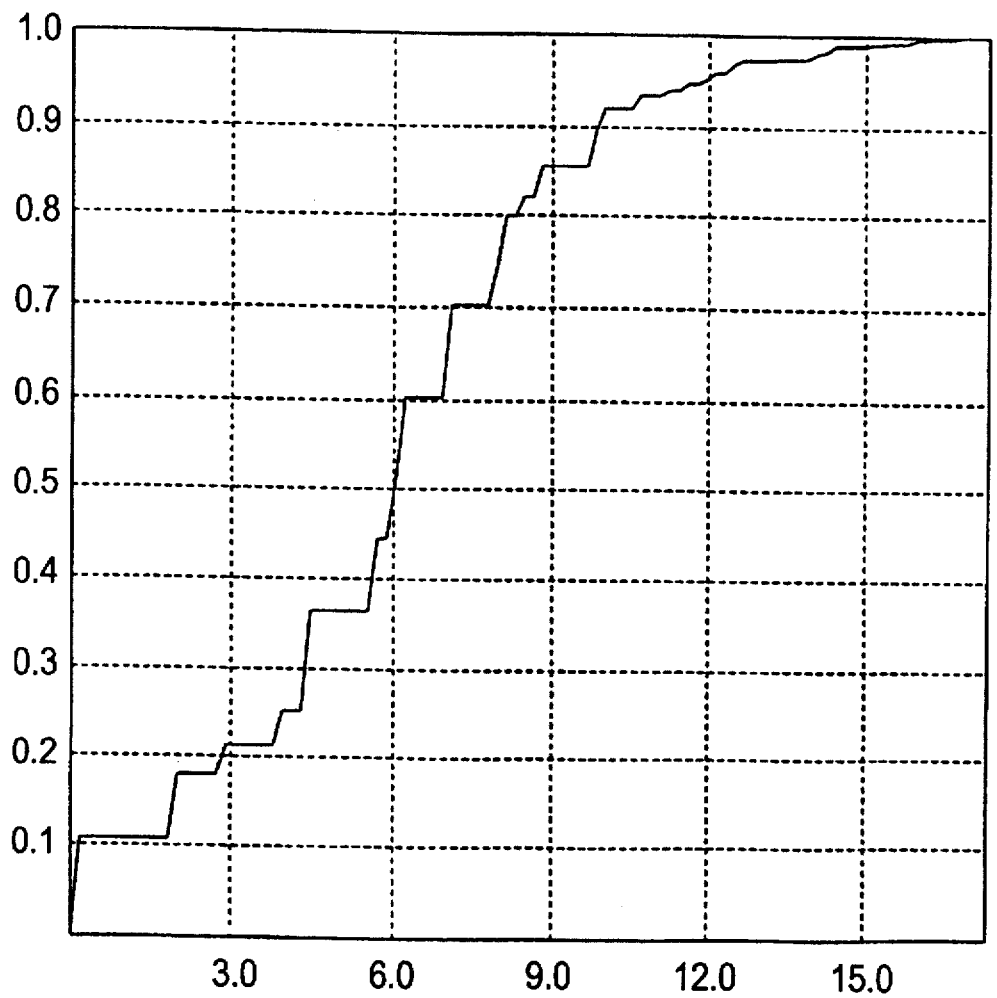
Figure 17:
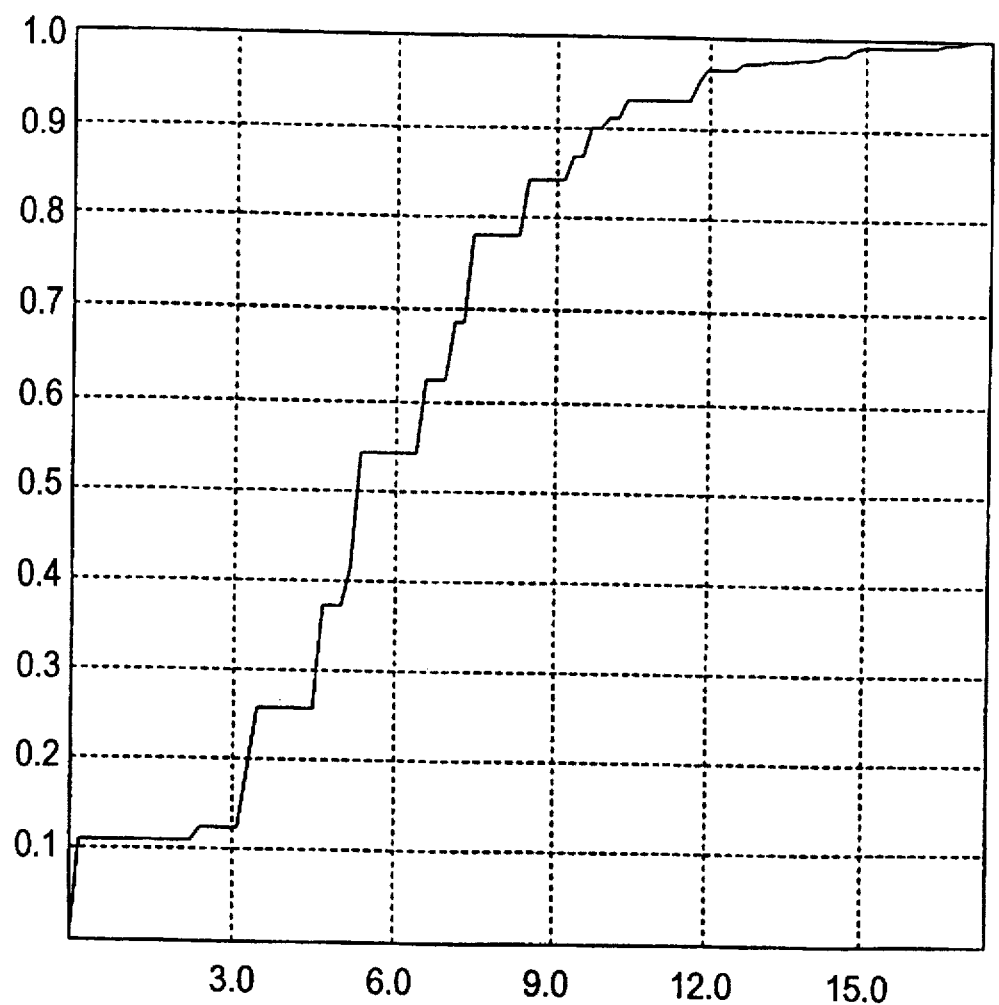
Figure 18:
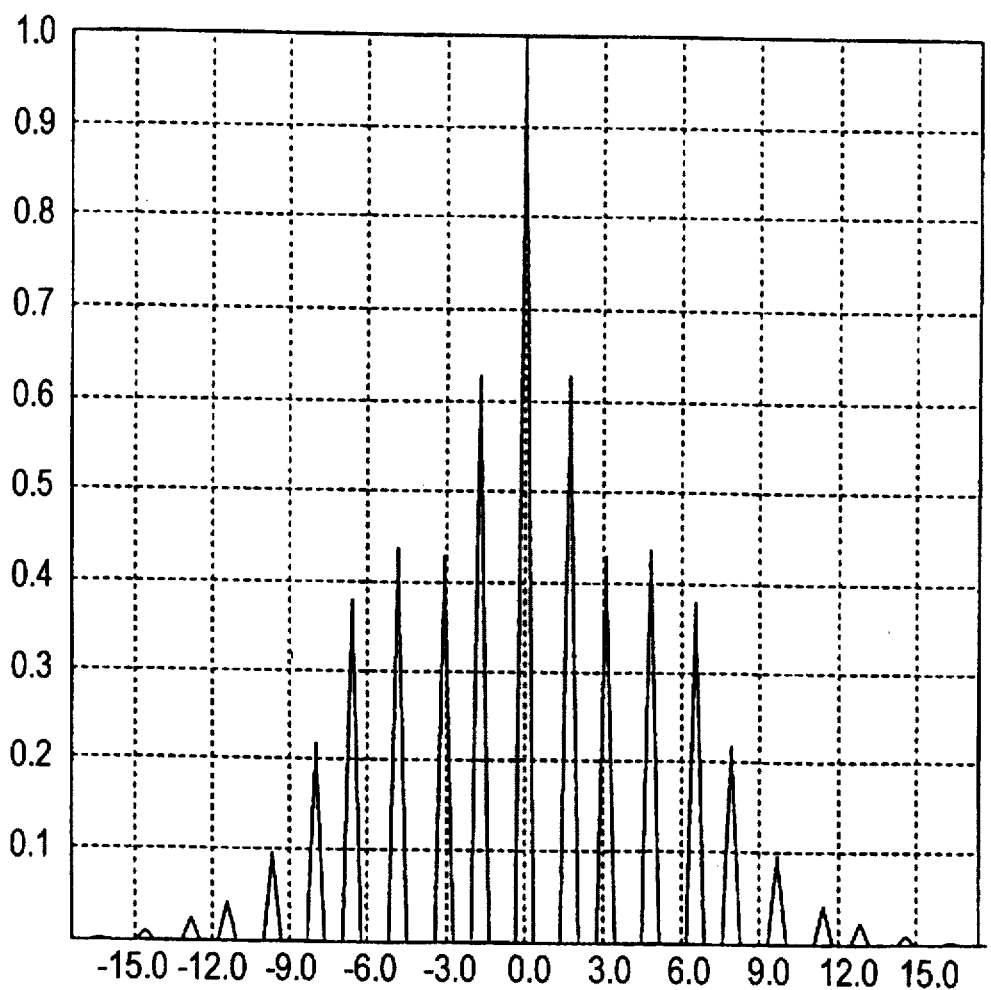
FIGS. 18, 19, and 20 are diagrams showing defocused images in the vertical and horizontal directions, obtained by integrating the functions illustrated in FIGS. 15, 16, and 17, respectively.
Figure 19:
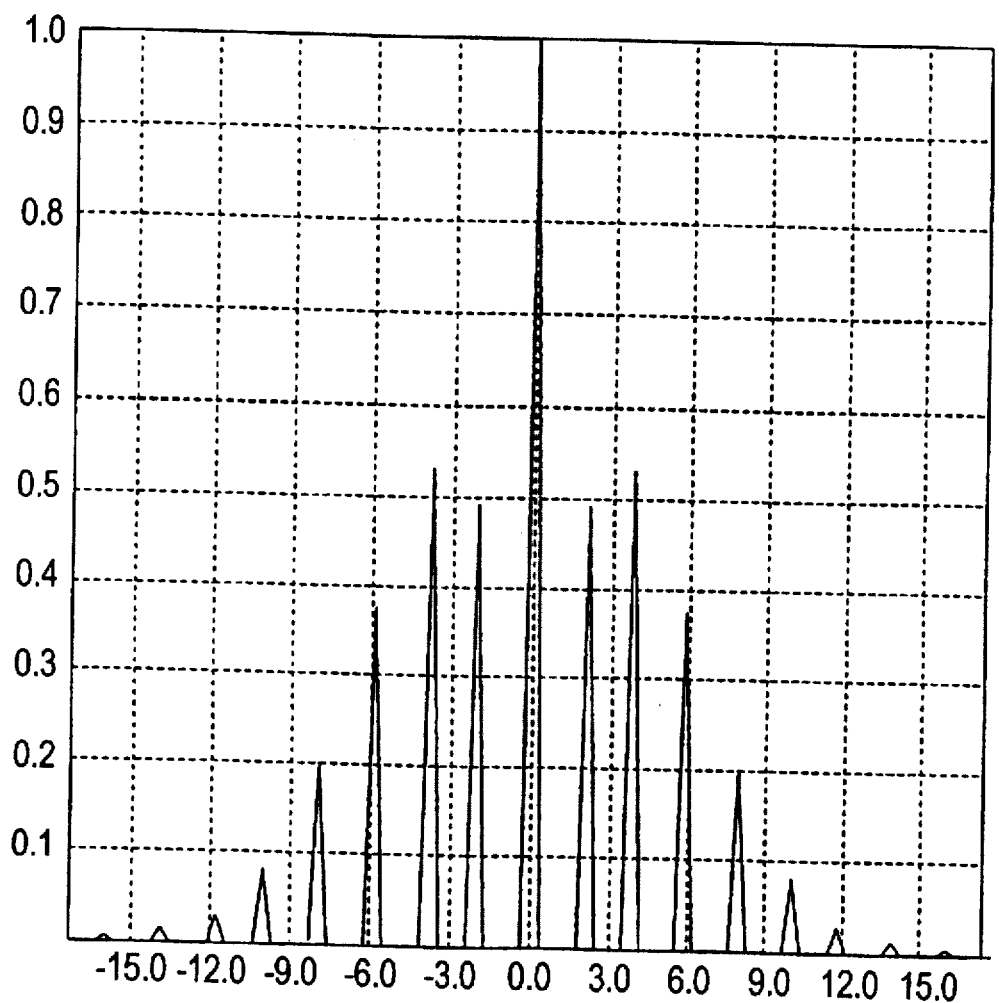
Figure 20:
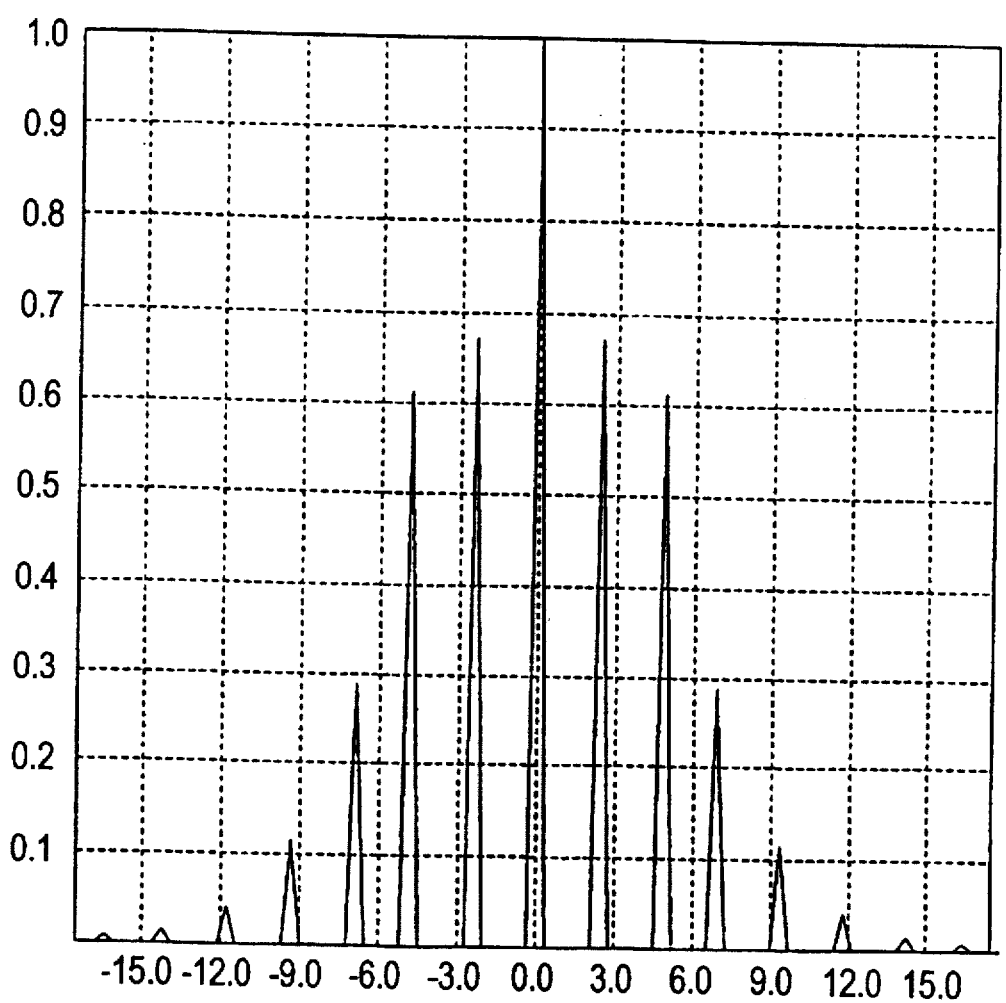
Figure 21:
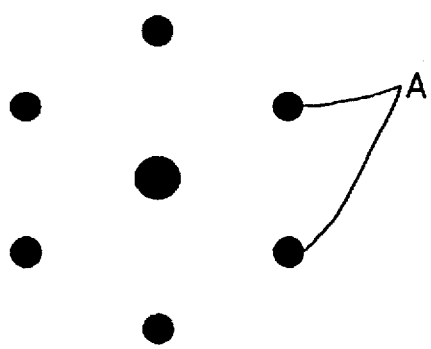
FIG. 21 is a schematic diagram of a discrete diffusion property.
Figure 22:
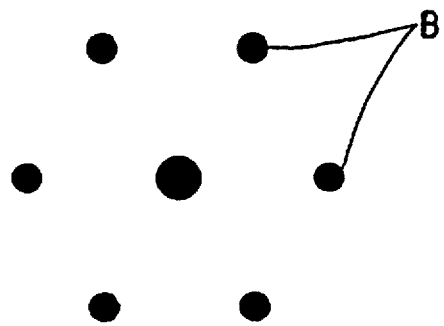
FIG. 22 is a schematic diagram of a discrete diffusion property which is obtained by rotating FIG. 21 by 90°.
Figure 23:
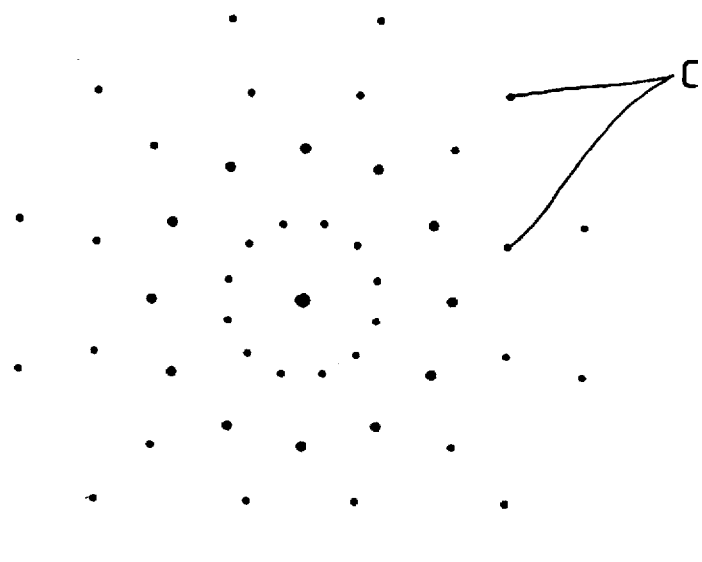
FIG. 23 is a schematic diagram of a resultant diffusion property which is obtained by a convolution integration of the diffusion properties, as shown in FIGS. 21 and 22, and is presented to explain the concept of the present invention.
Figure 36:
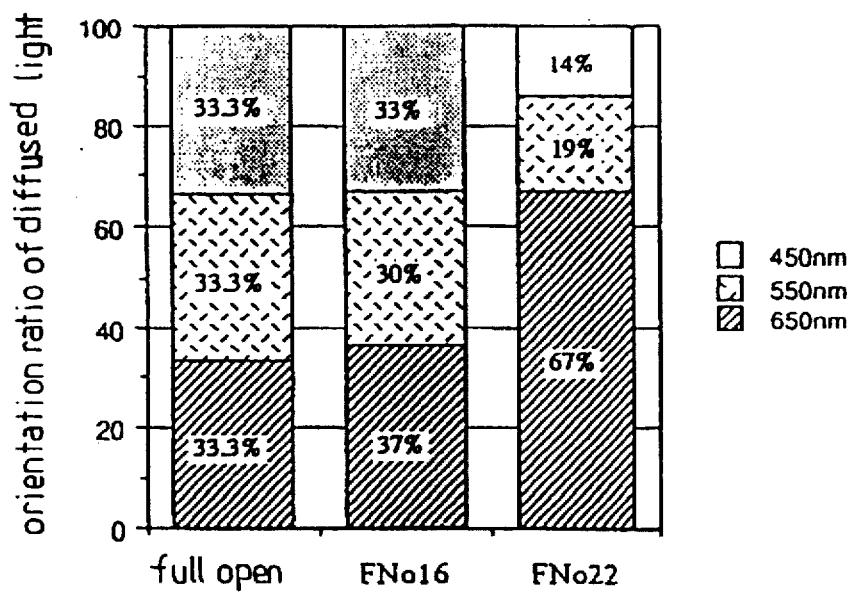
FIG. 36 is a diagram showing the relationship between an F number of a bundle of rays incident upon the diffusion plate, as shown in FIG. 1, and an orientation ratio of diffused light.
Figure 37:
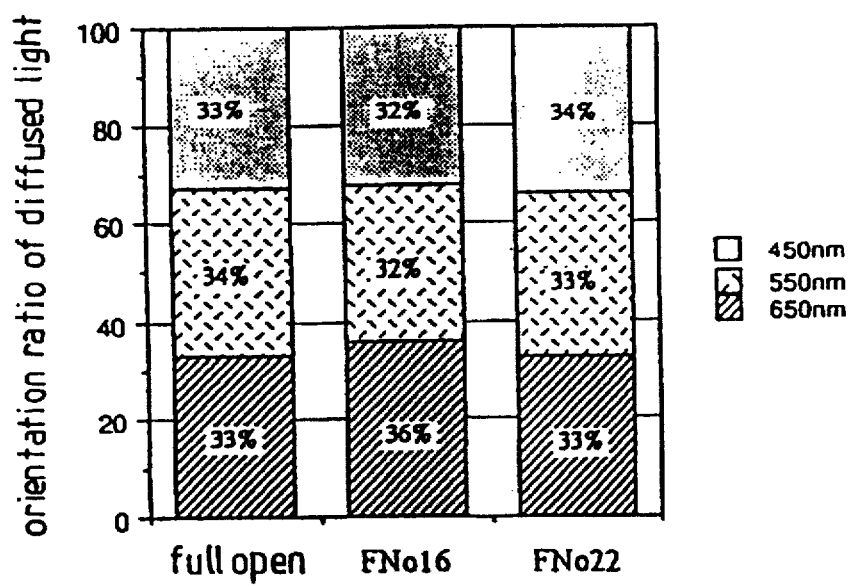
FIG. 37 is a diagram showing the relationship between an F number of a bundle of rays incident upon a diffusion plate according to the first embodiment of the present invention, as shown in FIG. 26, and an orientation ratio of diffused light.

FIGS. 36 and 37 show relationships between the F number of the incident light and the orientation ratio in the diffusion plates of the prior art and the present invention, as shown in FIG. 1 and FIG. 26, respectively. When the aperture is opened, the bundles of rays of 450 nm, 550 nm, and 650 nm are made incident upon the photographer's eye through the eyepiece lens at an equal ratio.

However, as the aperture is stopped-down, that is, as the F number increases, the orientation ratio changes in the case of the periodic diffusion plate. Accordingly, there is an irregularity in color of an object image, which is observed through the view finder. Conversely, in the case of the diffusion plate, according to the present invention, if the F number changes, there will be little or no change in the orientation ratio. Accordingly, color irregularity does not occur, as shown in FIG. 37.

Embodiment 2

Figure 38:
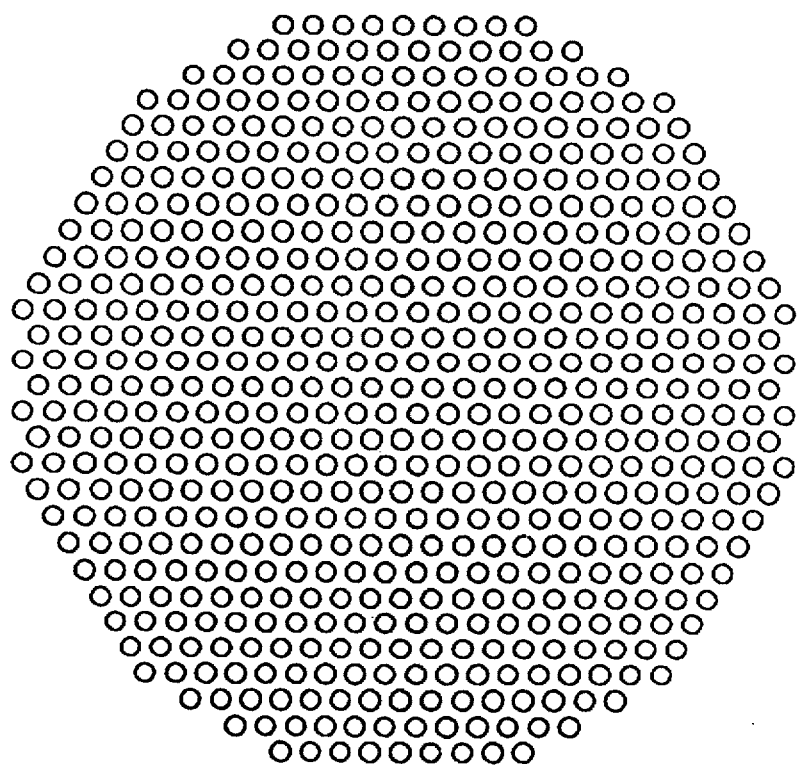
FIGS. 38 and 39 are schematic diagrams of two basic patterns in a second embodiment of the present invention.

FIG. 38 shows a basic pattern of a diffusion plate, according to a second embodiment of the present invention, in which the micro lenses (microstructures) are 1.2 µm in height and 10 µm in diameter, and are arranged with the highest possible density at a pitch of 16 µm.

Figure 39:
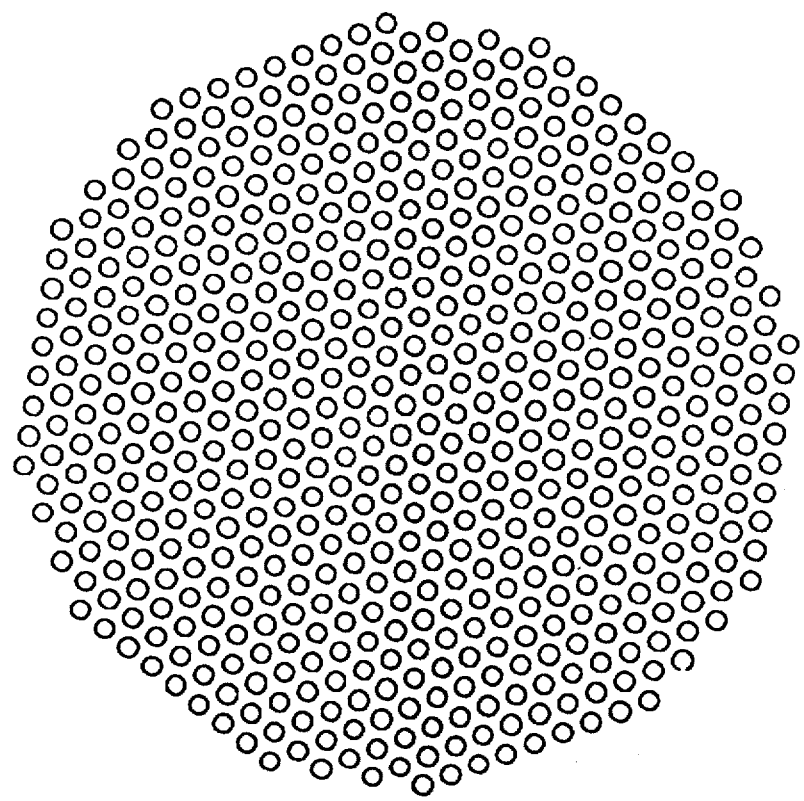

FIG. 39 shows another basic pattern of a diffusion plate, according to a second embodiment, in which the micro lenses (microstructures) are 1.2 µm in height and 10 µm in diameter, and are arranged with the highest possible density at a pitch of 16 µm, similar to the basic pattern shown in FIG. 38. There is an angular phase difference between the basic patterns shown in FIGS. 38 and 39. Namely, the basic pattern shown in FIG. 39 is obtained by turning the basic pattern of FIG. 38 by 21.78° to have an orientation different from that of the basic pattern of FIG. 38.

Figure 40:
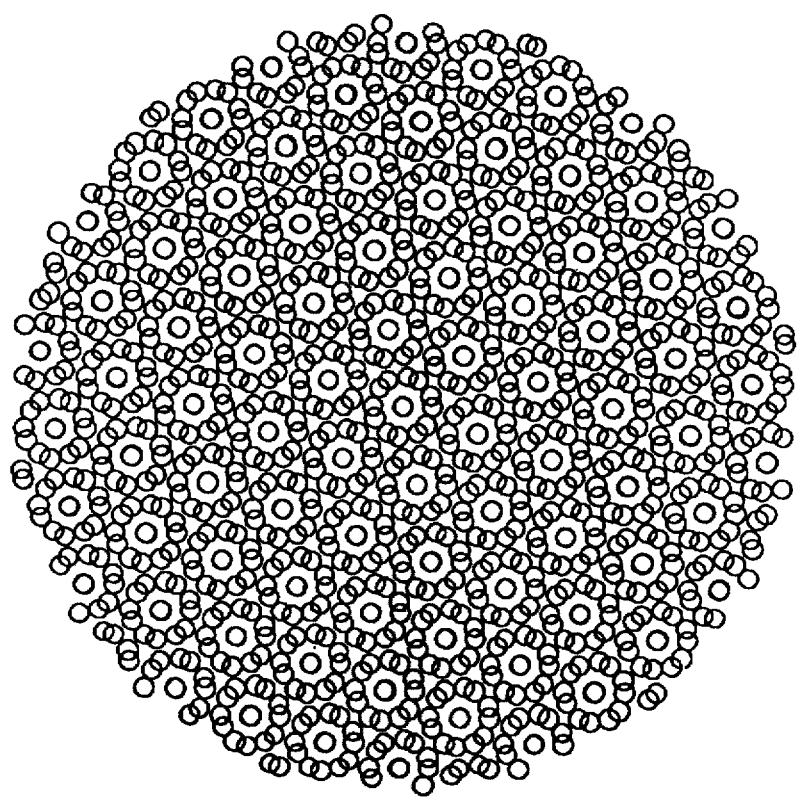
FIG. 40 is a schematic view of a diffusion plate structure made by a combination of the arrangements, as shown in FIGS. 38 and 39, according to a second embodiment of the present invention.

FIG. 40 shows a resultant pattern of a diffusion plate which is a combination of the basic patterns shown in FIGS. 38 and 39. The resultant pattern shown in FIG. 40, in which there is an angular phase difference of 21.78°, is also periodical.

FIGS. 41 through 49 show various optical properties of the diffusion plate shown in FIG. 40.

Figure 41:
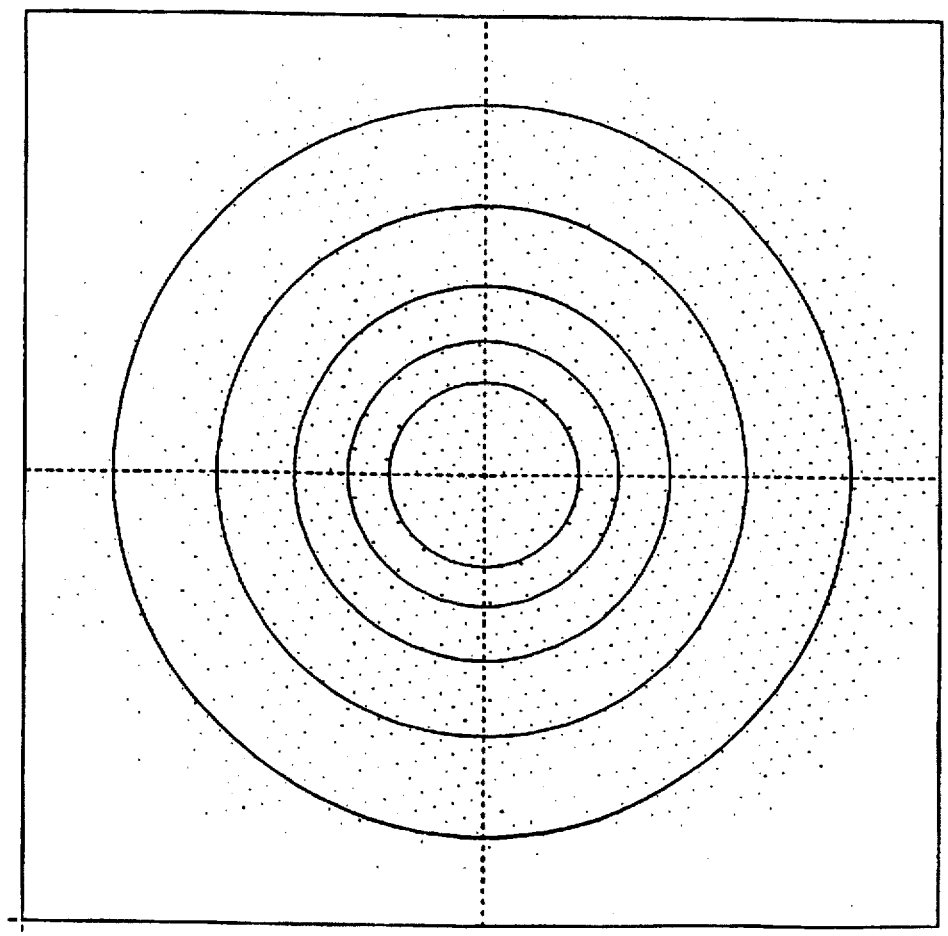
FIGS. 41, 42, and 43 are diagrams which show defocused images of a point light source produced by the diffusion plate, as shown in FIG. 40, at wavelengths of 450 nm, 550 nm, and 650 nm, respectively.
Figure 42:
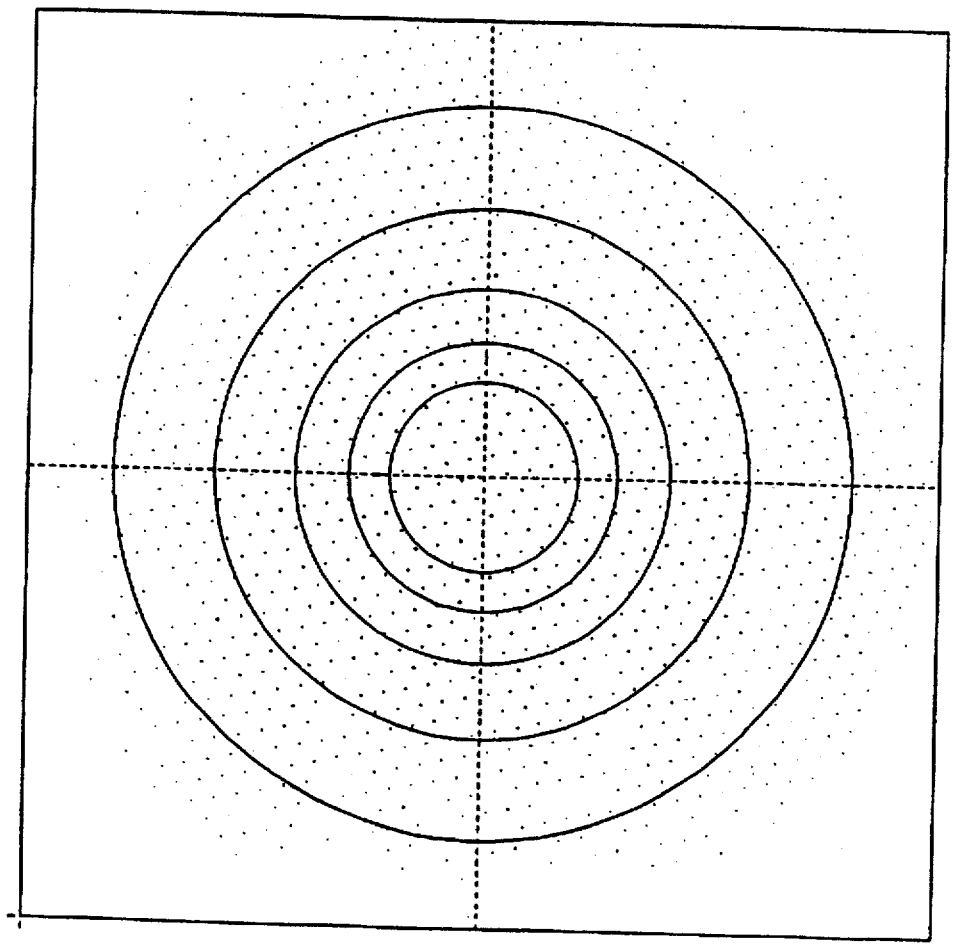
Figure 43:
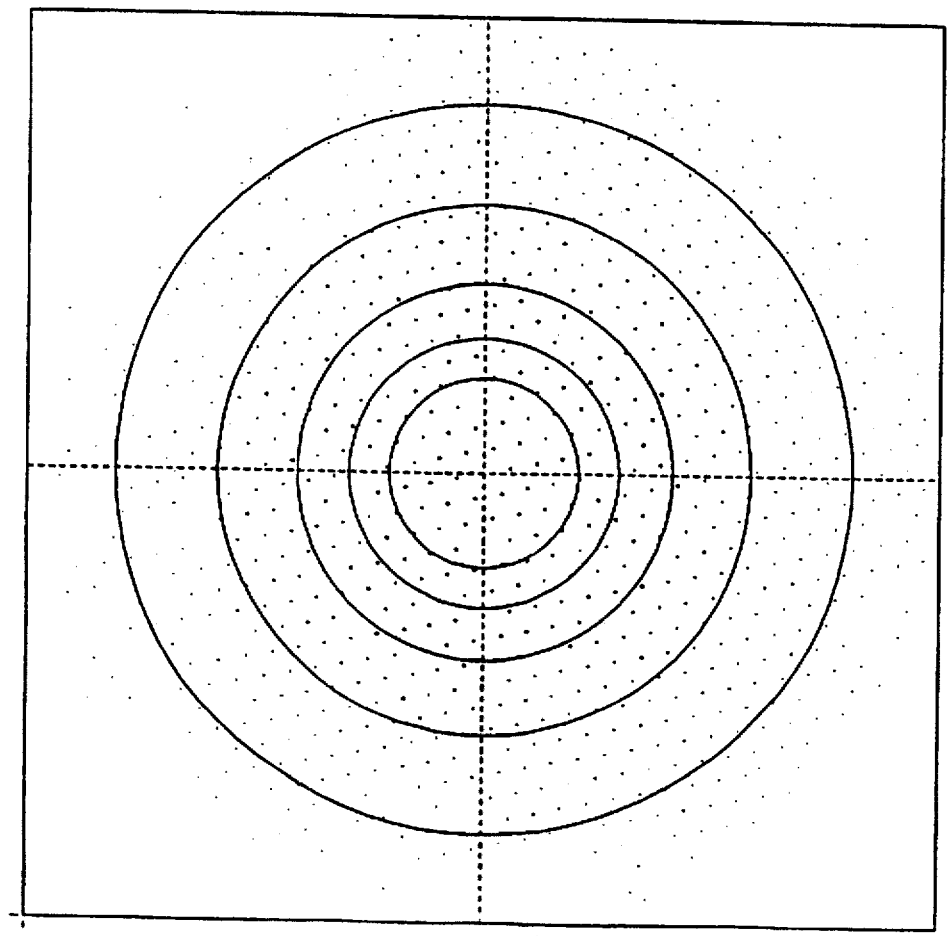

FIGS. 41 through 43 show the state of diffusion, i.e., the defocused images of a point light source at wavelengths of 450 nm, 550 nm, and 650 nm, respectively. In FIGS. 41 through 43, the diameters of the small circles (points) correspond to the intensity of the diffracted light in those directions, and the diameters of the large circles correspond to the F numbers of bundles of rays incident upon the diffusion plate. In the illustrated embodiment, the F numbers are 2.0, 2.8, 4.0, 5.6, and 8.0 in this order as viewed from the outermost circle, respectively.

Figure 44:
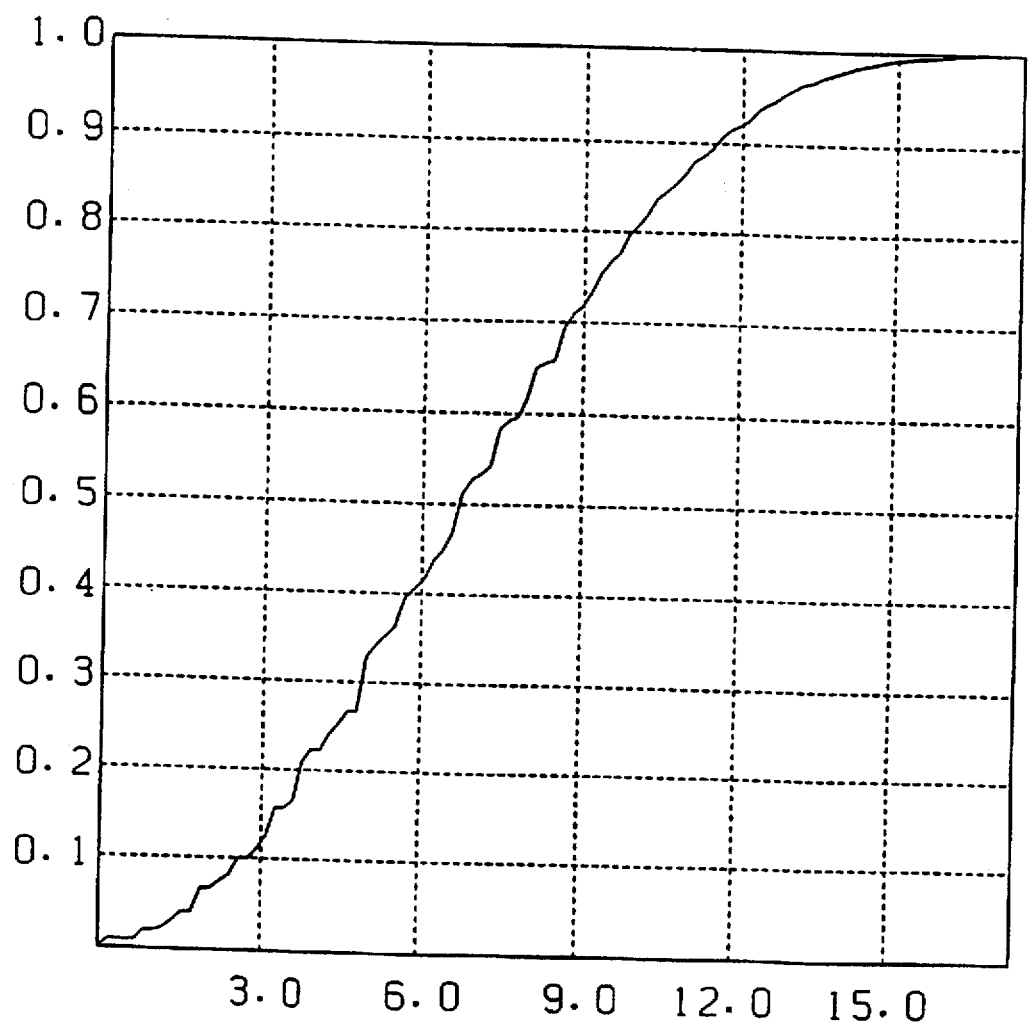
FIGS. 44, 45, and 56 are diagrams showing distributions of light diffused by the diffusion plate, as shown in FIG. 40, at wavelengths of 450 nm, 550 nm, and 650 nm, respectively, wherein the abscissa represents the radii of circles and the ordinate represents the quantity of light contained in the circles.
Figure 45:
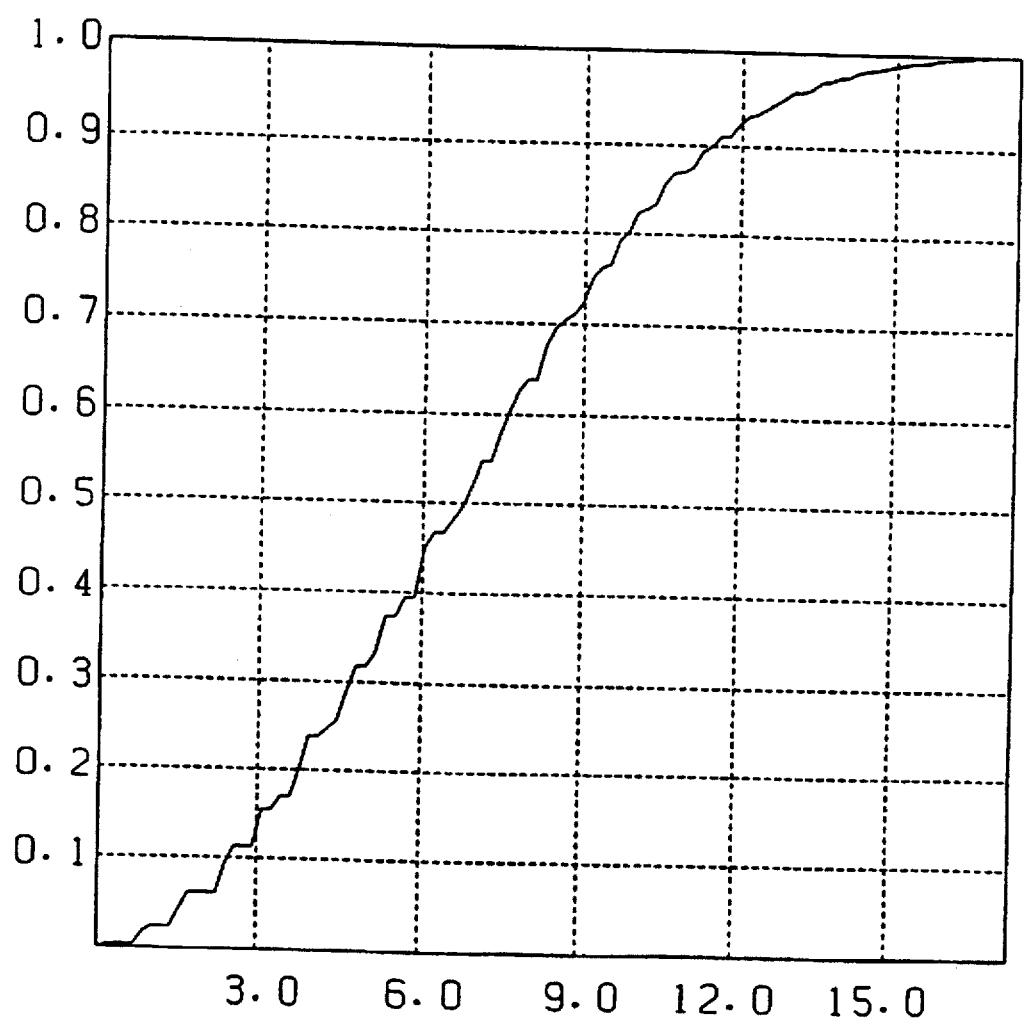
Figure 46:
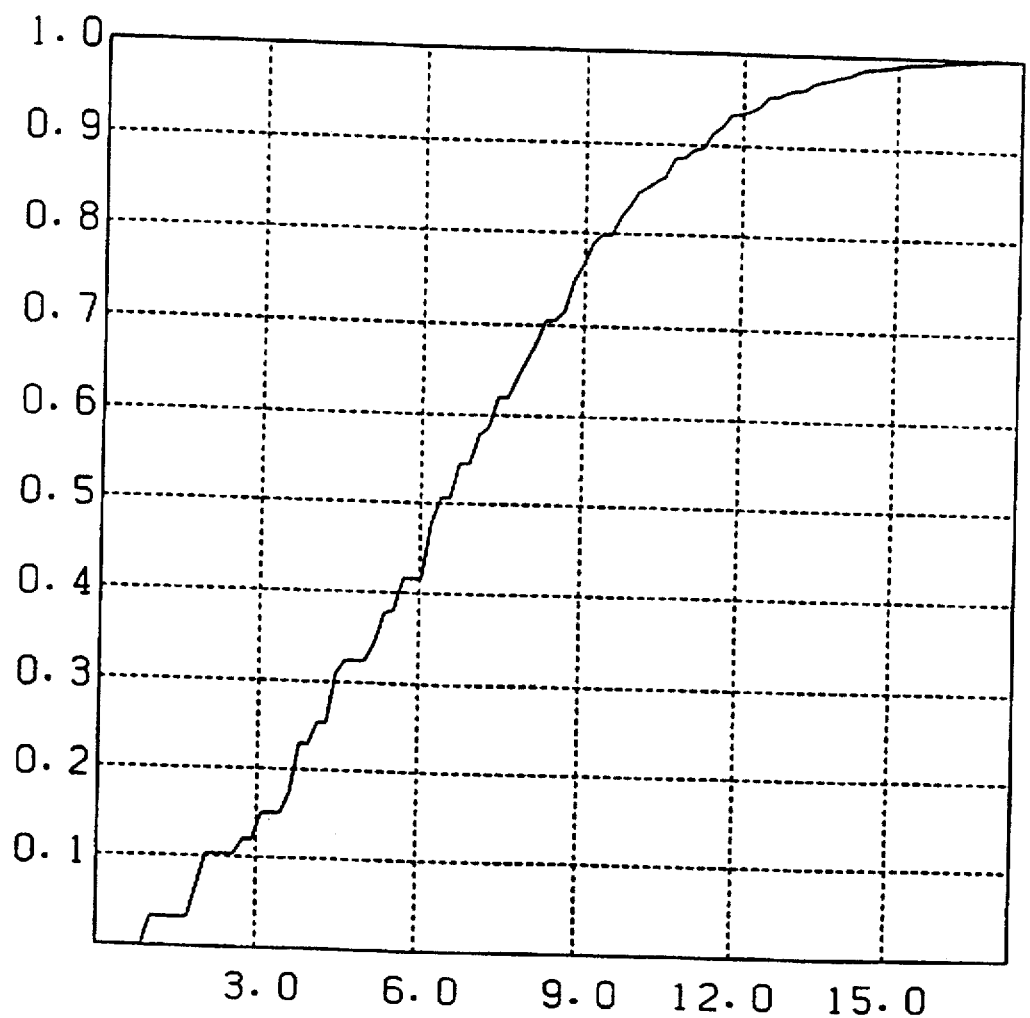

FIGS. 44 through 46 show the quantity of light at wavelengths of 450 nm, 550 nm, and 650 nm, respectively. The abscissae designate the radii of the respective circles (angular coordinate) and the ordinates designate the quantities of light contained in the respective circles on the assumption that the total quantity of light transmitted through the diffusion plate, as shown in FIG. 40, is 1.0, respectively.

Figure 47:
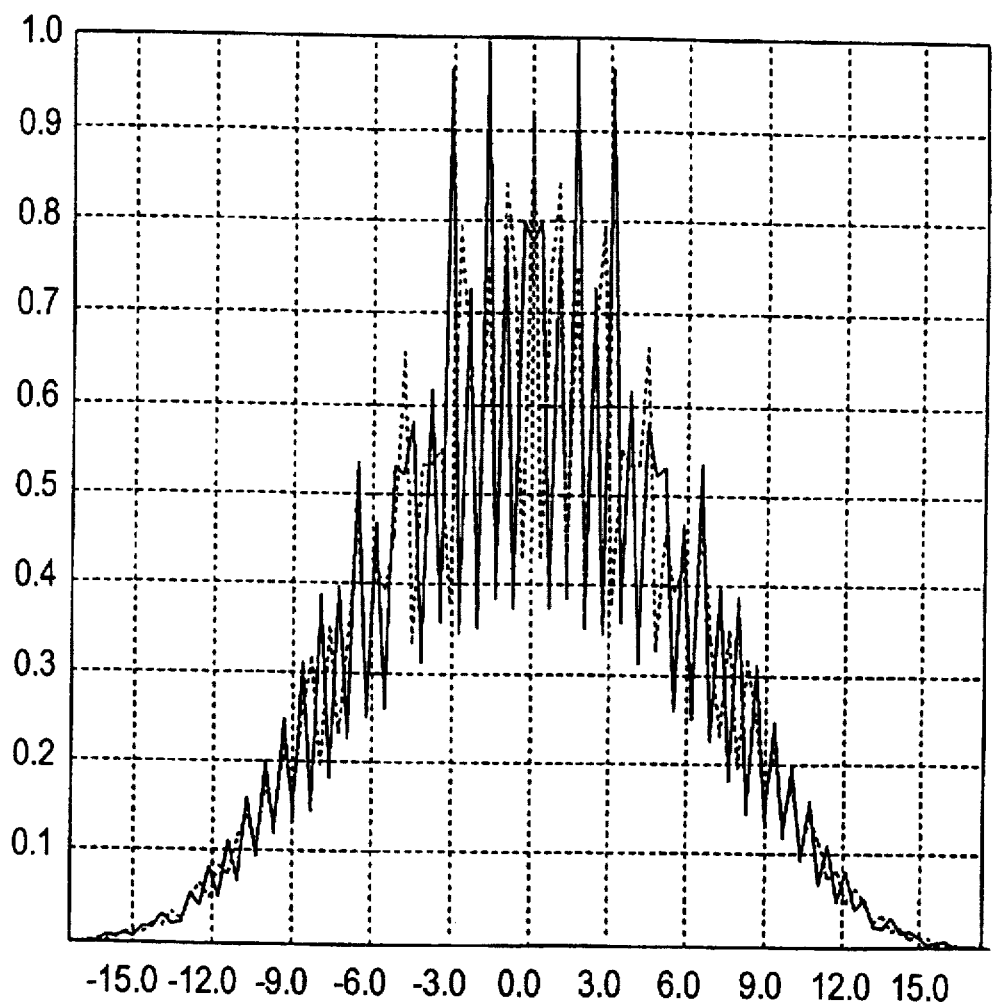
FIGS. 47, 48, and 49 are diagrams showing defocused images in the vertical and horizontal directions, obtained by integrating the functions illustrated in FIGS. 44, 45, and 46, respectively.
Figure 48:
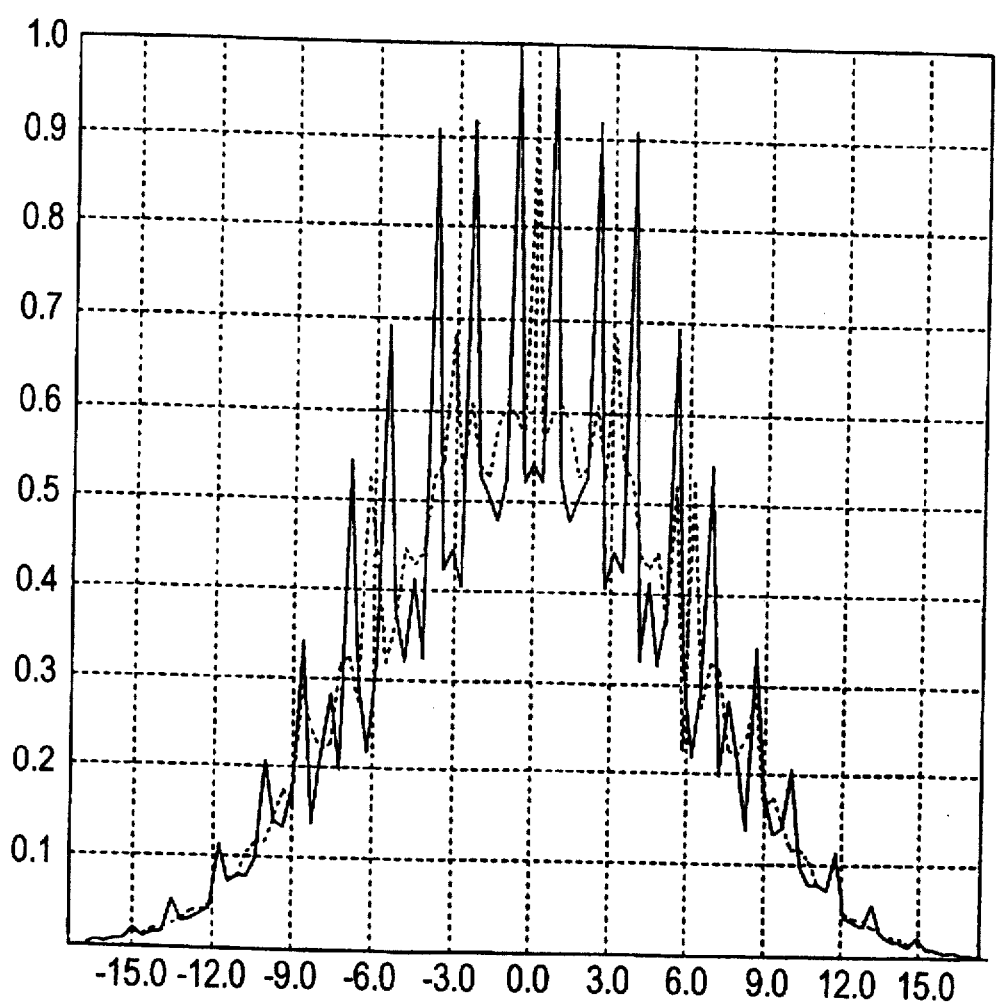
Figure 49:
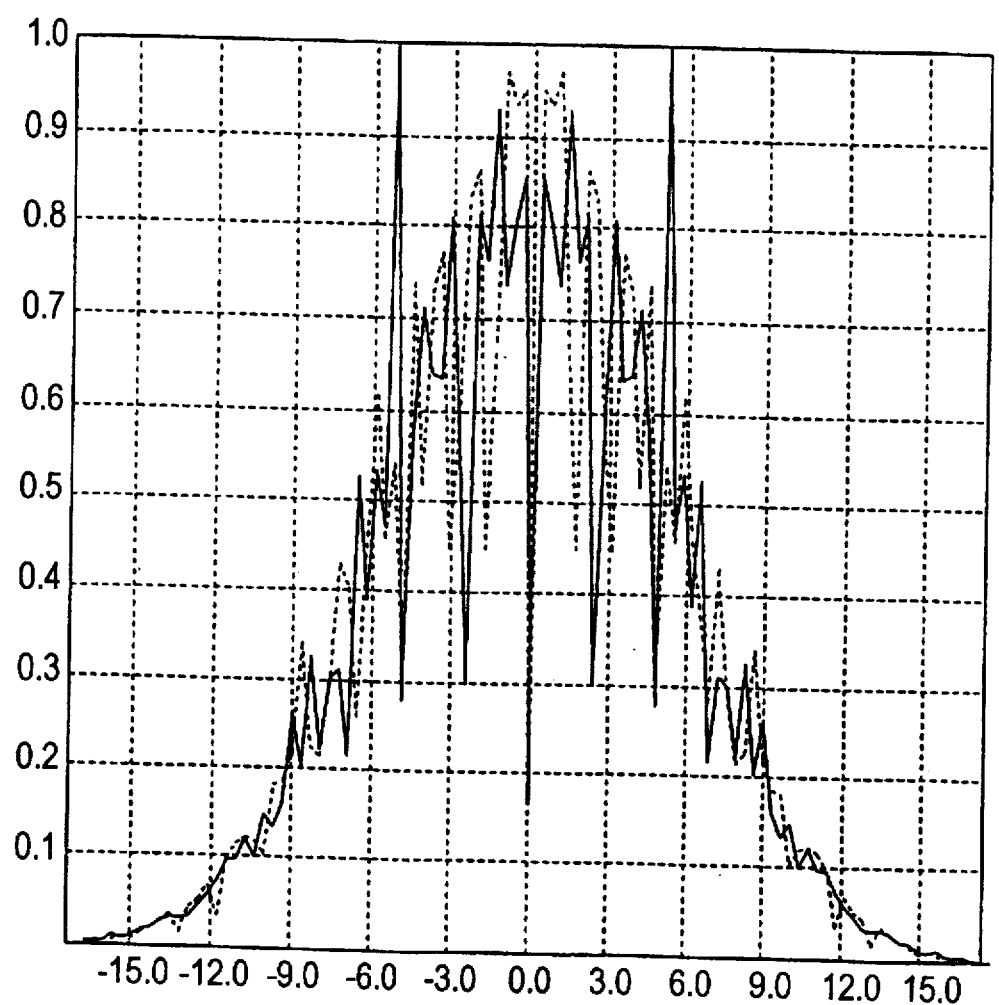

FIGS. 47 through 49 show defocused image intensities of a line light source (longitudinal line light source shown at solid lines and lateral line light source shown at imaginary lines) at wavelengths of 450 nm, 550 nm, and 650 nm, respectively. The abscissae designate the radii of diffraction of the diffraction patterns (i.e., angular coordinates of diffraction) and the ordinates show the relative intensity of light on the assumption that the peak intensity is 1.0, respectively.

Although the resultant pattern is discrete due to the periodicity of the basic patterns to be superimposed, the optical properties of the diffusion plate, according to the illustrated embodiment, are highly improved in comparison with the diffusion plate shown in FIGS. 2 through 10. Furthermore, the structure of the diffusion plate is not as visible as in the conventional diffusion plate in which the pitch of the microstructures are merely increased.

Embodiment 3

Figure 50:
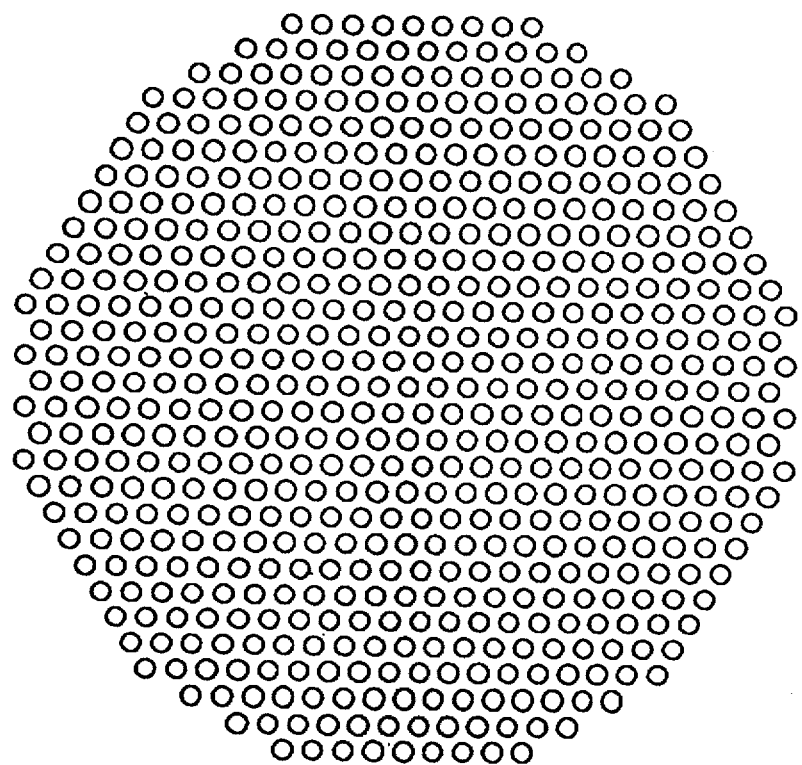
FIGS. 50 and 51 are schematic diagrams of two different basic patterns in a third embodiment of the present invention.

FIG. 50 shows a basic pattern of a diffusion plate according to a third embodiment of the present invention, in which the micro lenses (microstructures) of 1.2 µm height and 10 µm diameter are arranged with the highest possible density at a pitch of 16 µm.

Figure 51:
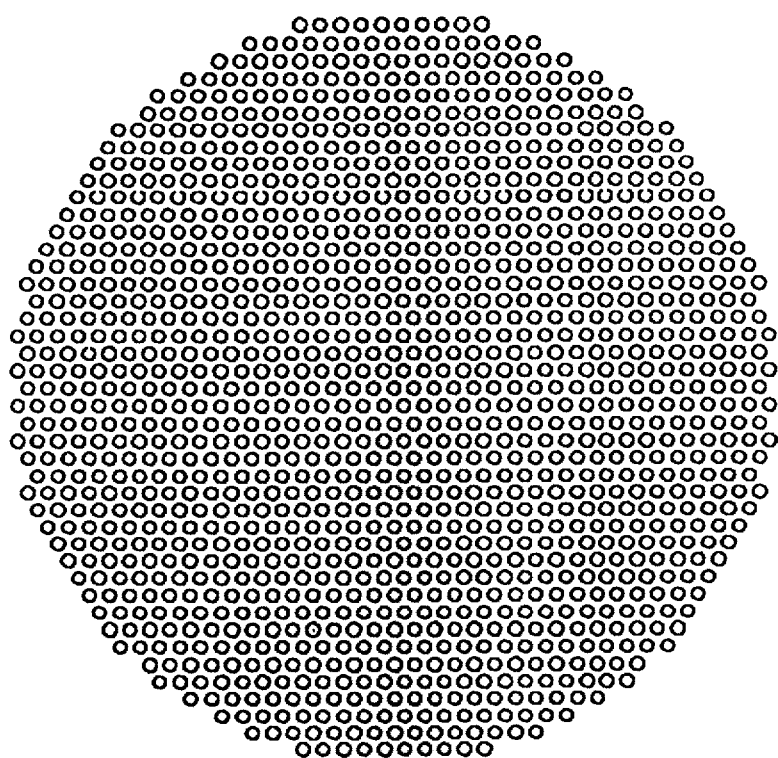

FIG. 51 shows another basic pattern of a diffusion plate according to a third embodiment, in which the micro lenses (microstructures) of 1.2 µm height and 6.67 µm diameter are arranged with the highest possible density at a pitch of 10.67 µm. The two basic patterns have the same orientation.

Figure 52:
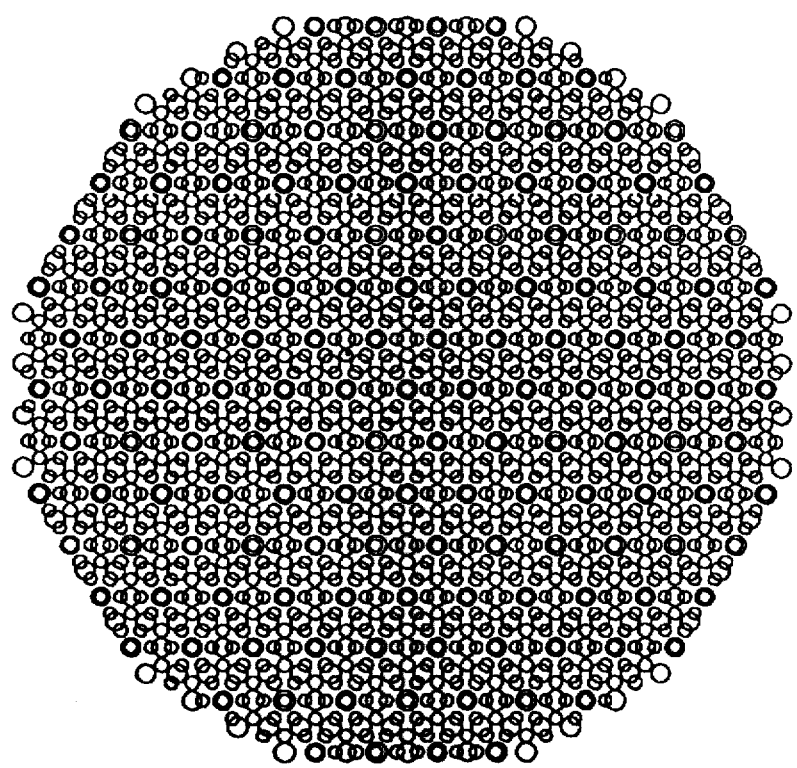
FIG. 52 is a schematic view of a diffusion plate structure made by a combination of the arrangements, as shown in FIGS. 50 and 51, according to a third embodiment of the present invention.

FIG. 52 shows a resultant pattern of a diffusion plate which is a combination of the basic patterns shown in FIGS. 50 and 51. The resultant pattern shown in FIG. 52 is also periodic.

FIGS. 53 through 61 show various optical properties of the diffusion plate shown in FIG. 52.

Figure 53:
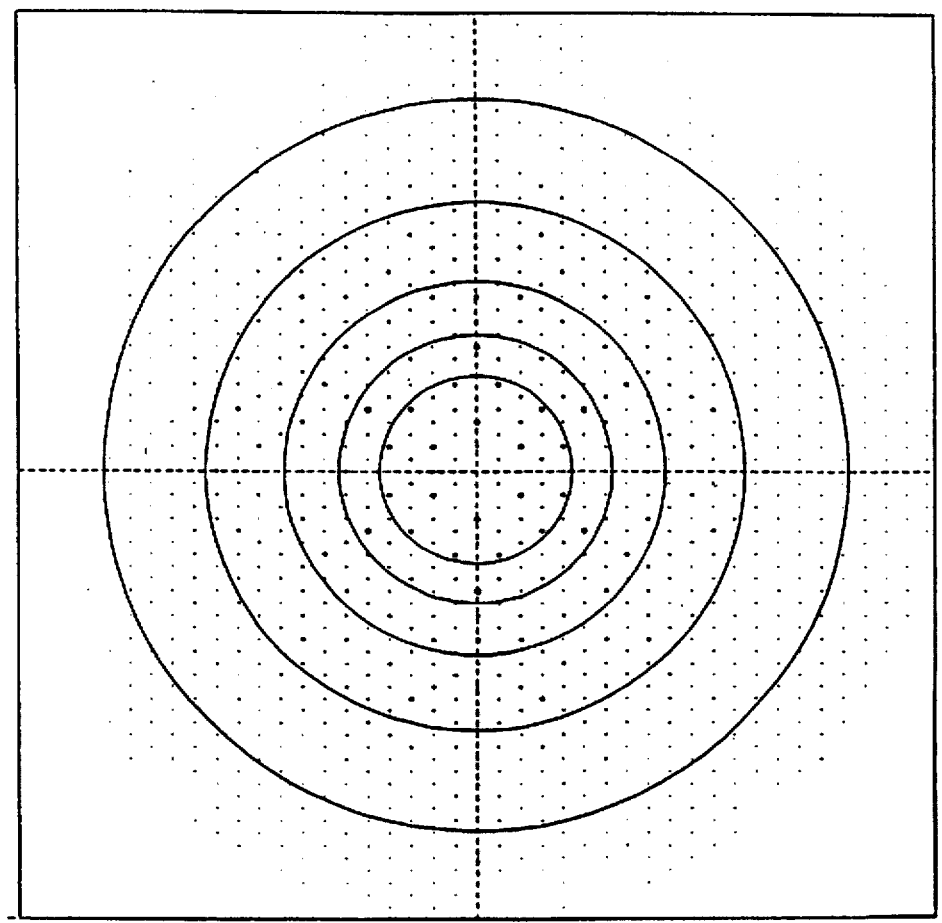
FIGS. 53, 54, and 55 are diagrams which show defocused images of a point image produced by the diffusion plate, as shown in FIG. 52, at wavelengths of 450 nm, 550 nm, and 650 nm, respectively.
Figure 54:
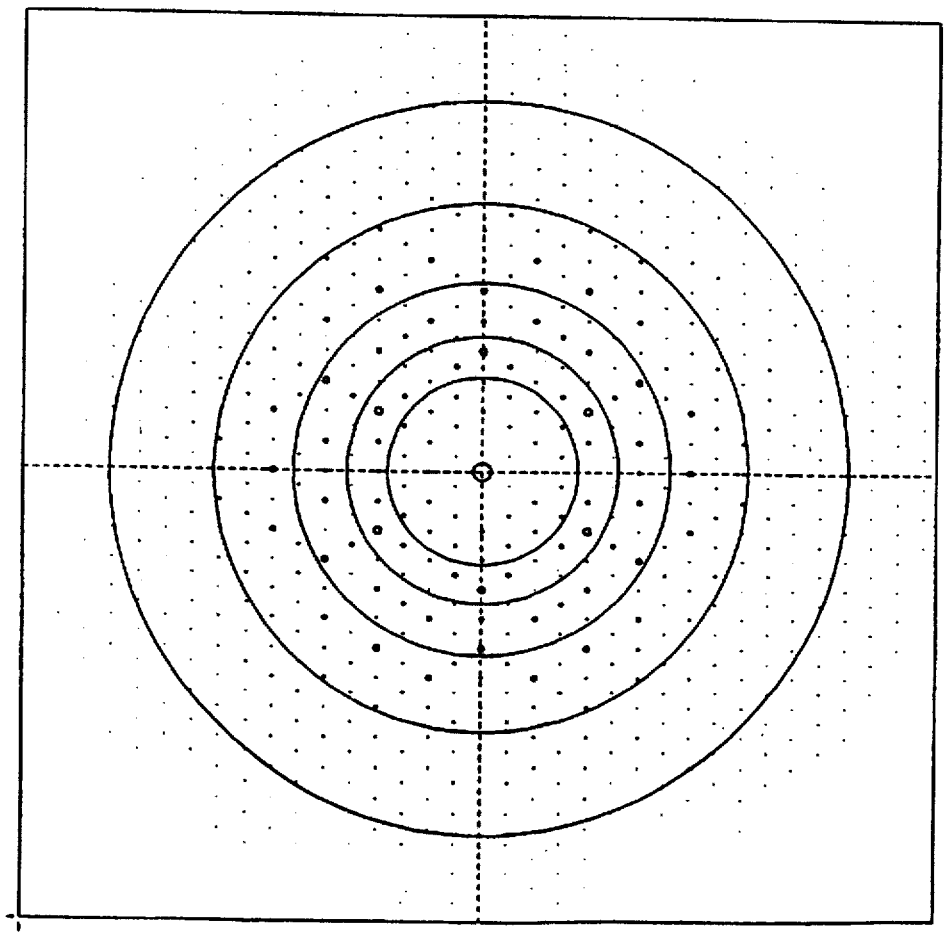
Figure 55:
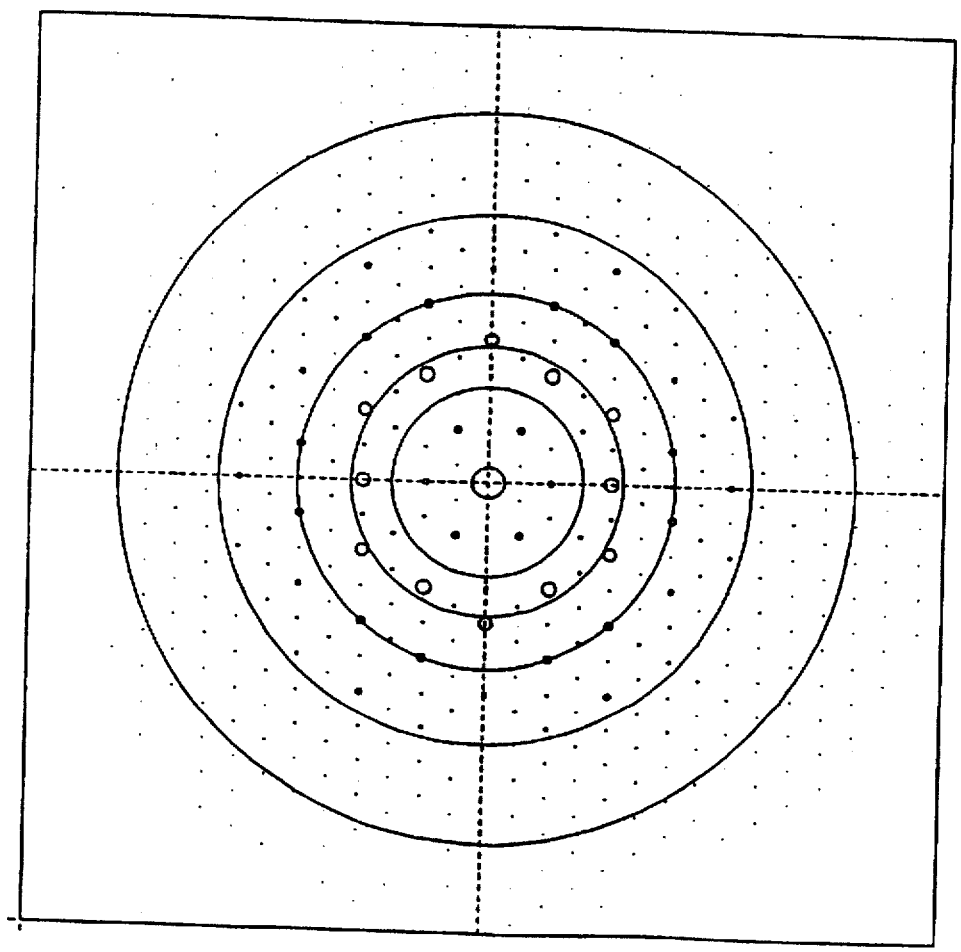

FIGS. 53 through 55 show the state of diffusion, i.e., the defocused images of a point light source at wavelengths of 450 nm, 550 nm, and 650 nm, respectively. In FIGS. 53 through 55, the diameters of the small circles (points) correspond to the intensity of the diffracted light, and the diameters of the large circles correspond to the F numbers of bundles of rays incident upon the diffusion plate. In the illustrated embodiment, the F numbers are 2.0, 2.8, 4.0, 5.6 and 8.0, in this order, as viewed from the outermost circle, respectively.

Figure 56:
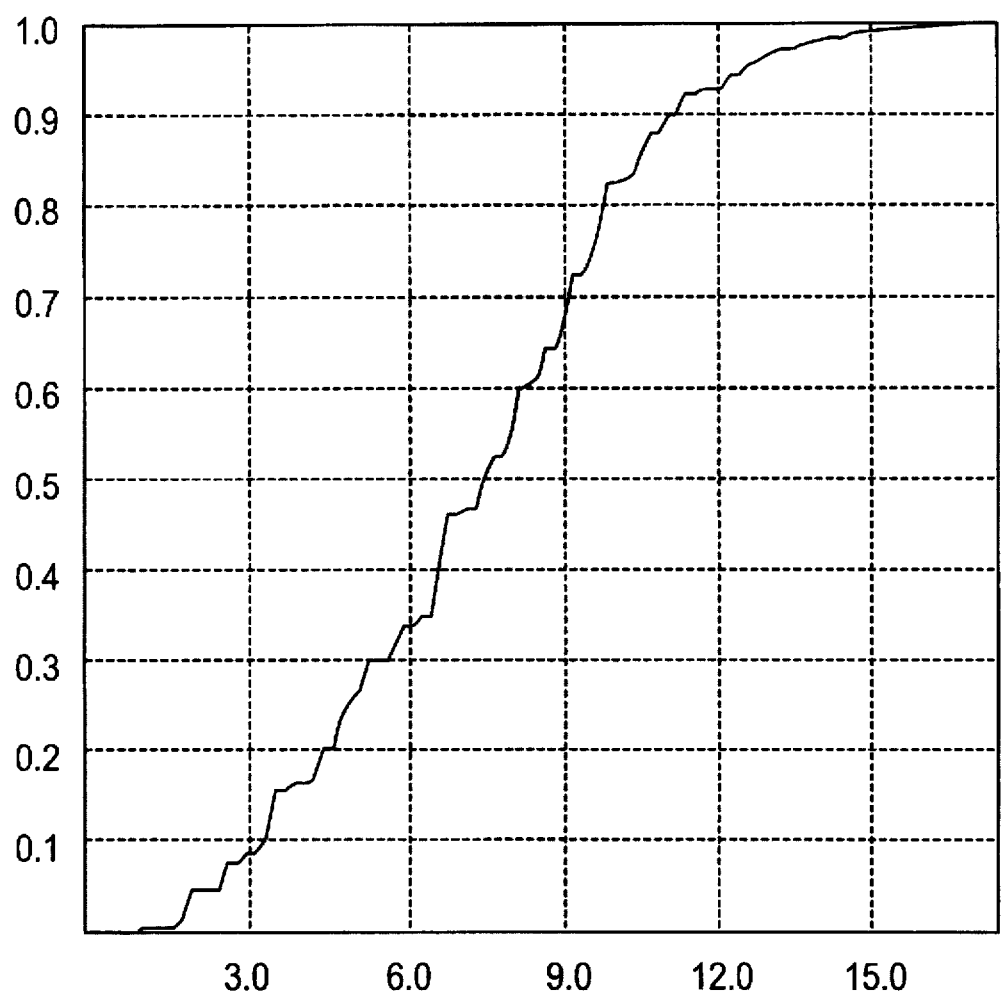
Figure 57:
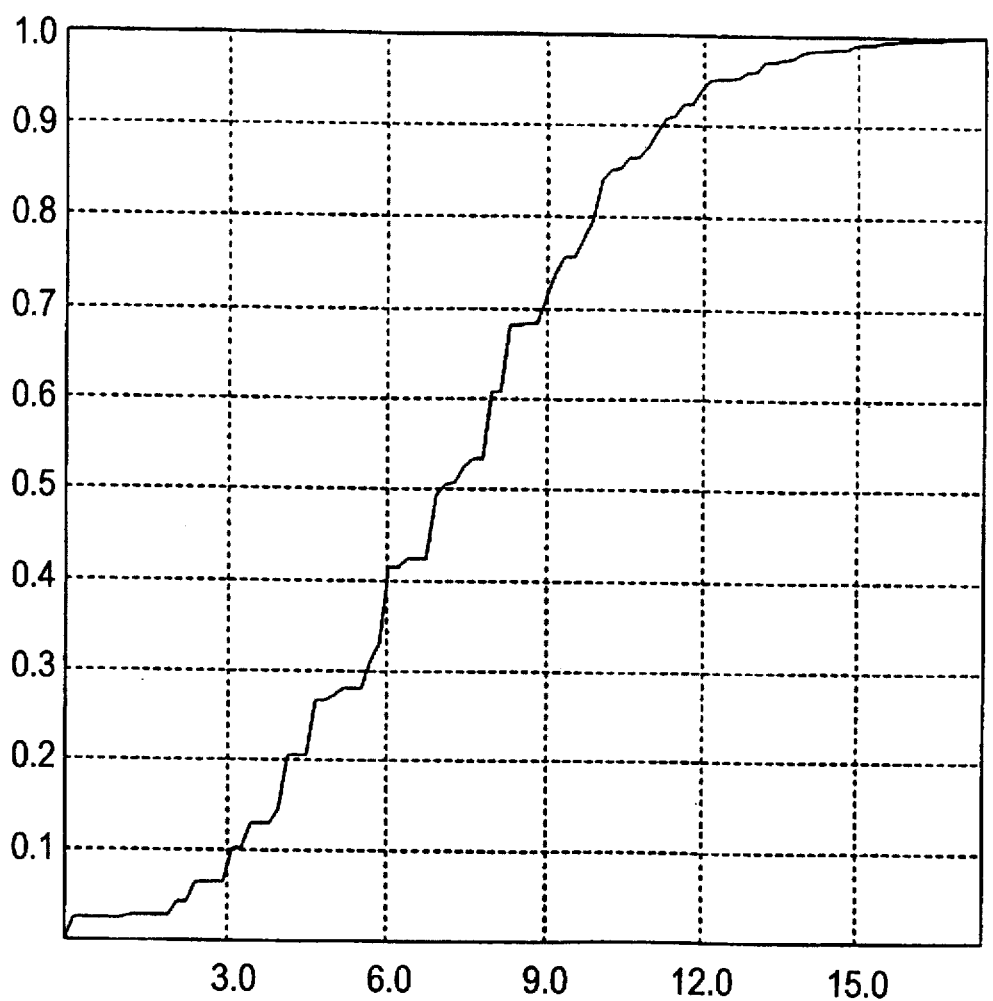
Figure 58:
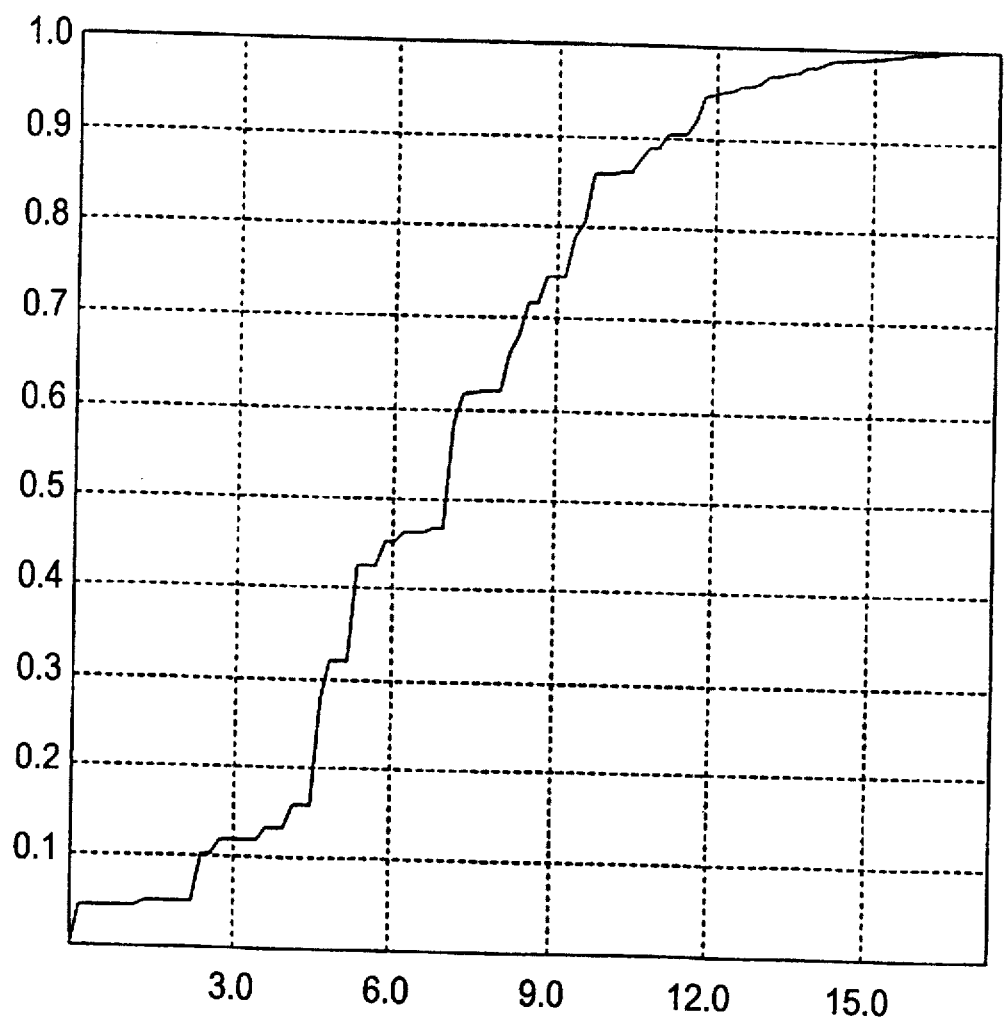

FIGS. 56 through 58 show the quantity of light at wavelengths of 450 nm, 550 nm, and 650 nm, respectively. The abscissae designate the radii of the respective circles and the ordinates designate the quantities of light contained in the respective circles on the assumption that the total quantity of light transmitted through the diffusion plate, as shown in FIG. 52, is 1.0, respectively.

Figure 59:
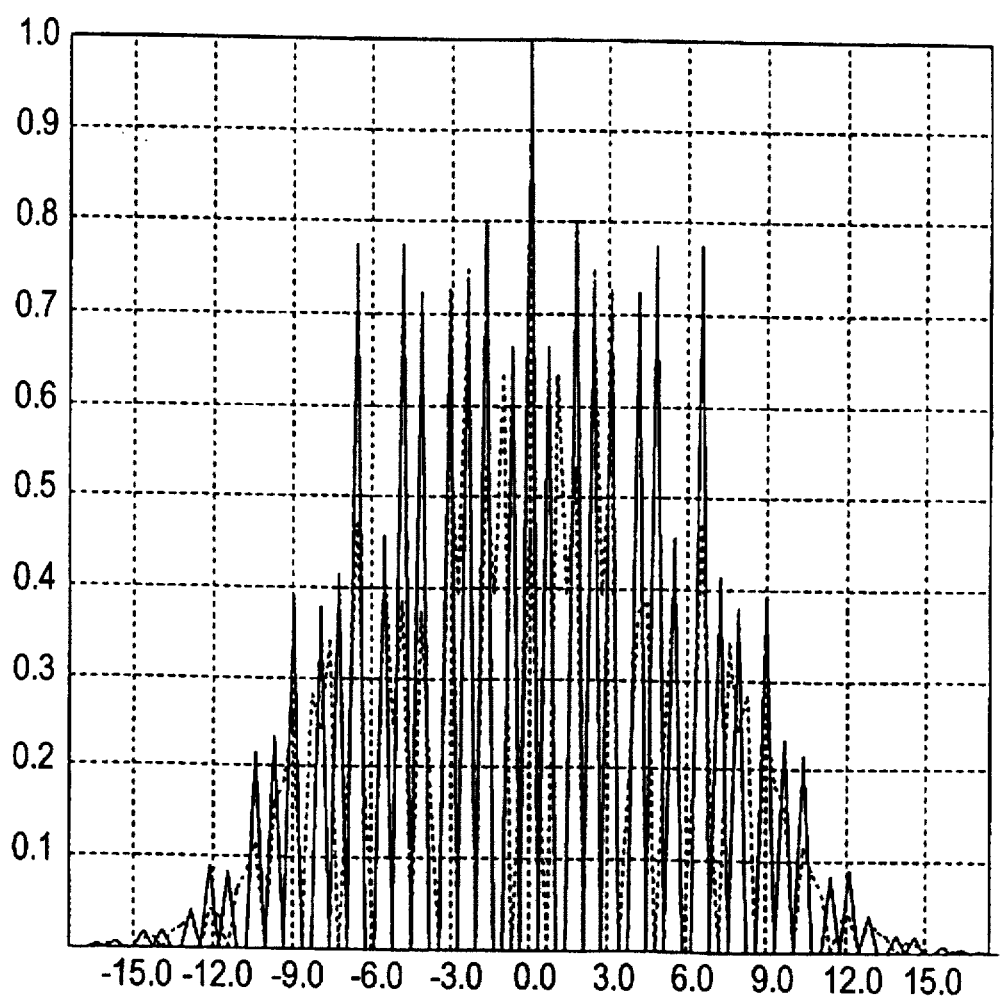
FIGS. 59, 60, and 61 are diagrams showing an unsharpness (defocus) of images in the vertical and horizontal directions, obtained by integrating the functions illustrated in FIGS. 56, 57, and 58, respectively.
Figure 60:
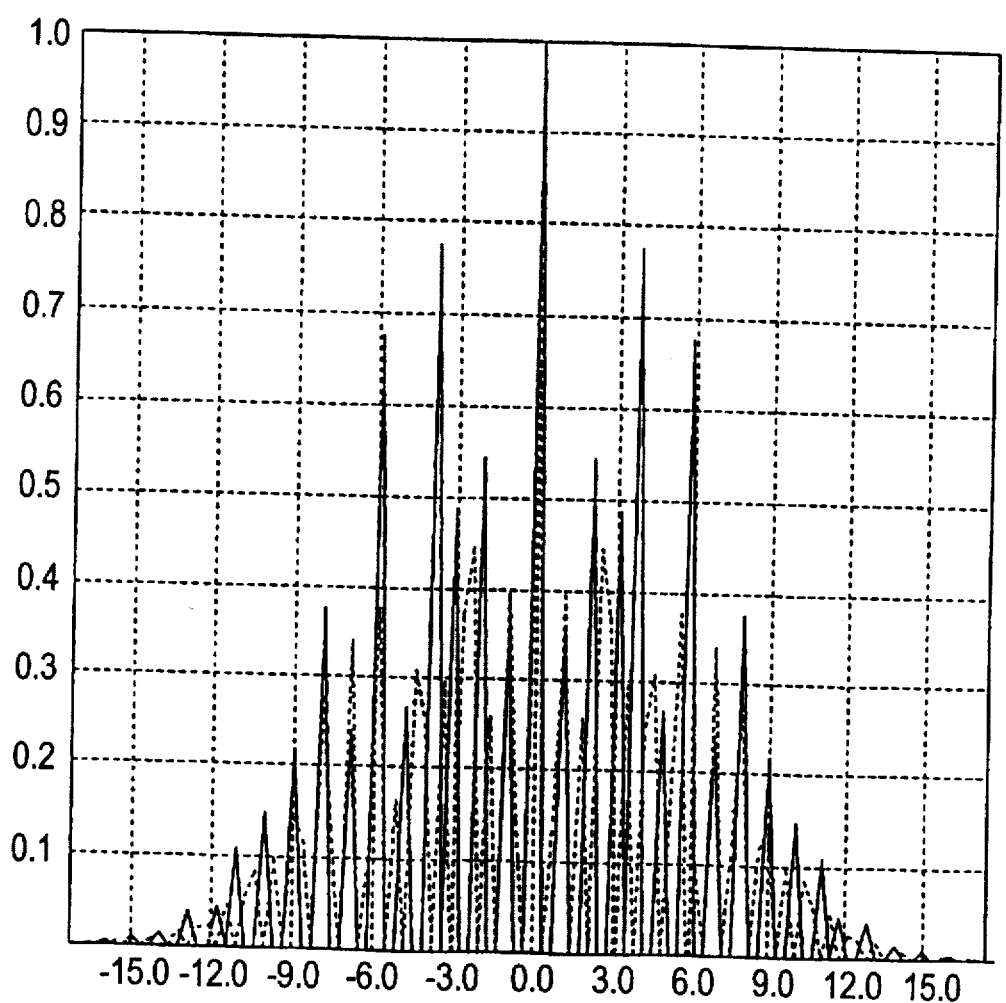
Figure 61:
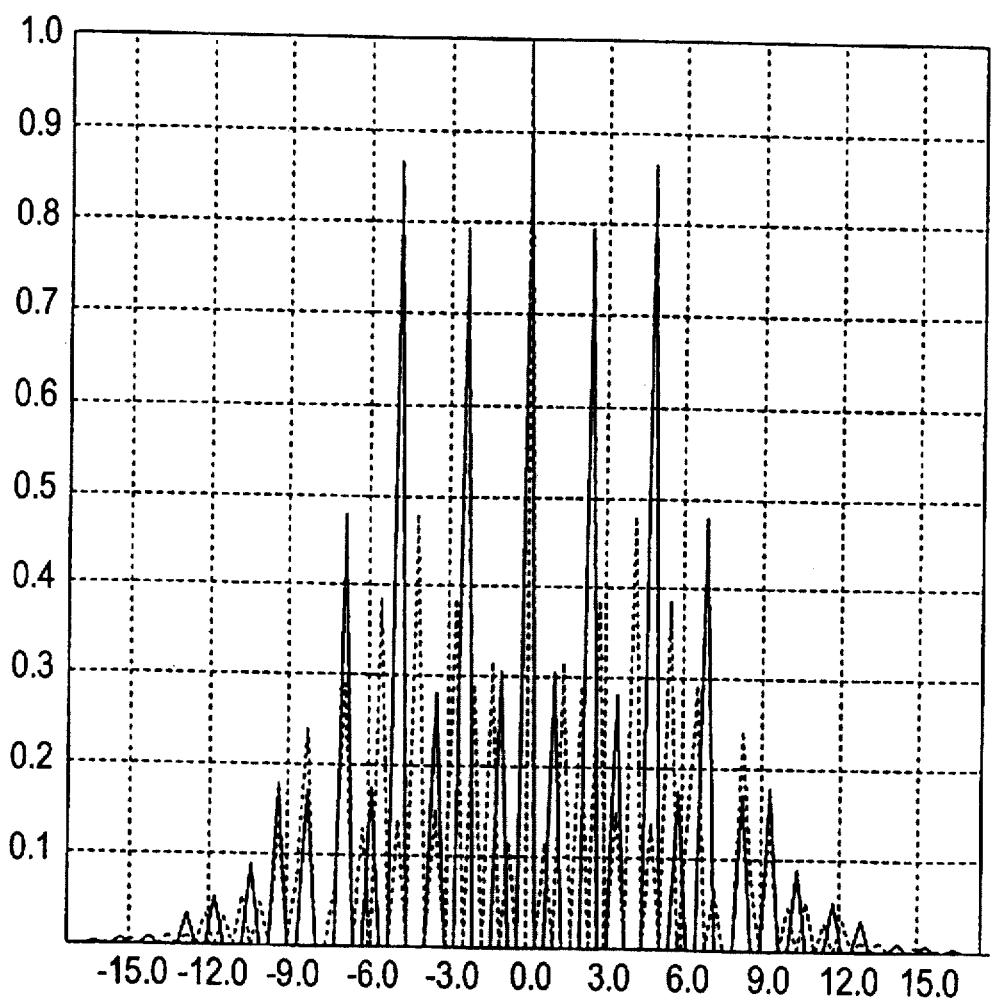

FIGS. 59 through 61 shows defocused image intensities of a line light source (longitudinal line light source shown at solid lines and lateral line light source shown at imaginary lines) at wavelengths of 450 nm, 550 nm, and 650 nm, respectively. The abscissae designate the radii of diffraction of the diffraction patterns, and the ordinates designate the relative intensity of light on the assumption that the peak intensity is 1.0, respectively.

Although the resultant pattern is discrete due to the periodicity of the basic patterns to be superimposed, the optical properties of the diffusion plate, according to the illustrated embodiment, are highly improved in comparison with the diffusion plate shown in FIGS. 2 through 10. Furthermore, the structure of the diffusion plate is not as visible as in the conventional diffusion plate in which the pitch of the microstructures is merely increased.

In the third embodiment, although the diffusion plate is made of two basic patterns having the same orientation and different pitches, it is possible to superimpose the basic patterns with an angular phase difference therebetween, similar to the first or second embodiment. Namely one of the basic patterns may be rotated by a predetermined angle with respect to the other basic pattern.

Embodiment 4

Figure 62:
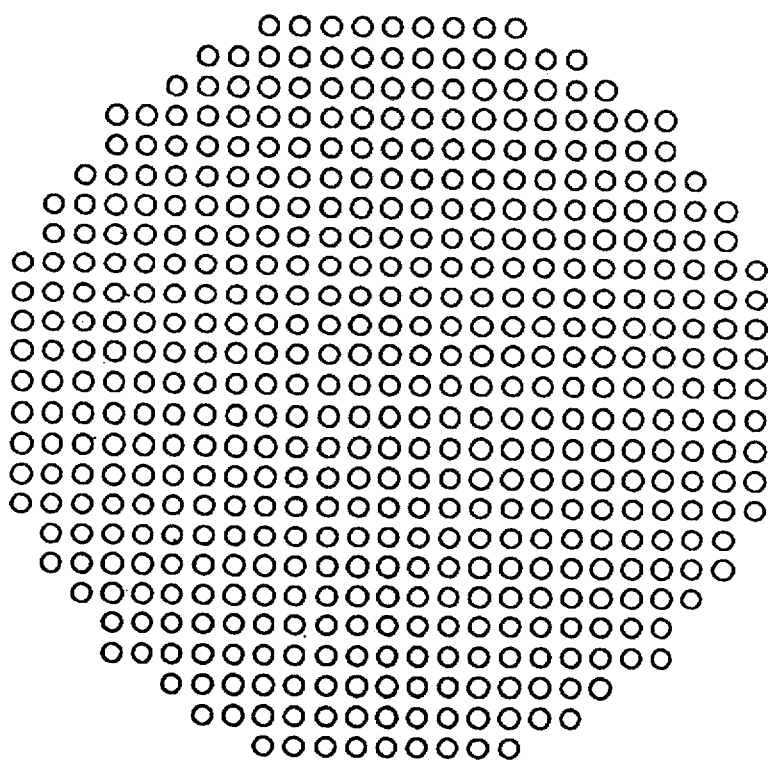
FIGS. 62 and 63 are schematic diagrams of two different basic patterns in a fourth embodiment of the present invention.

FIG. 62 shows a basic pattern of a diffusion plate, according to a fourth embodiment of the present invention, in which the micro lenses (microstructures) of 1.2 μm height and 10 μm diameter are distributed at a pitch of 16 μm in square arrangement.

Figure 63:
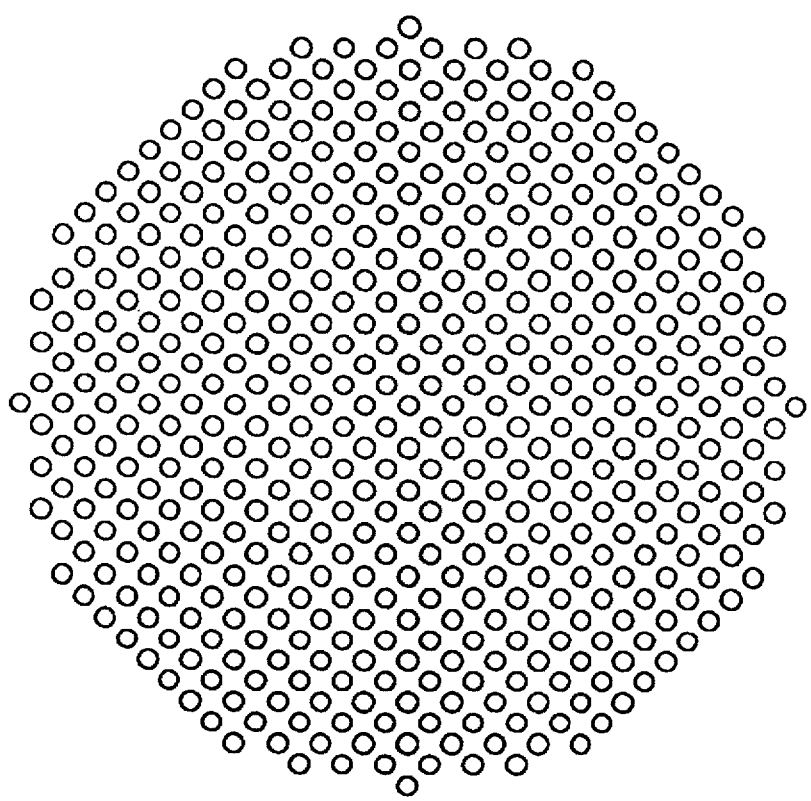

FIG. 63 shows another basic pattern of a diffusion plate according to a fourth embodiment, in which the micro lenses (microstructures) of 1.2 μm height and 10 μm diameter are distributed at a pitch of 16 μm in a square arrangement. There is an angular phase difference of 45° between the patterns, namely, the orientation of the first basic pattern, as shown in FIG. 62, is different from that of the second basic pattern, as shown in FIG. 63, by 45°.

Figure 64:
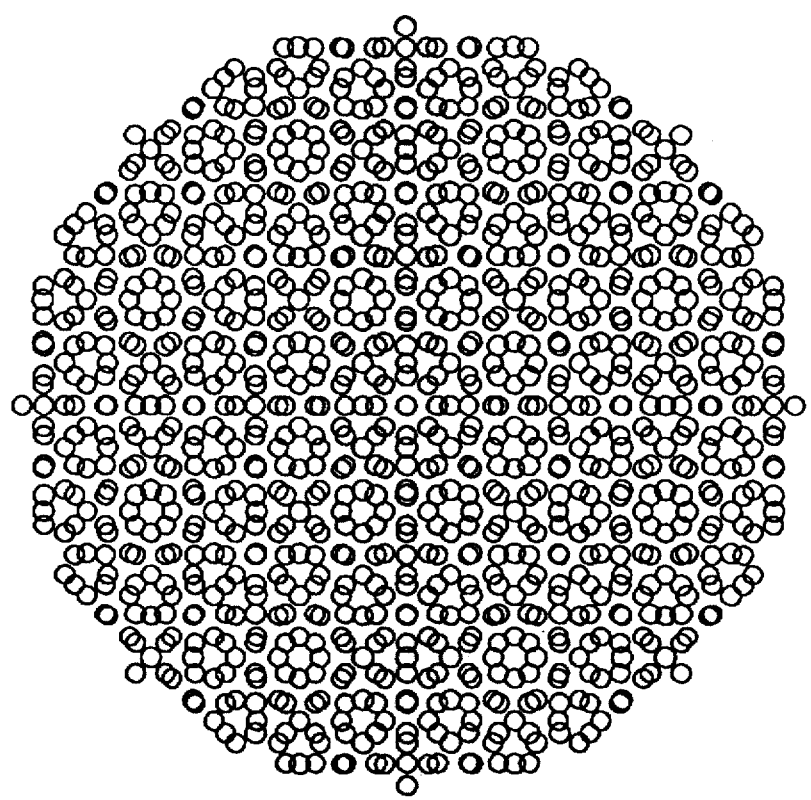
FIG. 64 is a schematic view of a diffusion plate structure made by a combination of the arrangements, as shown in FIGS. 62 and 63, according to a fourth embodiment of the present invention.

FIG. 64 shows a resultant pattern of a diffusion plate which is a combination of the basic patterns shown in FIGS. 62 and 63. The resultant pattern shown in FIG. 64 has no periodicity. Although the resultant pattern may appear periodic, it is not.

FIGS. 65 through 73 show various optical properties of the diffusion plate shown in FIG. 64.

Figure 65:
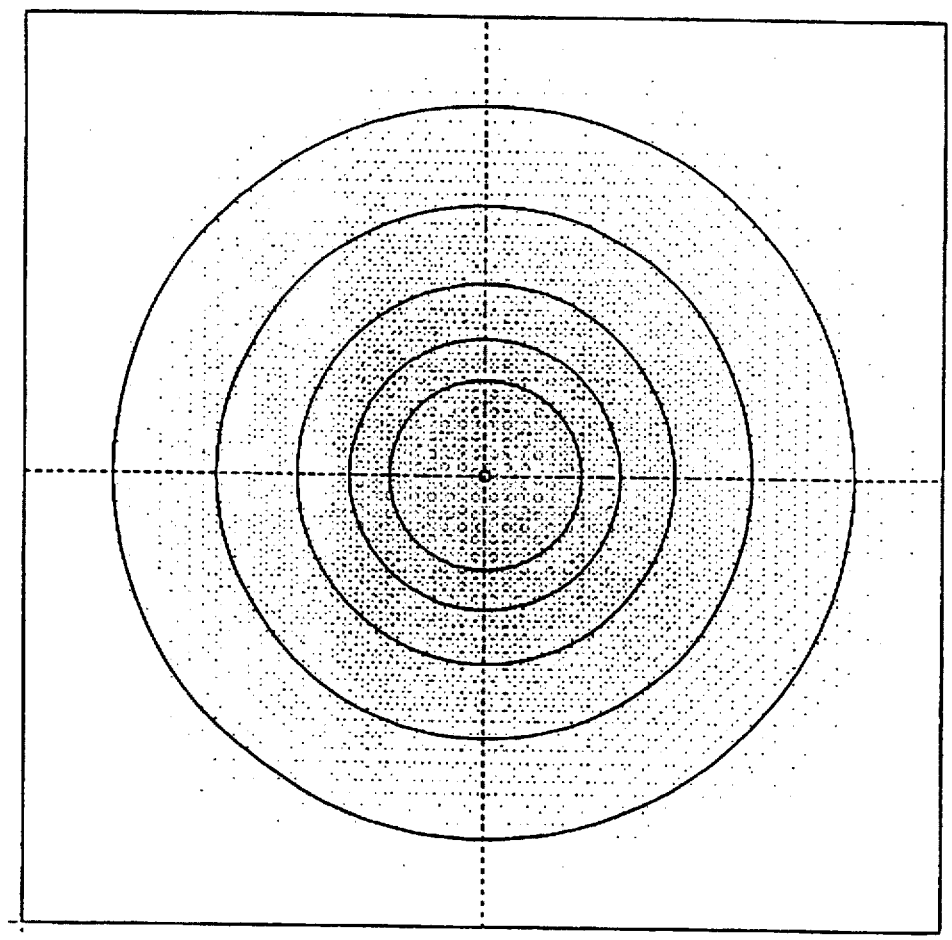
FIGS. 65, 66, and 67 are diagrams which show defocused images of a point light source produced by the diffusion plate, as shown in FIG. 64, at wavelengths of 450 nm, 550 nm, and 650 nm, respectively.
Figure 66:
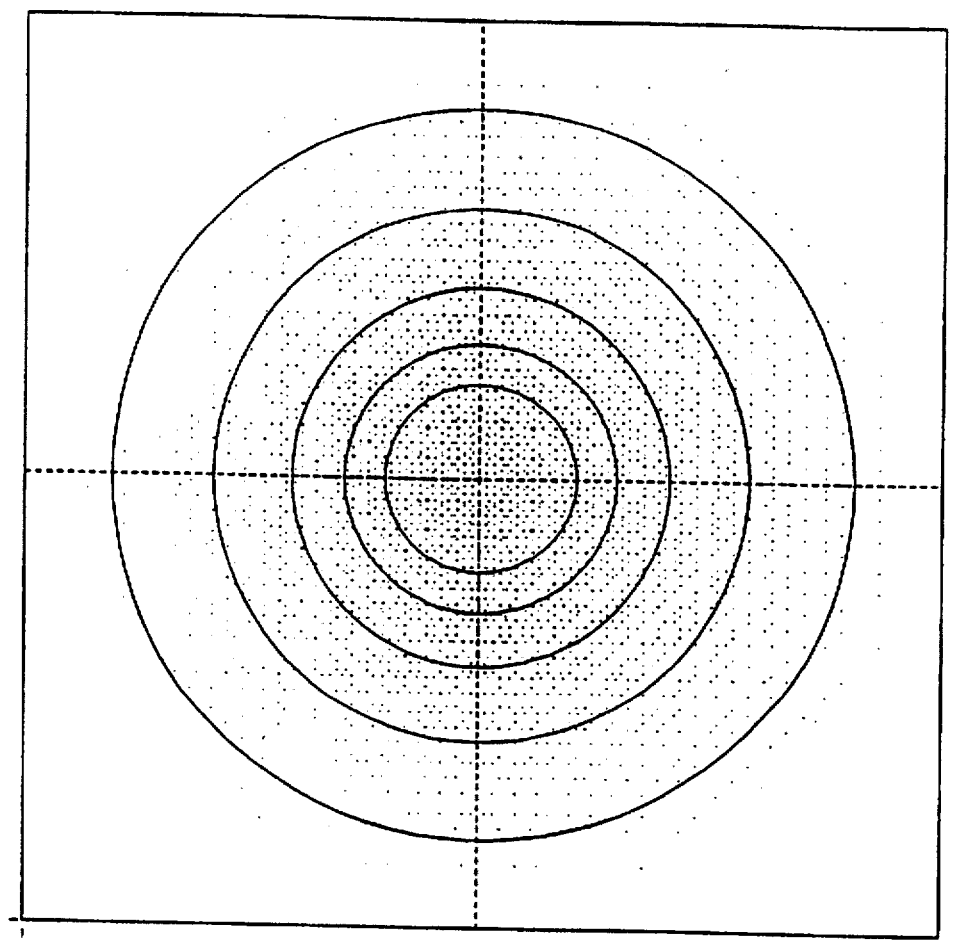
Figure 67:
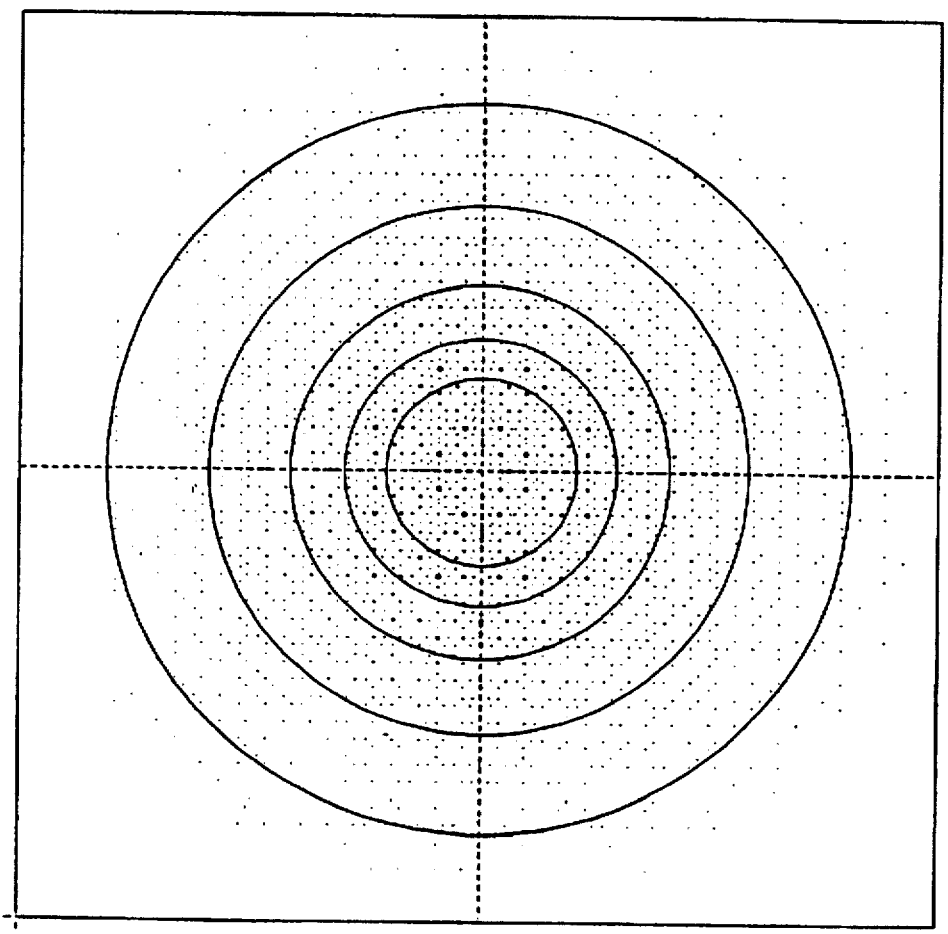

FIGS. 65 through 67 show the state of diffusion, i.e., the defocused images of a point light source at wavelengths of 450 nm, 550 nm, and 650 nm, respectively. In FIGS. 65 through 67, the diameters of the small circles (points) correspond to the intensity of the diffracted light, and the diameters of the large circles correspond to the F numbers of bundles of rays incident upon the diffusion plate. In the illustrated embodiment, the F numbers are 2.0, 2.8, 4.0, 5.6 and 8.0, in this order, as viewed from the outermost circle, respectively.

Figure 68:
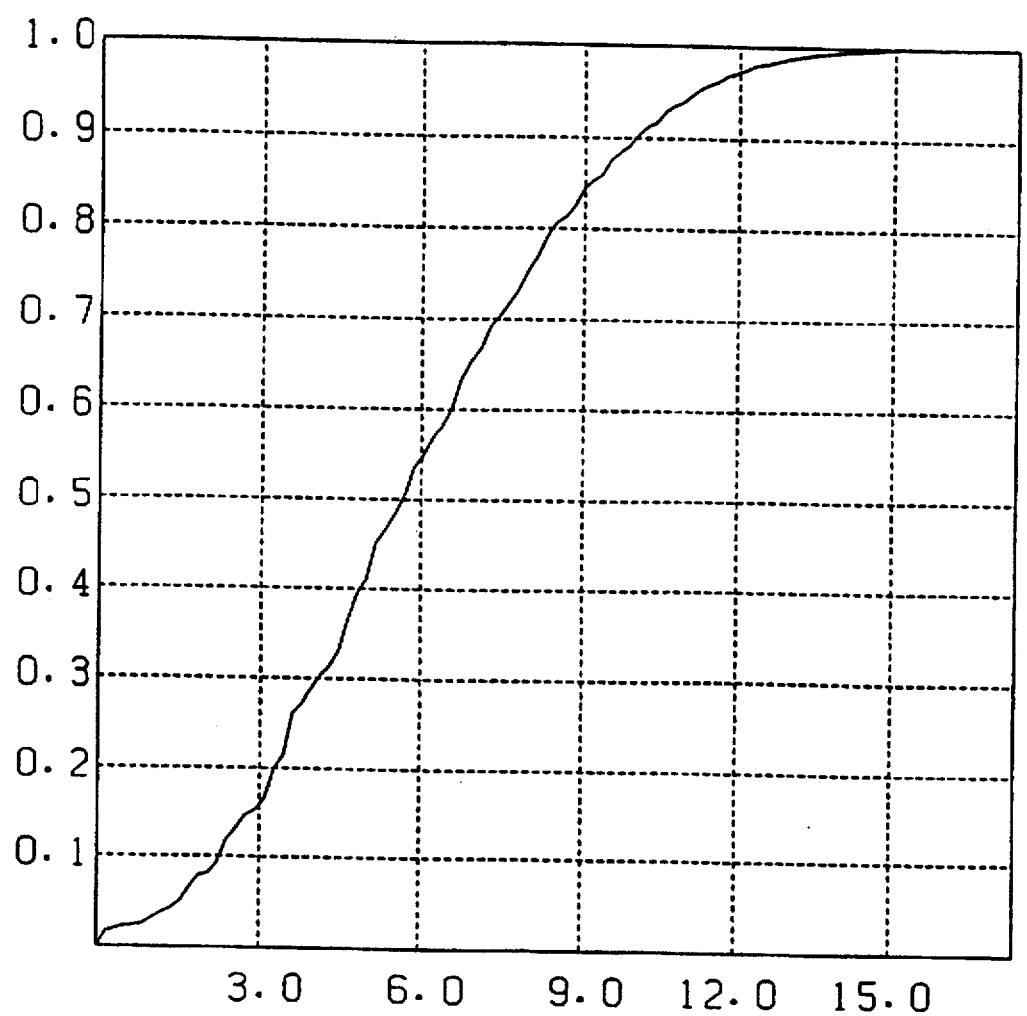
FIGS. 68, 69, and 70 are diagrams showing distributions of light diffused by the diffusion plate, as shown in FIG. 64, at wavelengths of 450 nm, 550 nm, and 650 nm, respectively, wherein the abscissa represents the radii of circles and the ordinate represents the quantity of light contained in the circles.
Figure 69:
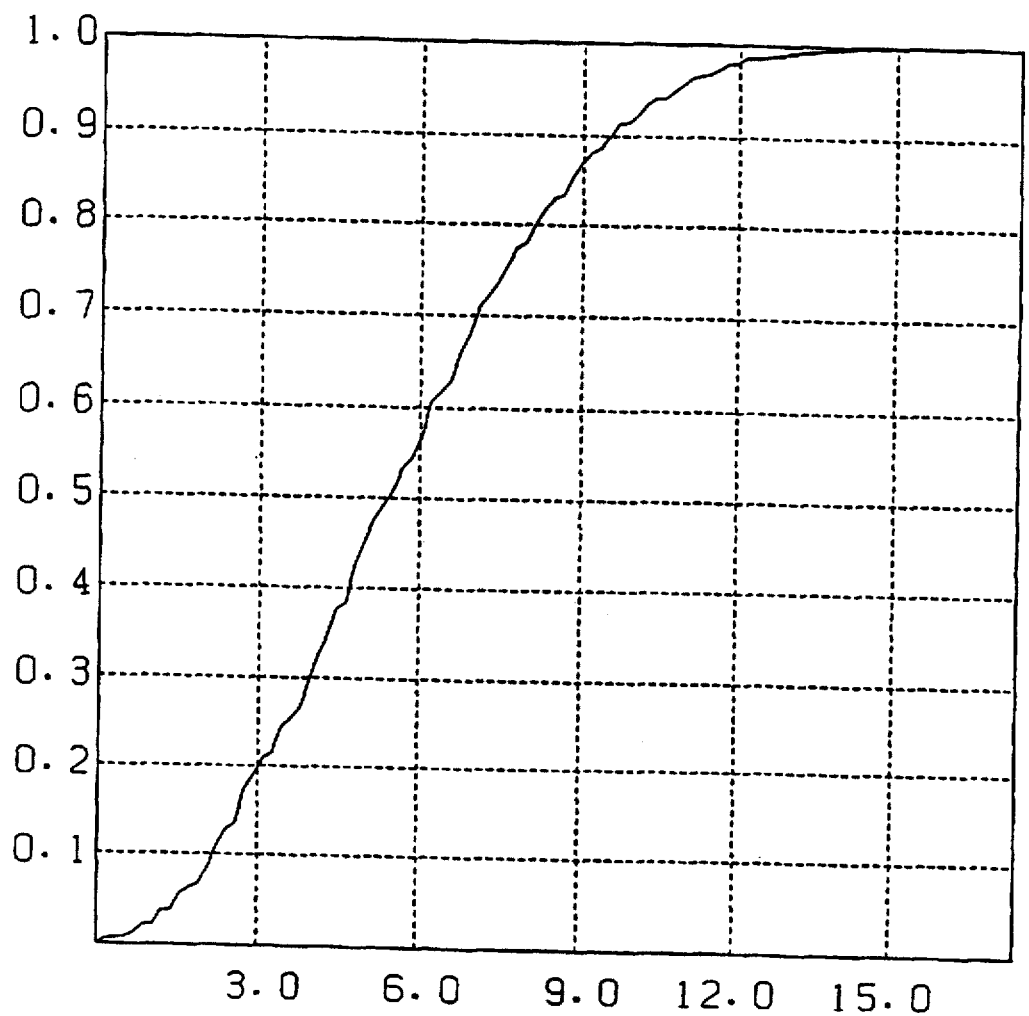
Figure 70:
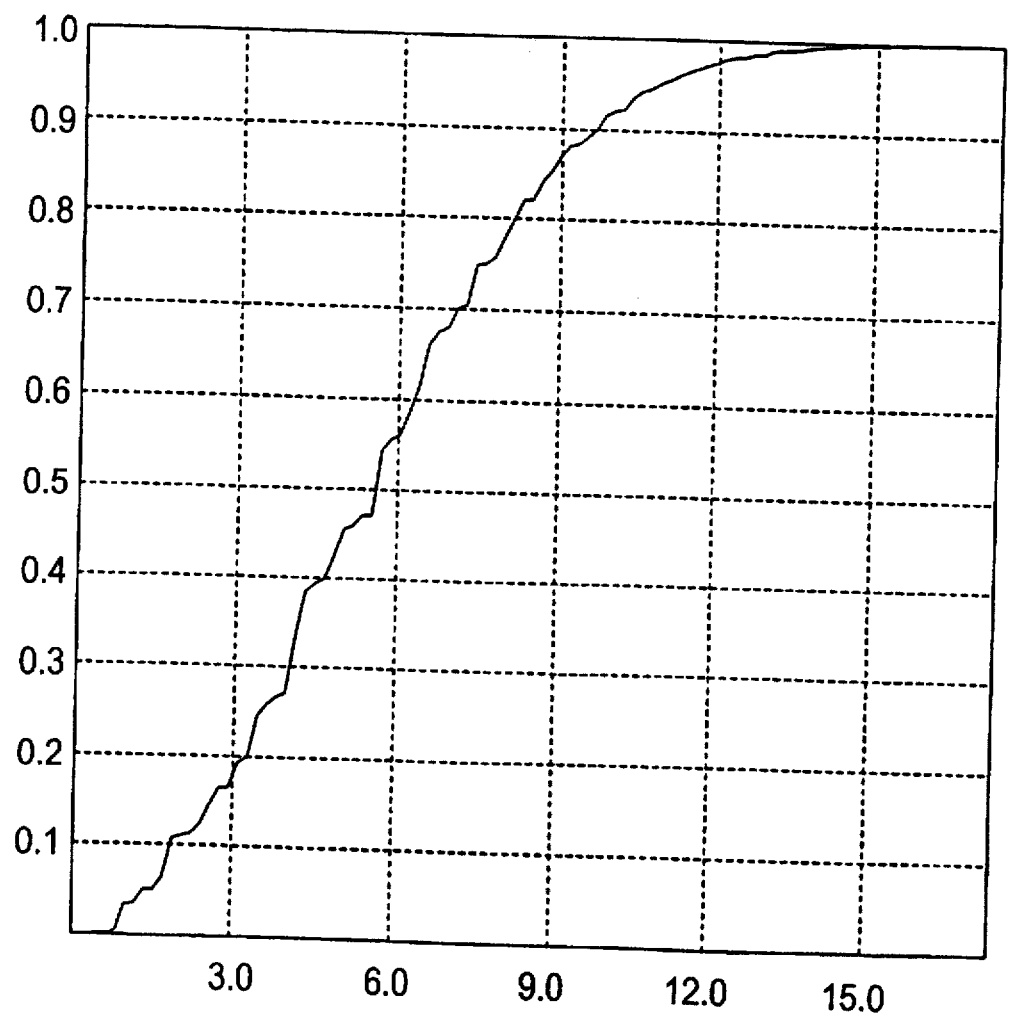

FIGS. 68 through 70 show the quantity of light at wavelengths of 450 nm, 550 nm, and 650 nm, respectively. The abscissae designate the radii of the respective circles and the ordinates designate the quantities of light contained in the respective circles on the assumption that the total quantity of light transmitted through the diffusion plate shown in FIG. 64 is 1.0, respectively.

Figure 71:
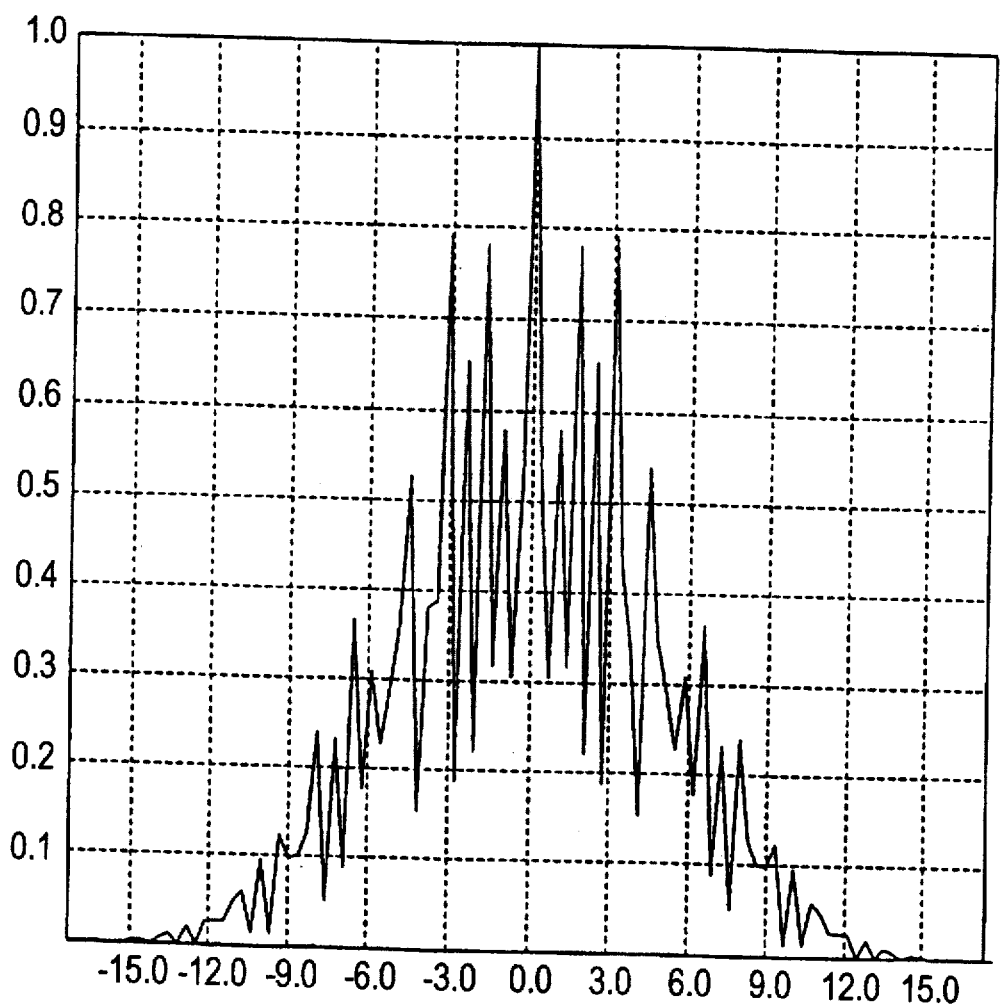
FIGS. 71, 72, and 73 are diagrams showing a defocus of images in the vertical and horizontal directions obtained by integrating the functions illustrated in FIGS. 68, 69, and 70, respectively.
Figure 72:
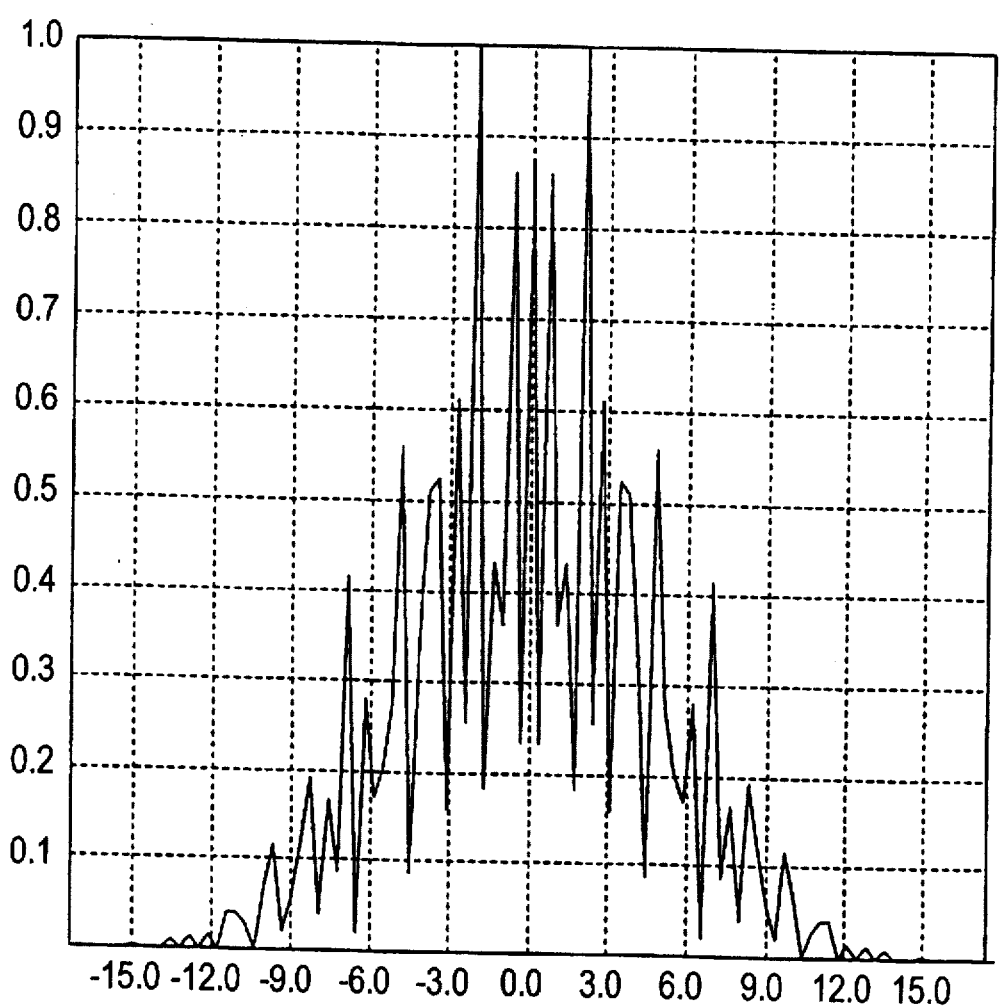
Figure 73:
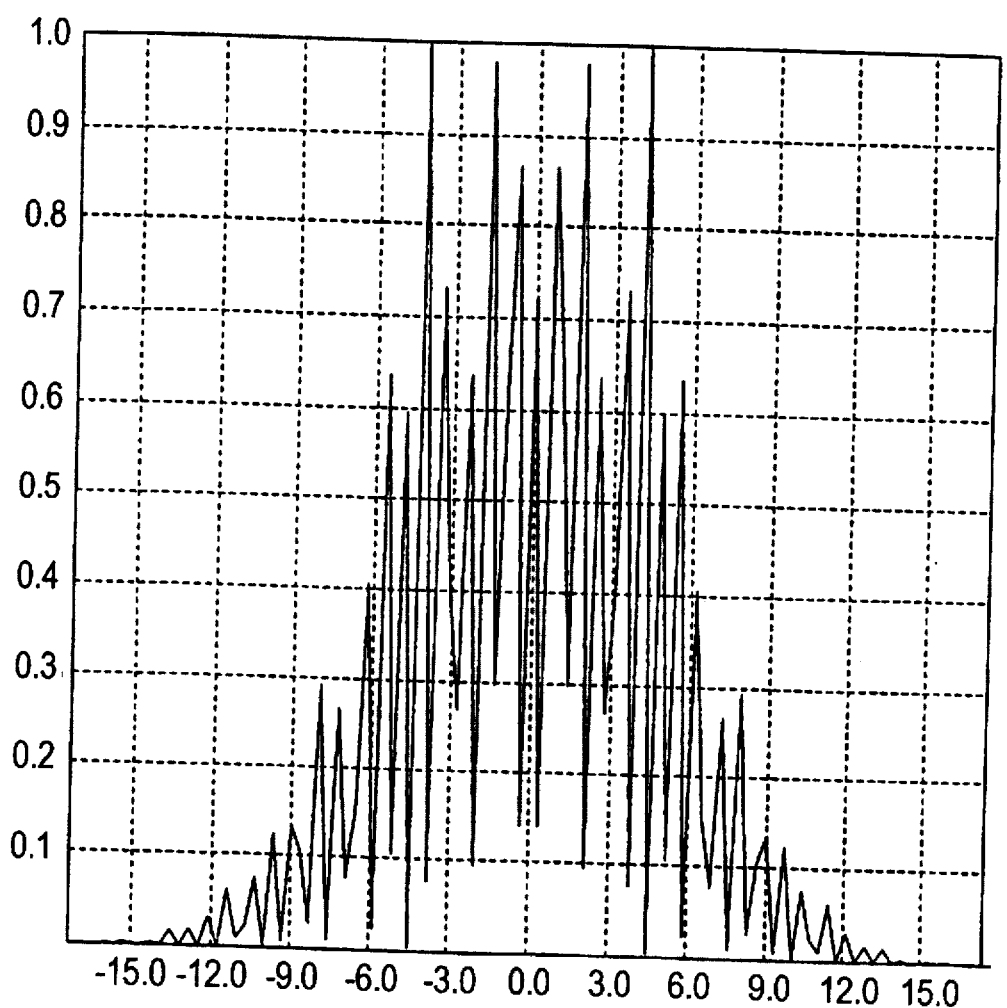

FIGS. 71 through 73 show defocused image intensities of a line light source (longitudinal line light source shown at solid lines and lateral line light source shown at imaginary lines) at wavelengths of 450 nm, 550 nm, and 650 nm, respectively. The abscissae designate the radii of diffraction of the diffraction patterns and the ordinates designate the relative intensity of light on the assumption that the peak intensity is 1.0, respectively.

Since there is no difference in distribution in the direction of the line light source, the solid lines and the imaginary lines overlap.

Embodiment 5

Figure 74:
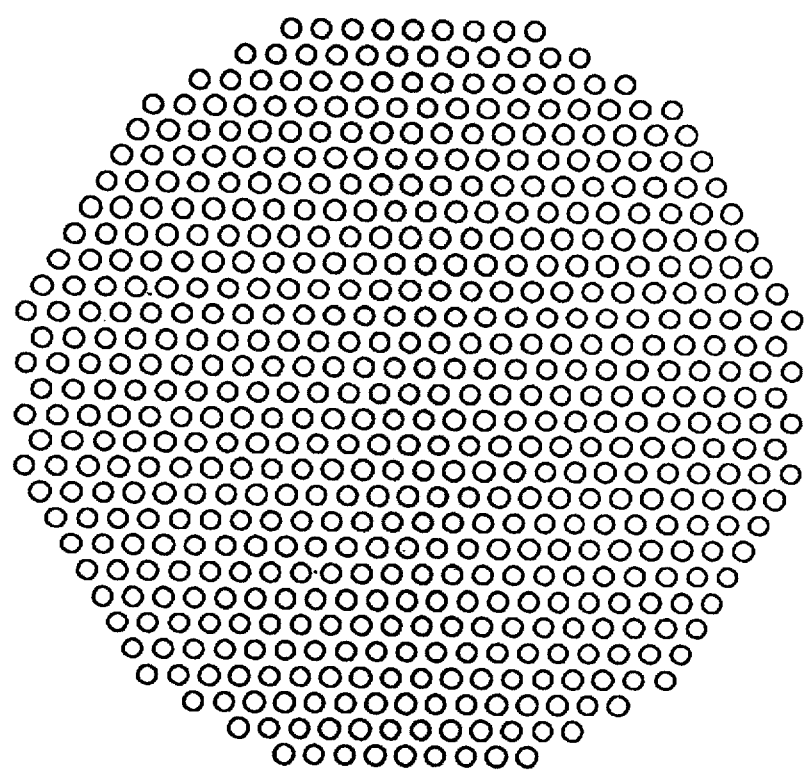
FIGS. 74 and 75 are schematic diagrams of two different basic patterns in a fifth embodiment of the present invention.

FIG. 74 shows a basic pattern of a diffusion plate according to a fifth embodiment of the present invention, in which the micro lenses (microstructures), of 1.2 μm height and 10 μm diameter, are distributed at a pitch of 16 μm in the highest possible density arrangement. The lattice vector is represented by p=(16,0) (μm) and q=(8,8·3$^{1/2}$) (μm). Unless otherwise specified, the components of the lattice vectors are defined in terms of the Cartesian Coordinate System.

Figure 75:
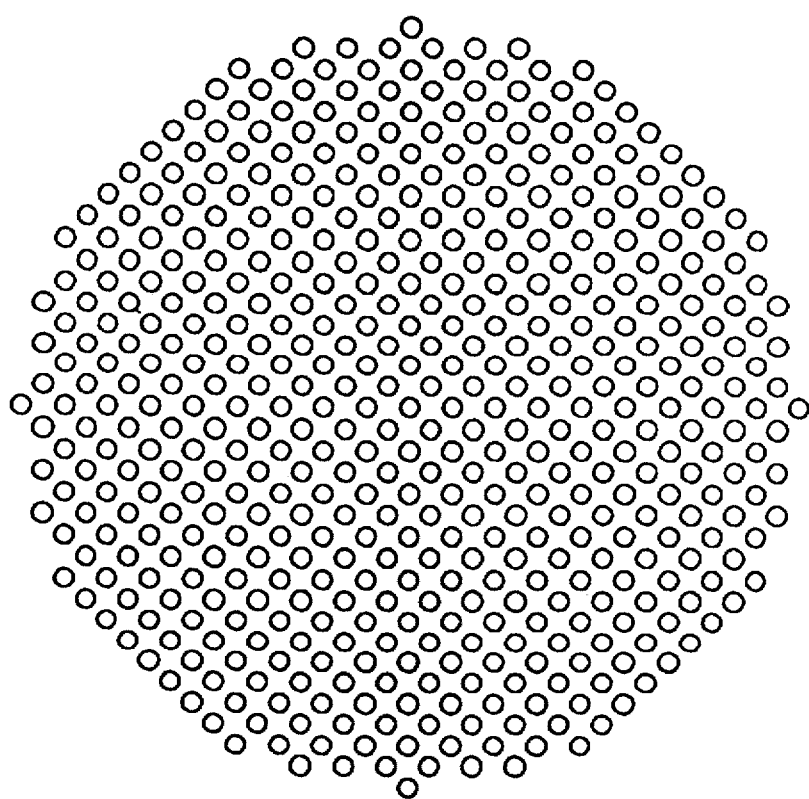

FIG. 75 shows another basic pattern of a diffusion plate according to a fifth embodiment, in which the micro lenses (microstructures) of 1.2 μm height and 10 μm diameter are distributed at a pitch of 16 μm in a square arrangement. There is an angular phase difference of 45° between the basic patterns. Namely, the orientation of the first basic pattern shown in FIG. 75 is different from that of the second basic pattern, as shown in FIG. 74, by 45°. The lattice vector is represented by p=(8·2$^{1/2}$, 8·2$^{1/2}$) (μm) and q=(−8·2$^{1/2}$, 8·2$^{1/2}$) (μm).

Figure 76:
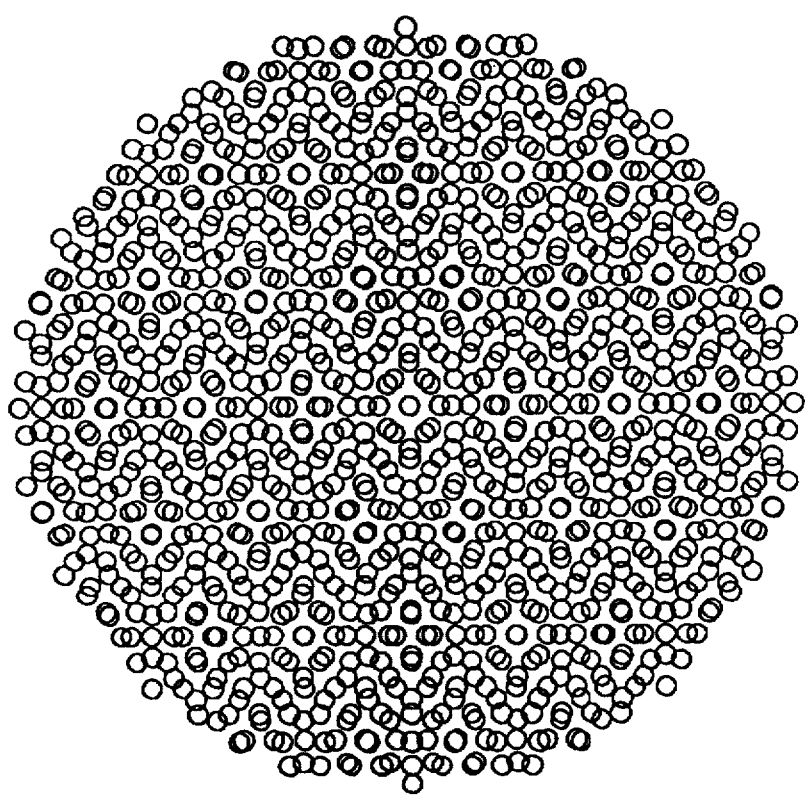
FIG. 76 is a schematic view of a diffusion plate structure made by a combination of the arrangements, as shown in FIGS. 74 and 75, according to a fifth embodiment of the present invention.

FIG. 76 shows a resultant pattern of a diffusion plate which is a combination of the basic patterns shown in FIGS. 74 and 75. The resultant pattern, as shown in FIG. 76, has no periodicity. Although the resultant pattern may appear periodic, it is not.

FIGS. 77 through 85 show various optical properties of the diffusion plate shown in FIG. 76.

Figure 77:
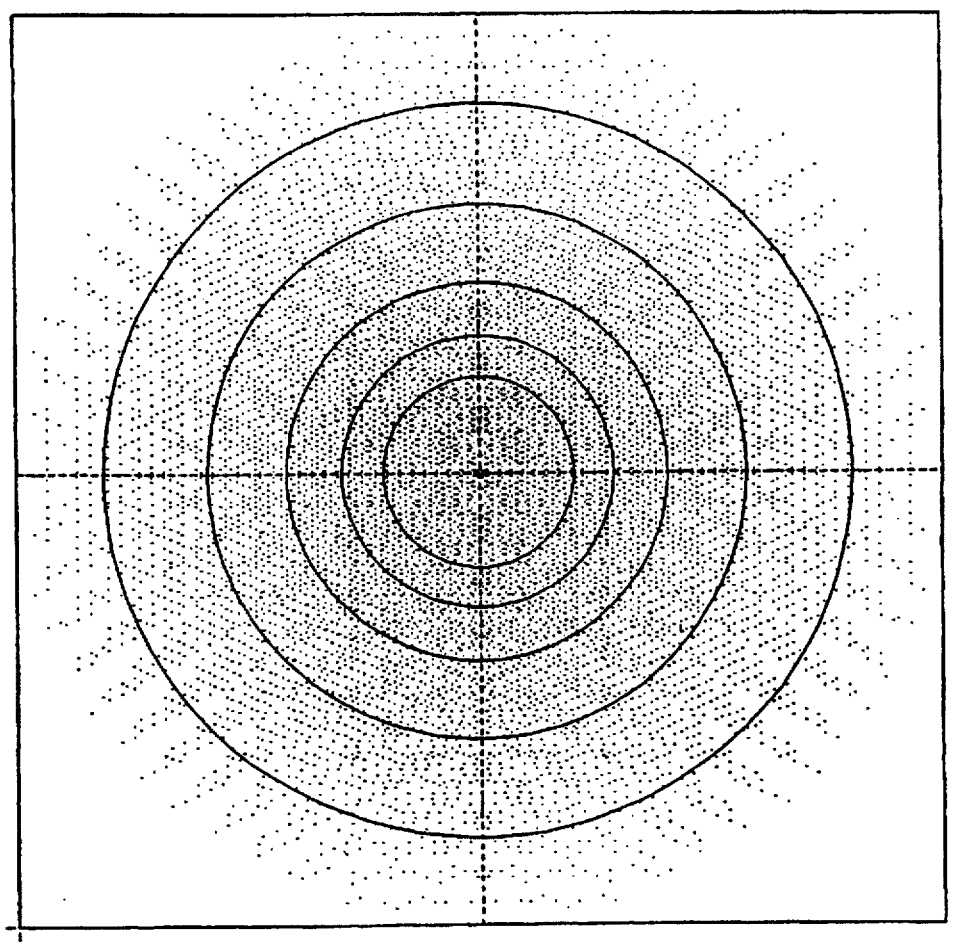
FIGS. 77, 78, and 79 are diagrams which show defocused images of a point light source produced by the diffusion plate of the fifth embodiment, as shown in FIG. 76, with the light source having wavelengths of 450 nm, 550 nm, and 650 nm, respectively.
Figure 78:
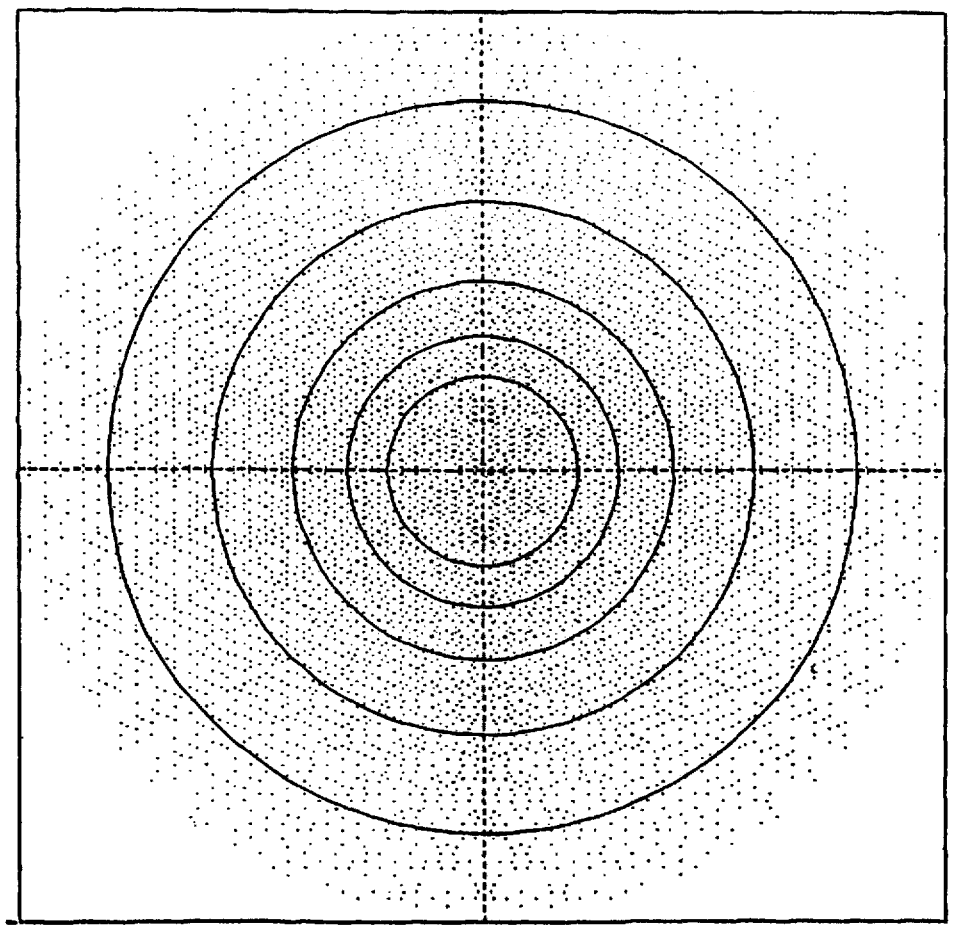
Figure 79:
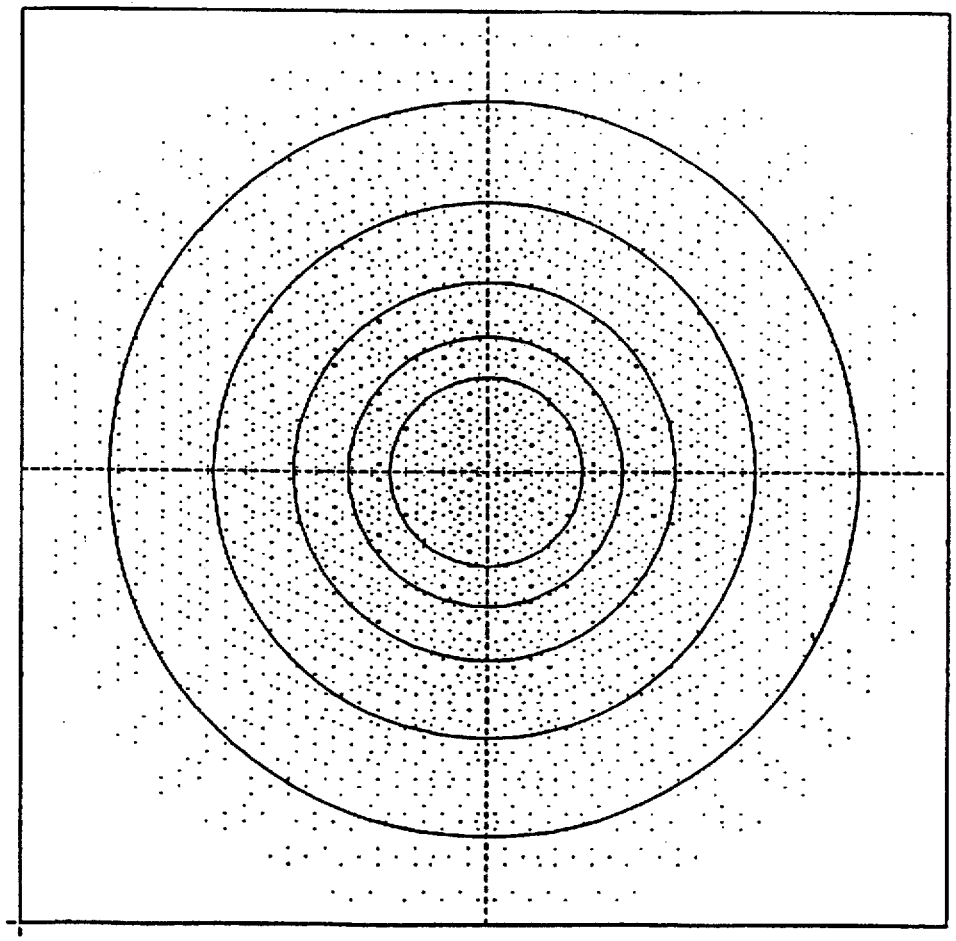

FIGS. 77 through 79 show the state of diffusion, i.e., the defocused image of a point light source at wavelengths of 450 nm, 550 nm, and 650 nm, respectively. In FIGS. 77 through 79, the diameters of the small circles (points) correspond to the intensity of the diffracted light, and the diameters of the large circles correspond to the F numbers of bundles of rays incident upon the diffusion plate. In the illustrated embodiment, the F numbers are 2.0, 2.8, 4.0, 5.6, and 8.0, in this order, as viewed from the outermost circle, respectively.

Figure 80:
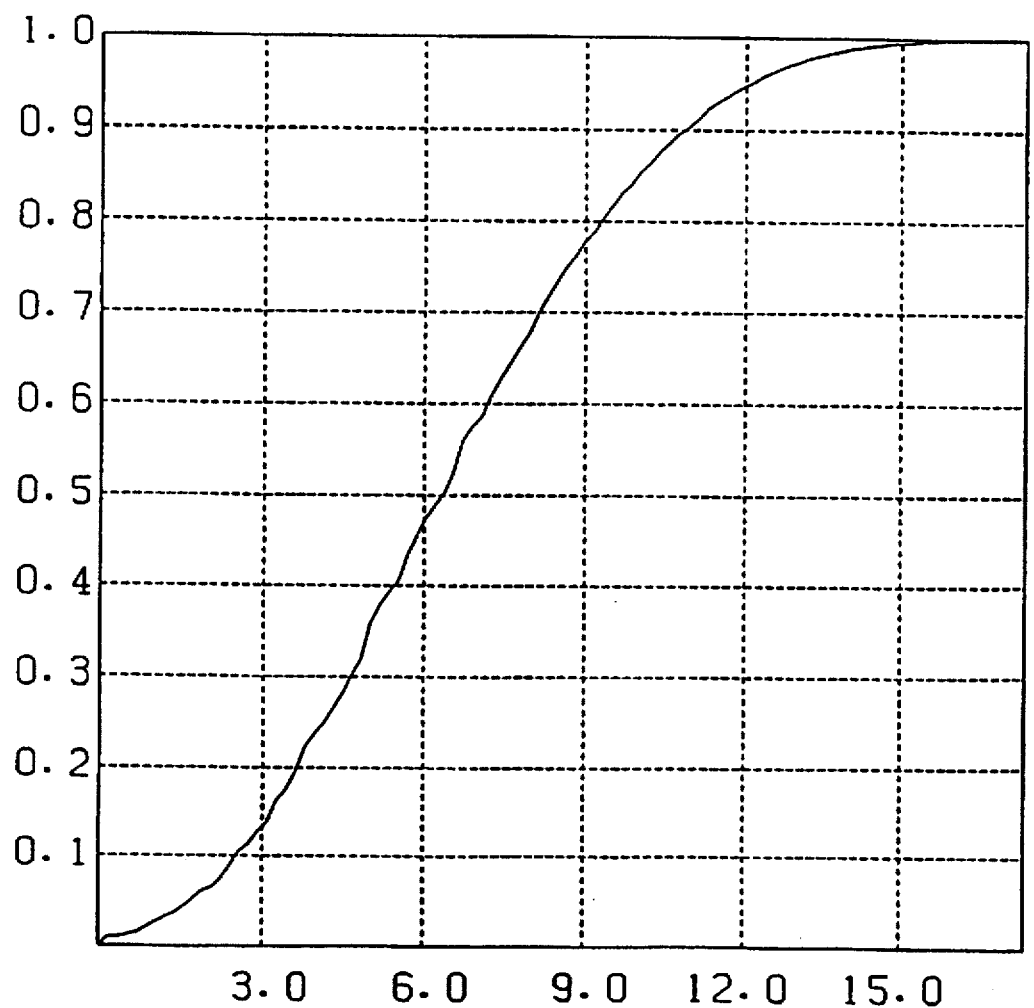
FIGS. 80, 81, and 82 are diagrams showing distributions of light diffused by the diffusion plate of a fifth embodiment of the present invention, as shown in FIG. 76, at wavelengths of 450 nm, 550 nm, and 650 nm, respectively, wherein the abscissa represents the radii of circles and the ordinate represents the quantity of light contained in the circles.
Figure 81:
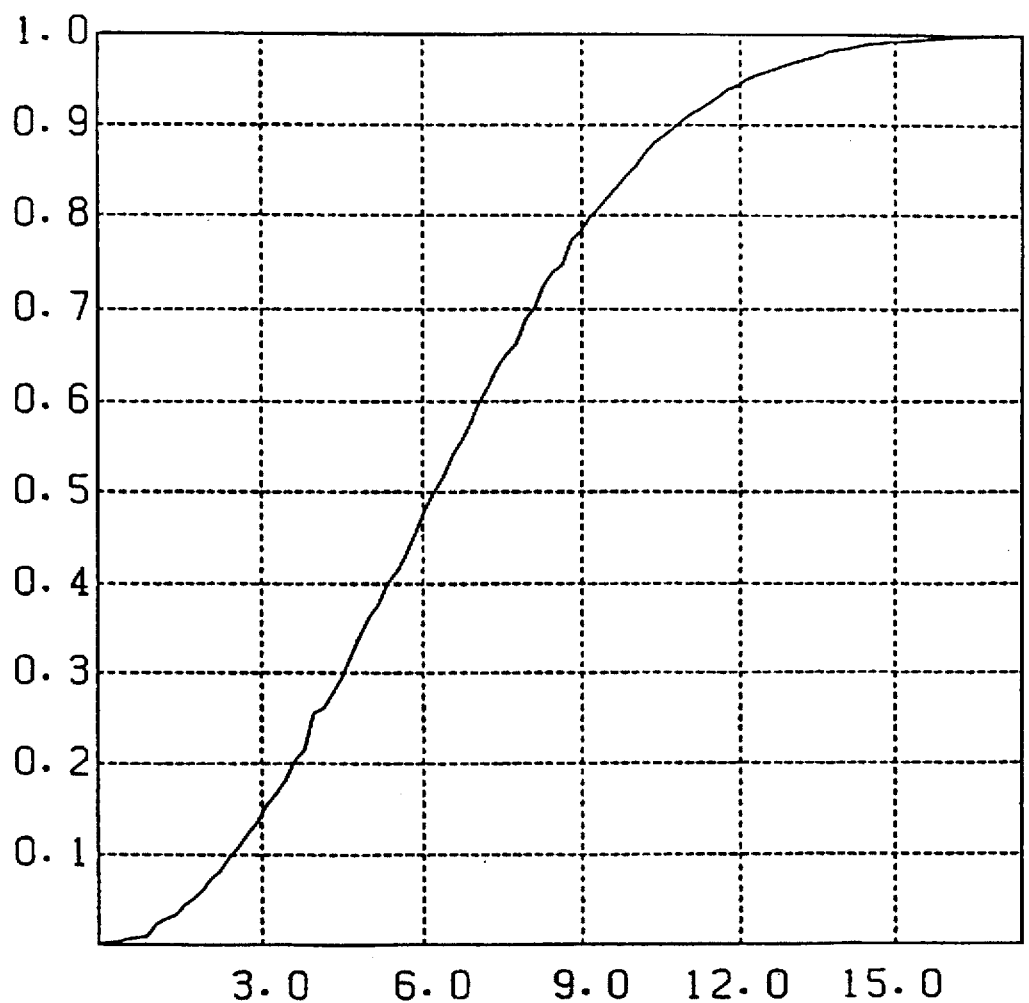
Figure 82:
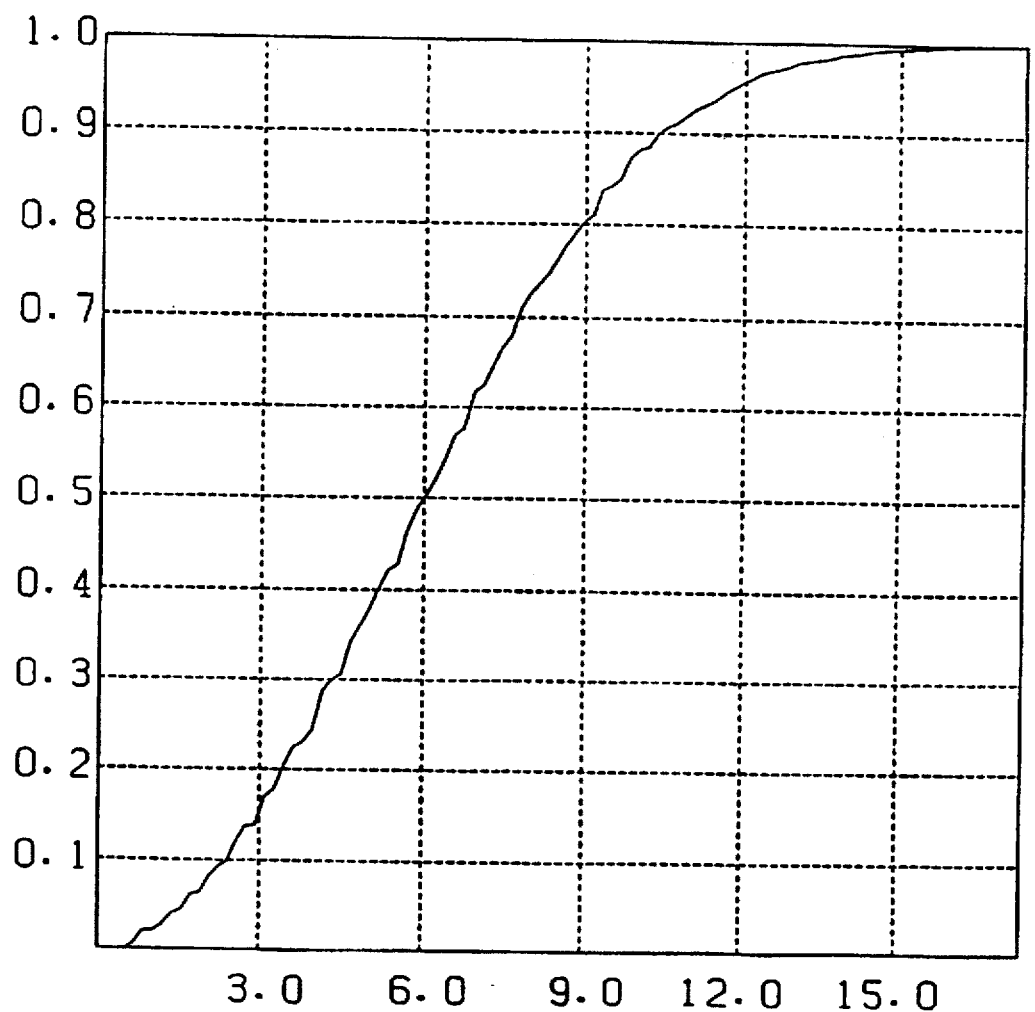

FIGS. 80 through 82 show the quantity of light at wavelengths of 450 nm, 550 nm, and 650 nm, respectively. The abscissae designate the radii of the respective circles and the ordinates designate the quantities of light contained in the respective circles on the assumption that the total quantity of light transmitted through the diffusion plate, as shown in FIG. 76, is 1.0, respectively.

Figure 83:
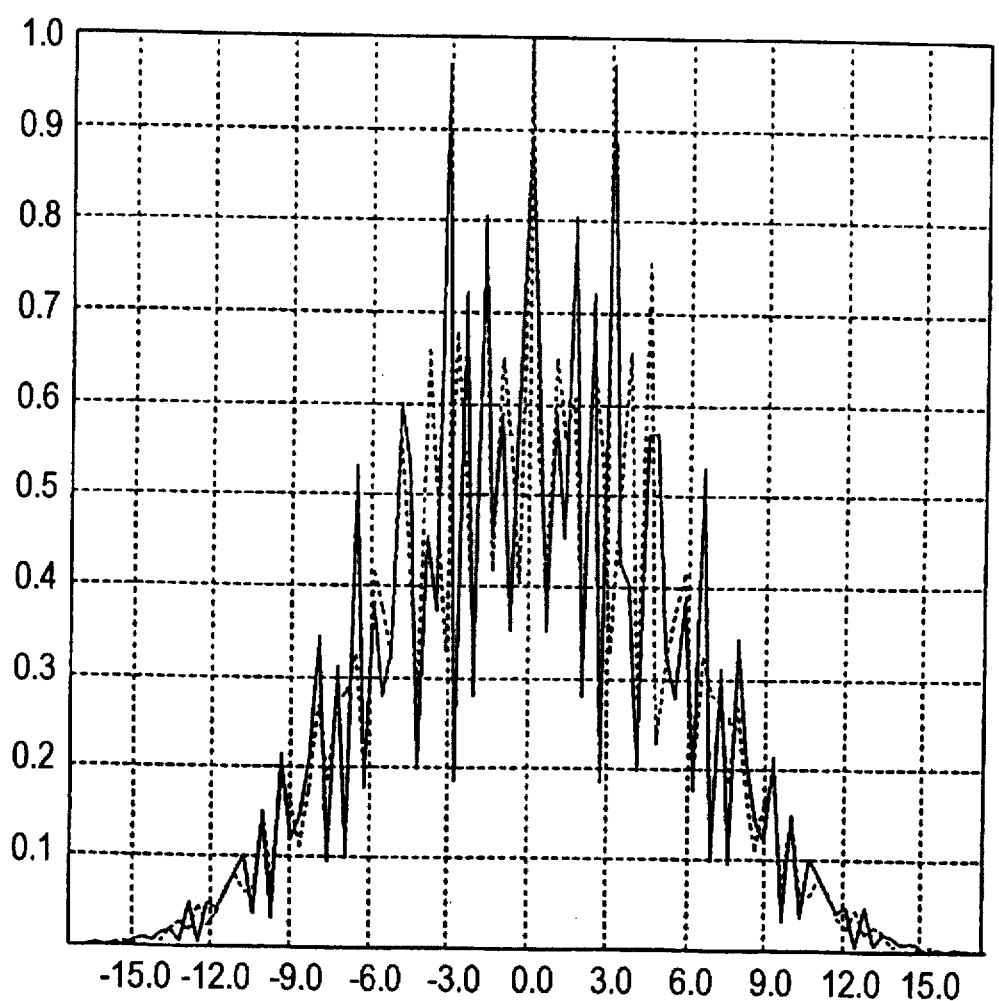
FIGS. 83, 84, and 85 are diagrams showing a defocus of images in the vertical and horizontal directions, obtained by integrating the functions illustrated in FIGS. 80, 81 and 82, respectively.
Figure 84:
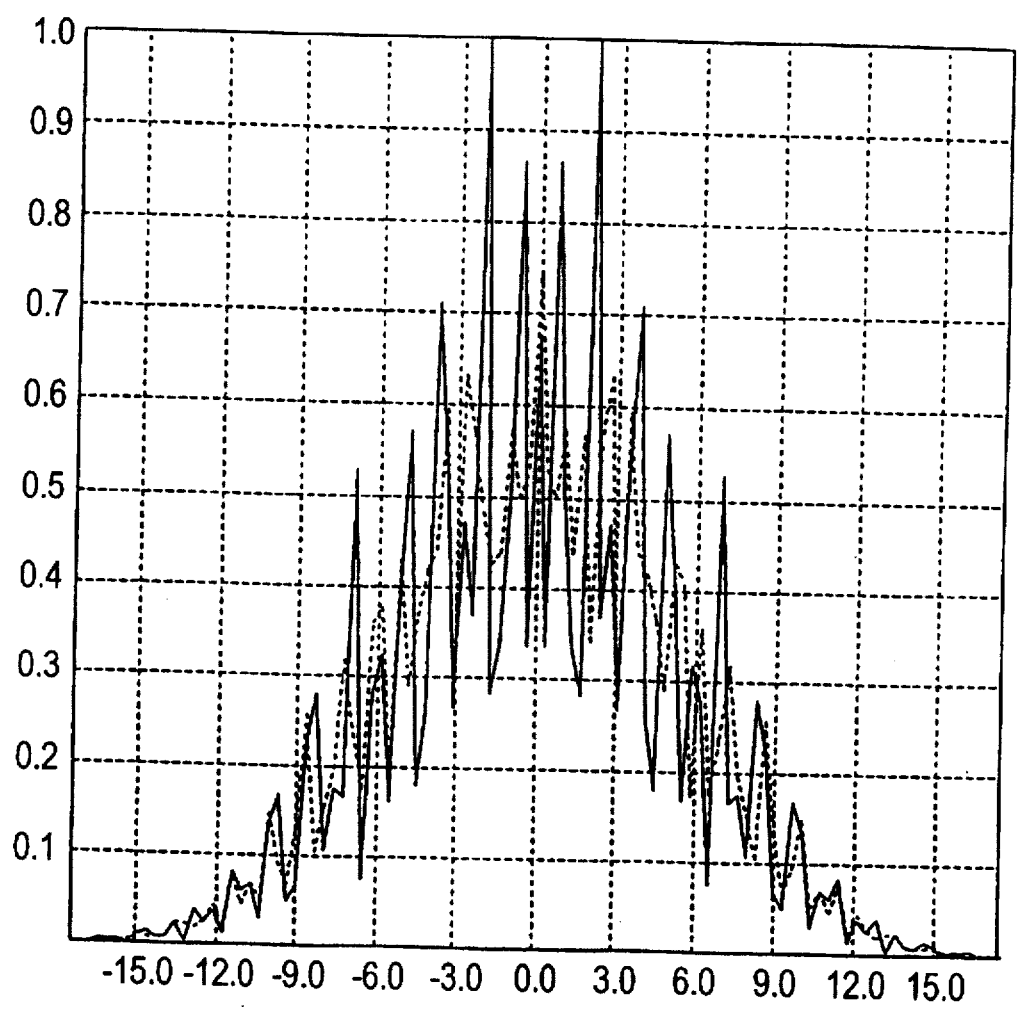
Figure 85:
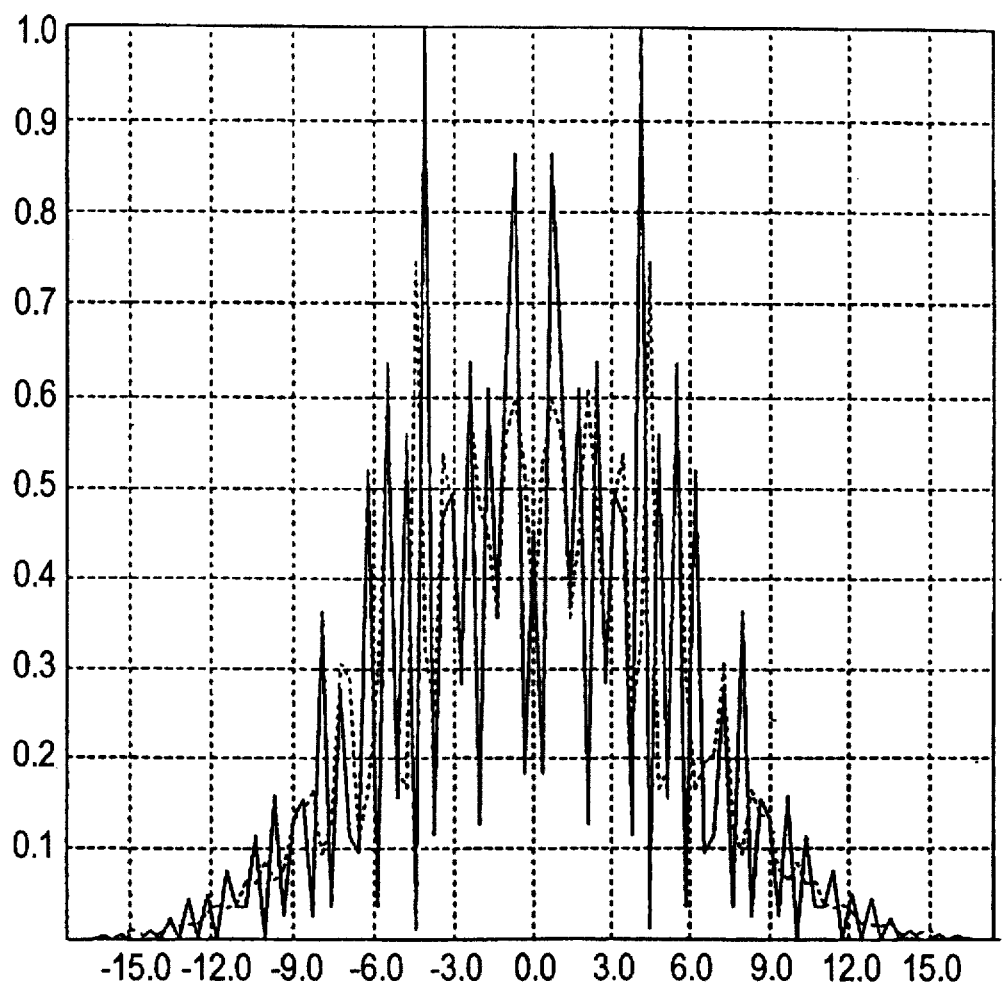

FIGS. 83 through 85 show defocused image intensities of a line light source (longitudinal line light source shown at solid lines and lateral line light source shown at imaginary lines) at wavelengths of 450 nm, 550 nm, and 650 nm, respectively. The abscissae designate the radii of diffraction of the diffraction patterns and the ordinates represent the relative intensity of light on the assumption that the peak intensity is 1.0, respectively.

Figure 86:
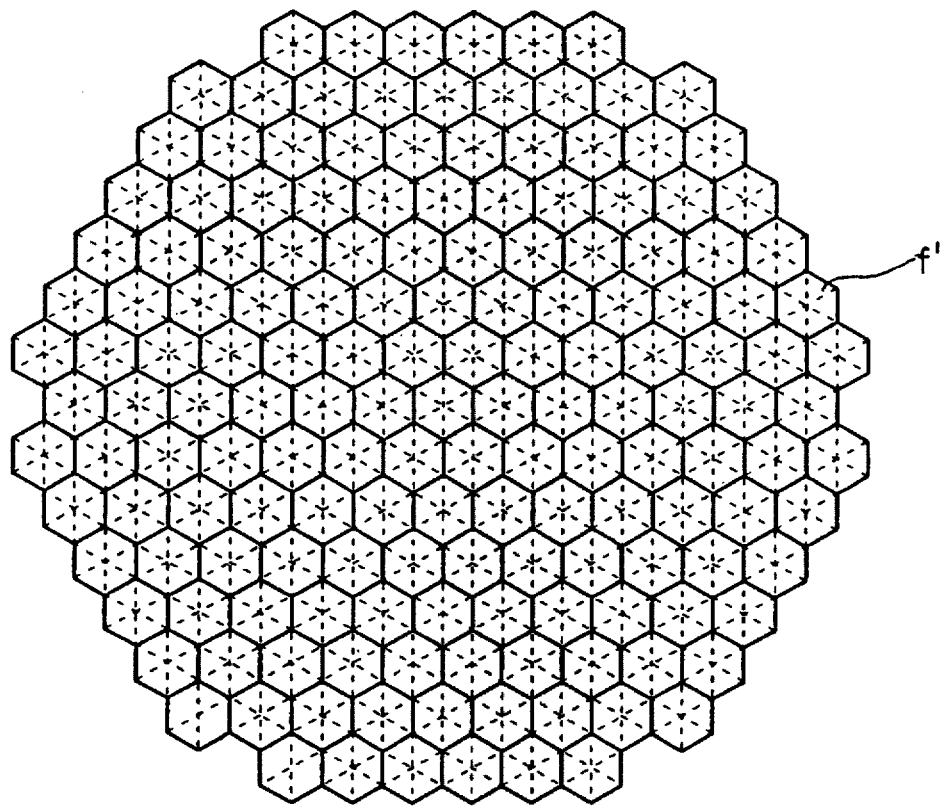
FIG. 86 is a schematic view of a hexagonal pyramid structure having the highest possible density arrangement, according to a sixth embodiment of the present invention.

In the above-mentioned embodiments, the microstructures f are all micro lenses, each having a circular shape in the direction normal to the basic patterns. The micro lenses, which are most preferably circular in shape, can be replaced with, for example, hexagonal pyramid lenses f' which are closely located side by side, as shown in FIG. 86. A plurality of basic patterns, each having the hexagonal pyramid lenses f' are superimposed with a predetermined angular phase difference. In this case, the discreteness of the diffusion property is improved by a convolution integration and no color irregularity occurs.

The factor (envelope) which determines the relative intensity of the diffusion property of the discrete spectra of the periodic basic patterns is a Fourier transform $G(\omega_x, \omega_y)$ of the transmission function $g(x, y)$ of the microstructures. Accordingly, if transmission function $g(x, y)$ is of rotational symmetry, the Fourier transform $G(\omega_x, \omega_y)$ is also of rotation symmetry. The envelope of the diffusion property of the diffusion plate, which is made of the basic patterns, is also of rotational symmetry, since it is a convolution integral of a function having rotational symmetry. consequently, the shape of the microstructures, as viewed from the direction normal to the basic patterns, is preferably circular to improve the diffusion characteristics.

Embodiment 6

Figure 87:
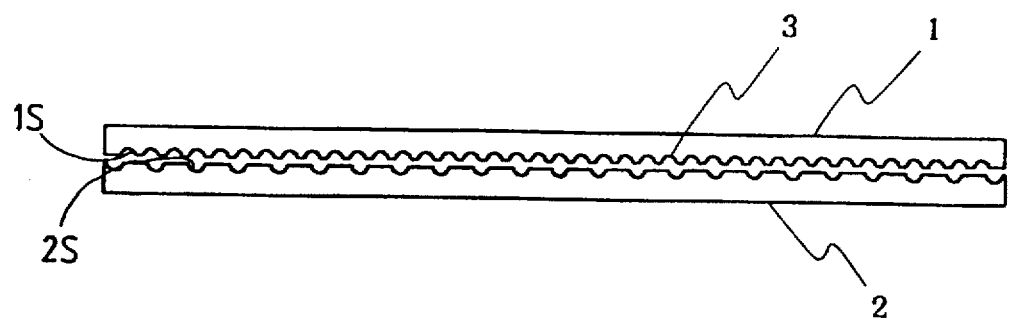
FIG. 87 is a sectional view of a diffusion plate, according to a sixth embodiment of the present invention.

FIG. 87 shows a sectional shape of a diffusion plate according to a sixth embodiment of the present invention. The diffusion plate can be produced from a single plate by a manufacturing method as will be discussed hereinafter, or from a plurality of plates having the diffusion surfaces with the basic patterns closely opposed to each other, as shown in FIG. 87. In FIG. 87, the diffusion plates 1 and 2, having the basic patterns, are opposed, so that the diffusion surfaces 15 and 25 thereof face each other. In the arrangement illustrated in FIG. 87, there are concave microstructures 3 which can be replaced with convex microstructures.

Embodiment 7

Figure 88:
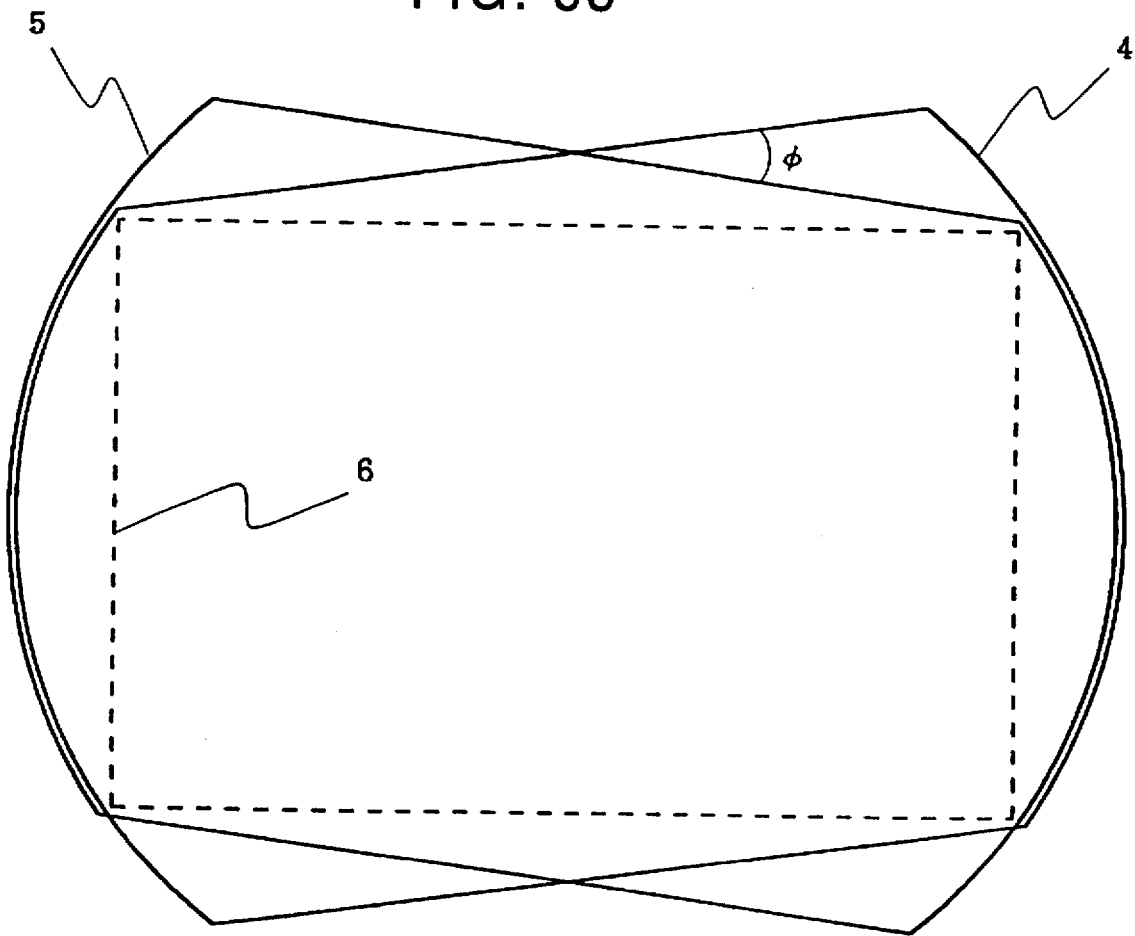
FIG. 88 is a plan view of a diffusion plate, according to a seventh embodiment of the present invention.

FIG. 88 shows a plan view of a diffusion plate according to a seventh embodiment of the present invention. In the arrangement shown in FIG. 88, there are two diffusion plates 4 and 5 having the same basic patterns at a predetermined angle φ (angular phase difference) therebetween. The diffusion plates 4 and 5 are relatively rotatable to vary the angle φ between 15° and +15°. When φ=−15°, the basic patterns are oriented in the same direction. Numeral 6 designates the field of view of the finder.

The basic patterns are the same as that shown in FIG. 24 in which the micro lenses (microstructures), of 1.2 μm height and 10 μm diameter, are distributed at a pitch of 16 μm in the highest possible density arrangement.

FIGS. 89 through 97 show various optical properties of the diffusion plate according to the seventh embodiment when φ=−15°.

Figure 89:
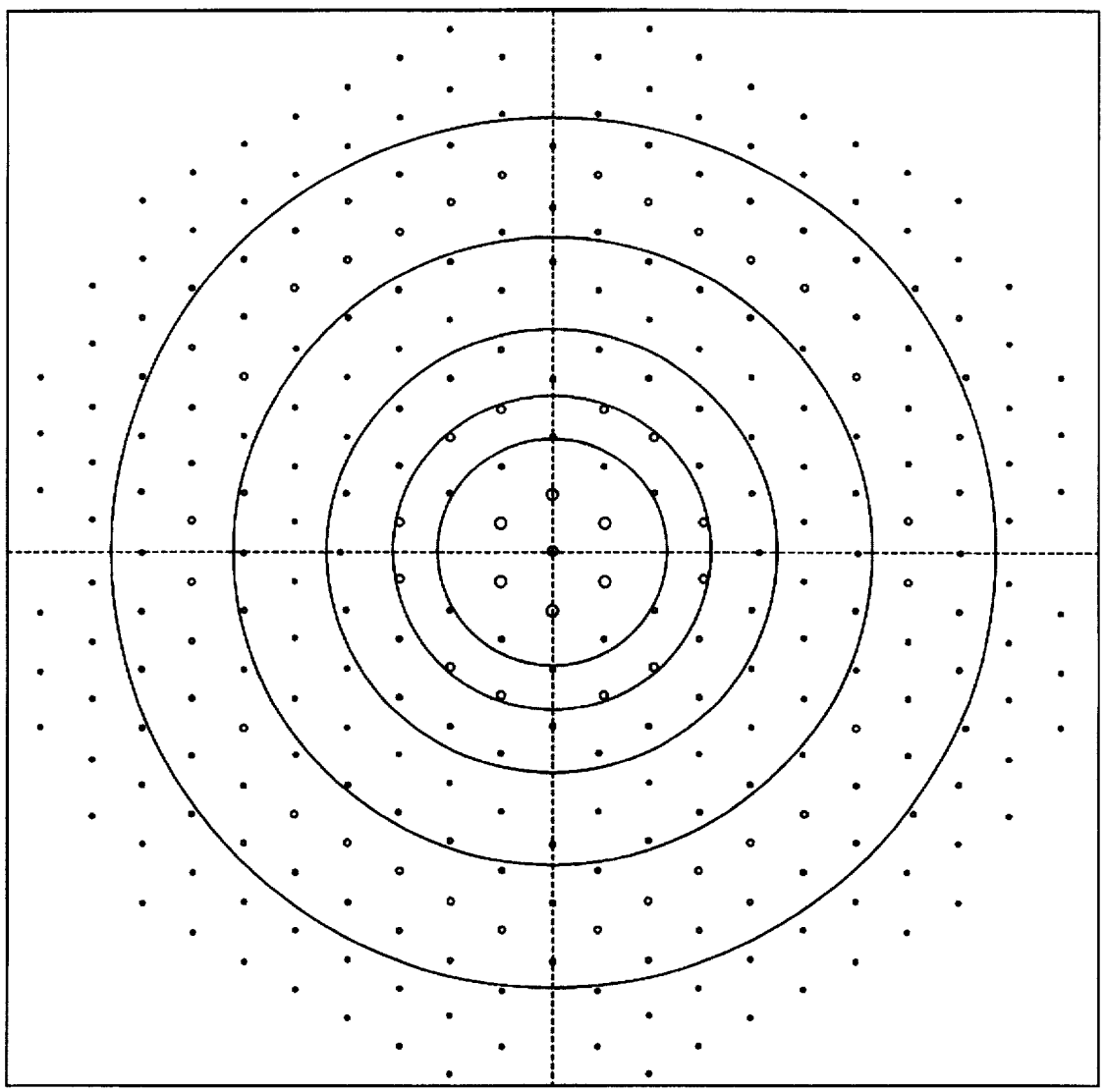
FIGS. 89, 90, and 91 are diagrams which show defocused images of a point light source by the diffusion plate of a seventh embodiment, as shown in FIG. 88, at wavelengths of 450 nm, 550 nm, and 650 nm, when φ is equal to −15° (φ=−15°), respectively.
Figure 90:
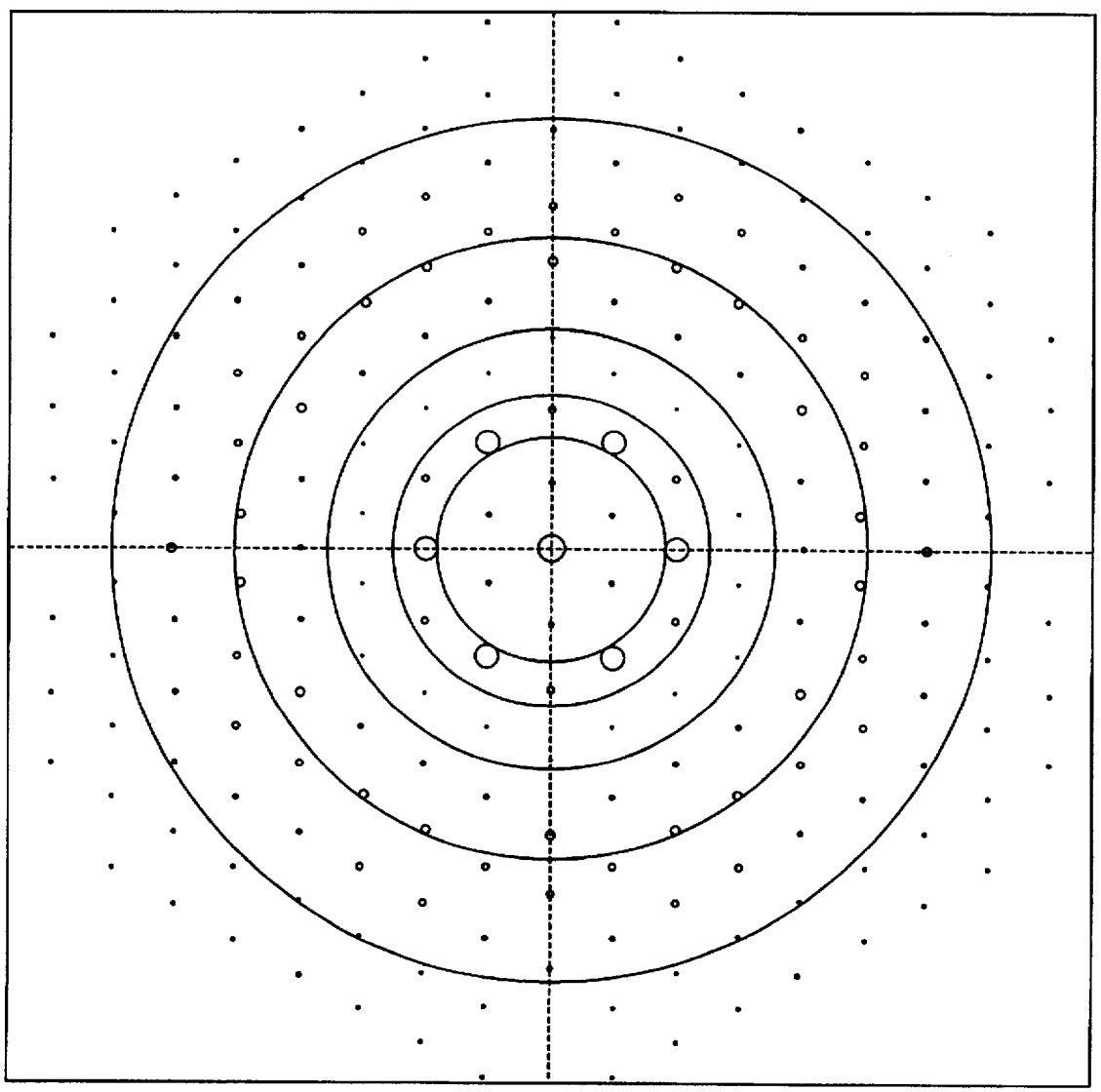
Figure 91:
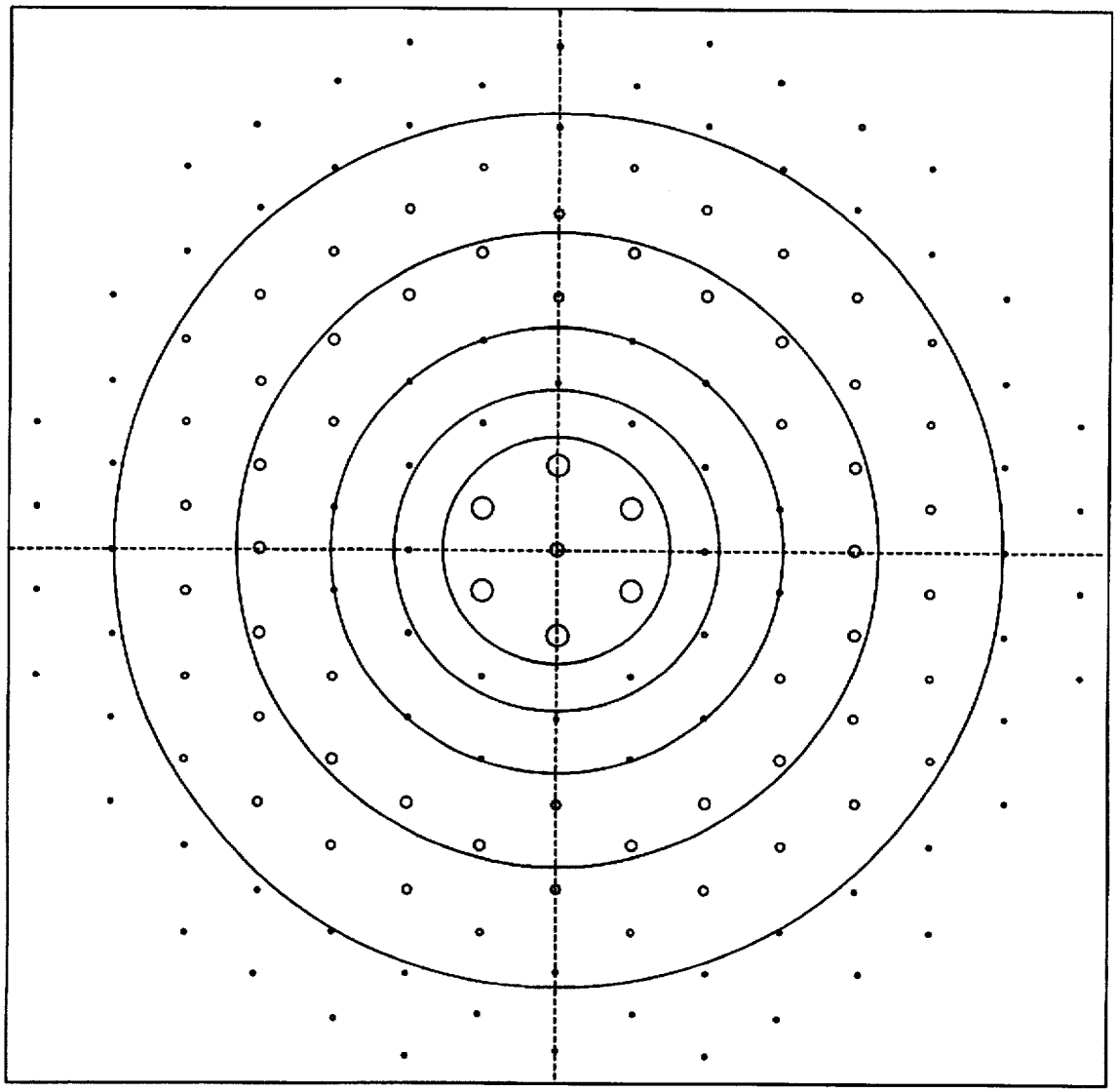

FIGS. 89 through 91 show the state of diffusion, i.e., the defocused images of a point light source at wavelengths of 450 nm, 550 nm, and 650 nm, respectively. In FIGS. 89 through 91, the diameters of the small circles (points) correspond to the intensity of the diffracted light in those directions, and the diameters of the large circles correspond to the F numbers of bundles of rays incident upon the diffusion plate. In the illustrated embodiment, the F numbers are 2.0, 2.8, 4.0, 5.6 and 8.0, in this order, as viewed from the outermost circle, respectively.

Figure 92:
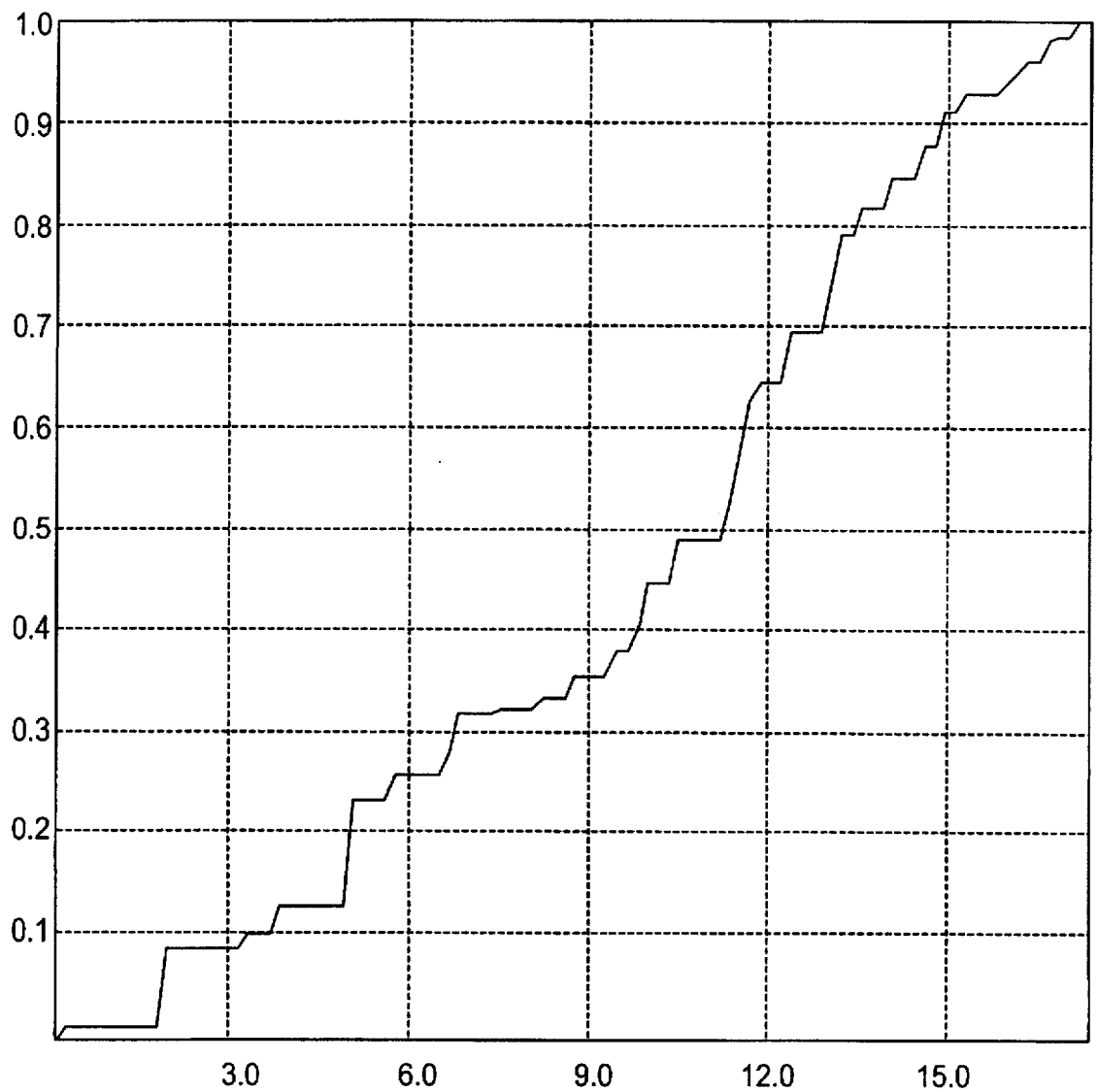
FIGS. 92, 93, and 94 are diagrams showing distributions of light diffused by the diffusion plate of a seventh embodiment of the present invention, as shown in FIG. 88, at φ=−15°, and at wavelengths of 450 nm, 550 nm, and 650 nm, respectively, wherein the abscissa represents the radii of circles and the ordinate represents the quantity of light contained in the circles.
Figure 93:
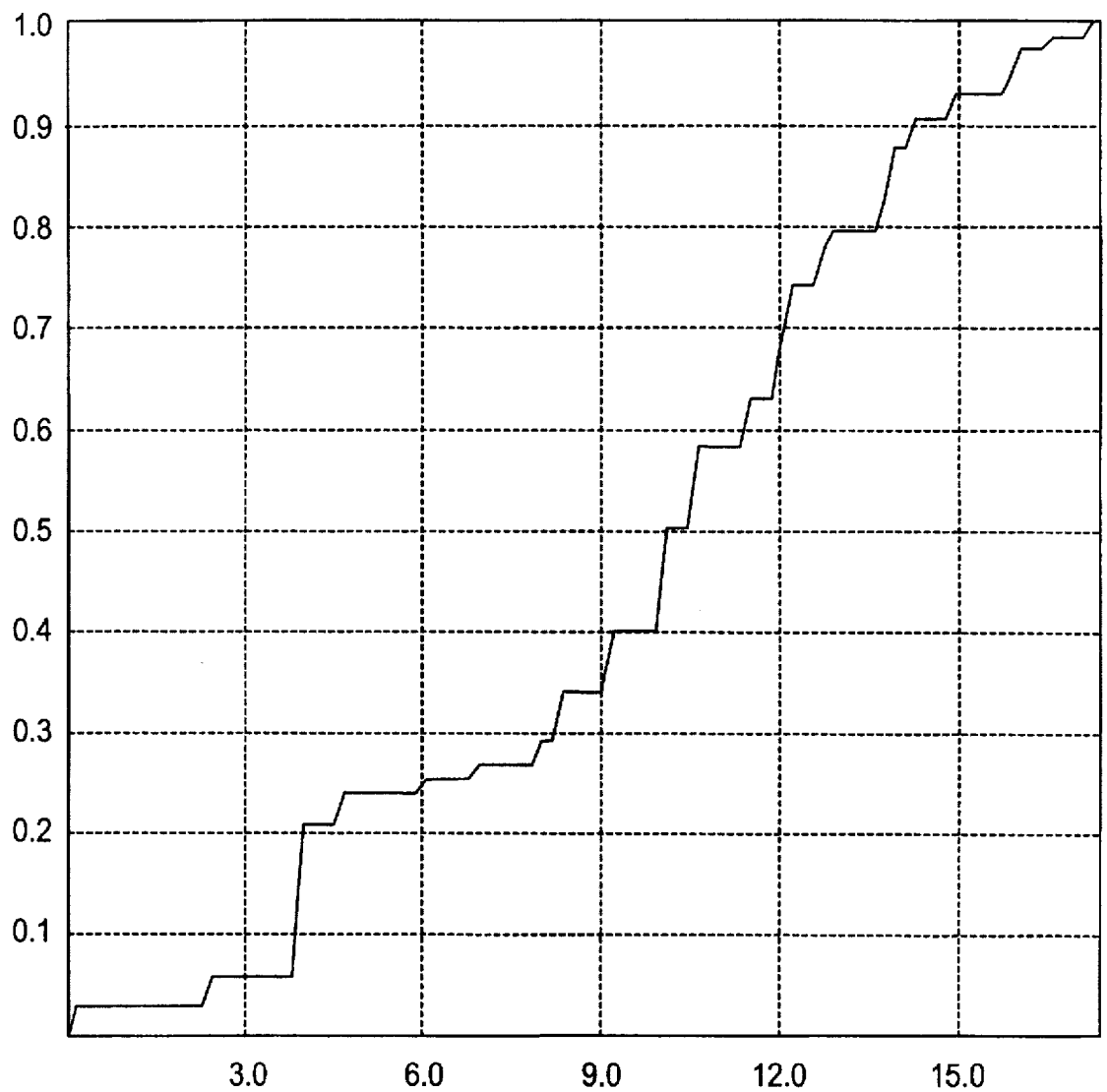
Figure 94:
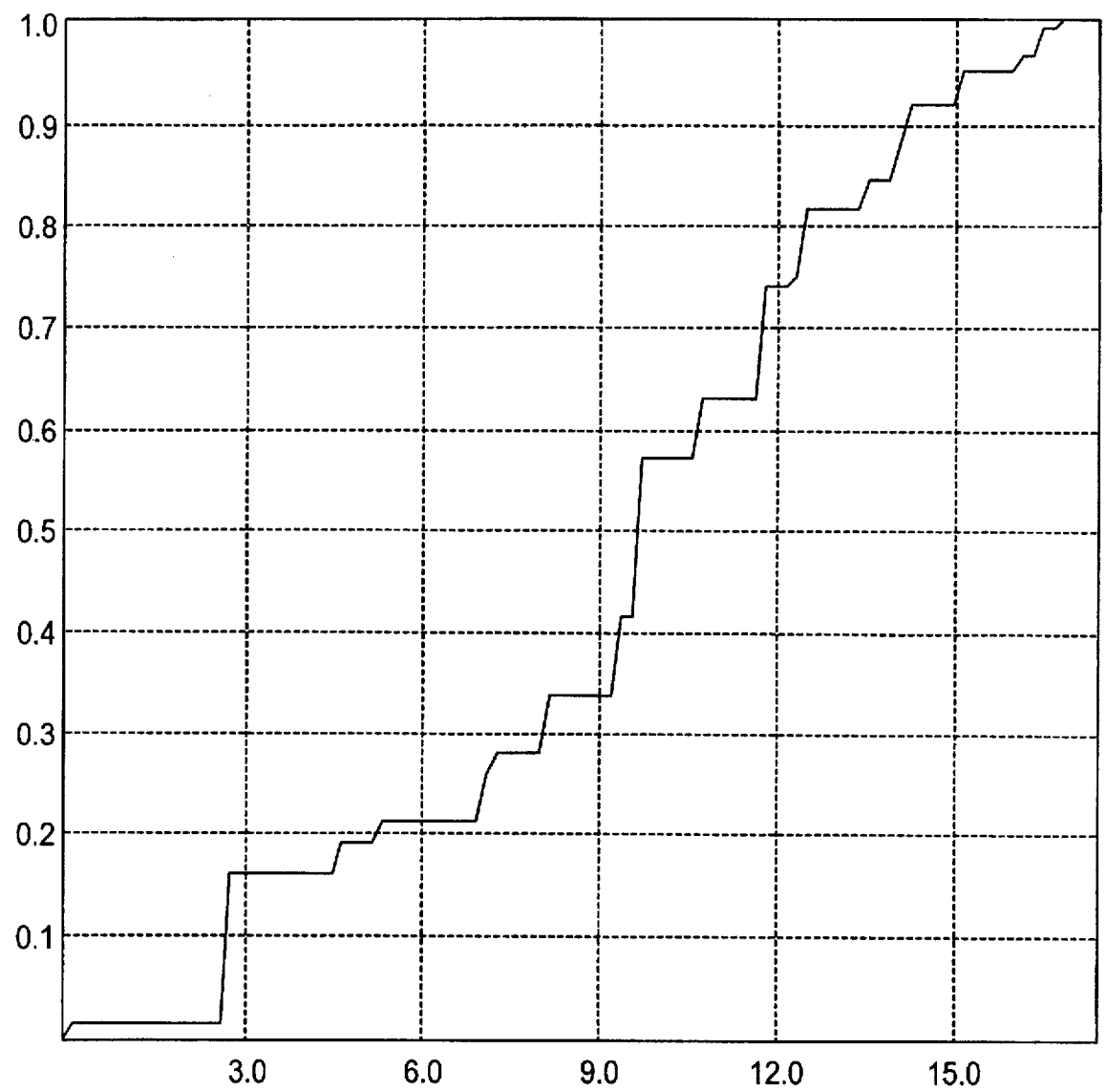

FIGS. 92 through 94 show the quantity of light at wavelengths of 450 nm, 550 nm, and 650 nm, respectively. The abscissae designate the radii of the respective circles and the ordinates designate the quantities of light contained in the respective circles on the assumption that the total quantity of light transmitted through the diffusion plate, as shown in FIG. 26, is 1.0.

Figure 95:
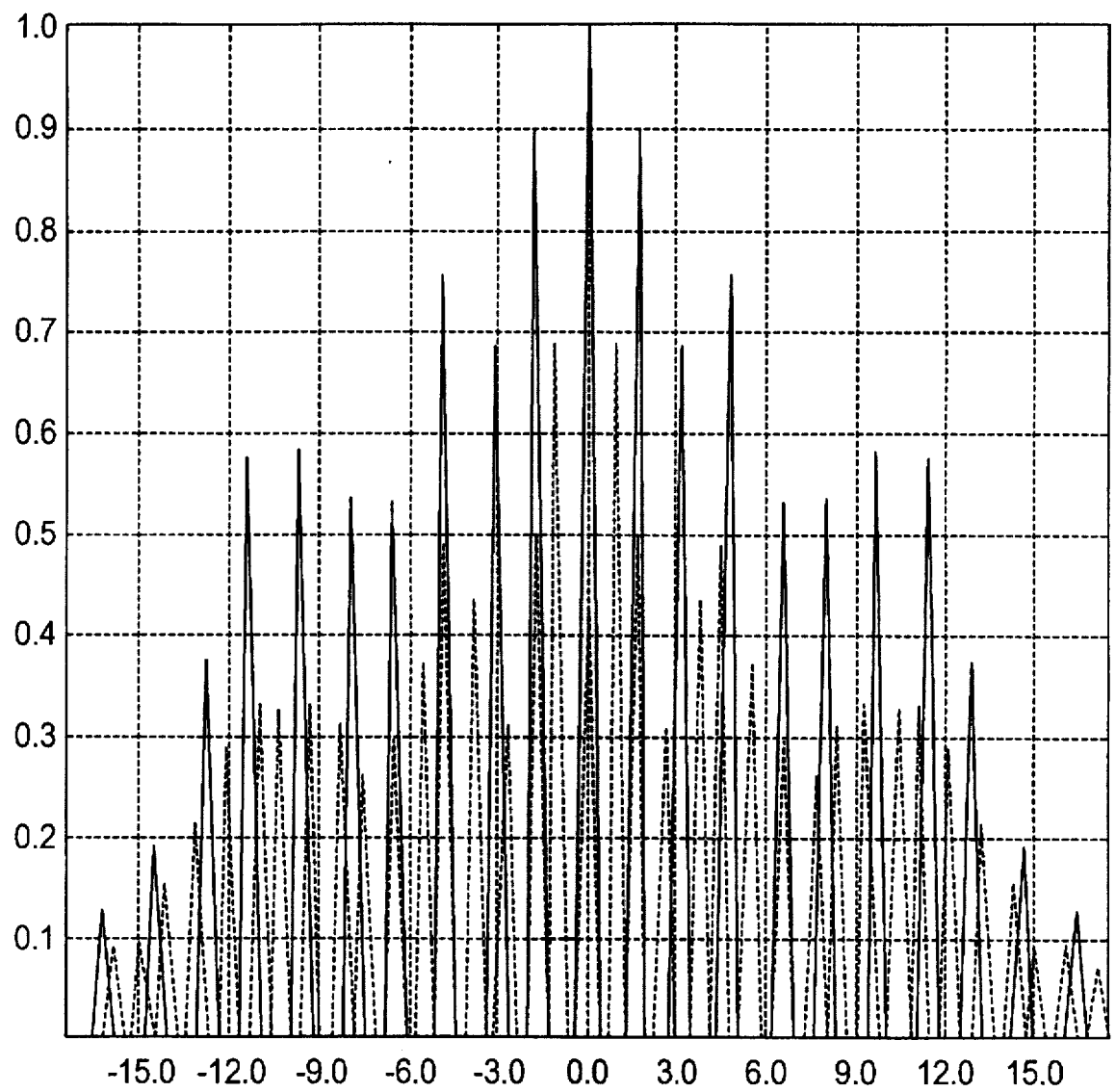
FIGS. 95, 96, and 97 are diagrams showing a defocus of images in the vertical and horizontal directions, obtained by integrating FIGS. 92, 93 and 94 at φ=−15°, and at wavelengths of 450 nm, 550 nm, and 650 nm, respectively.
Figure 96:
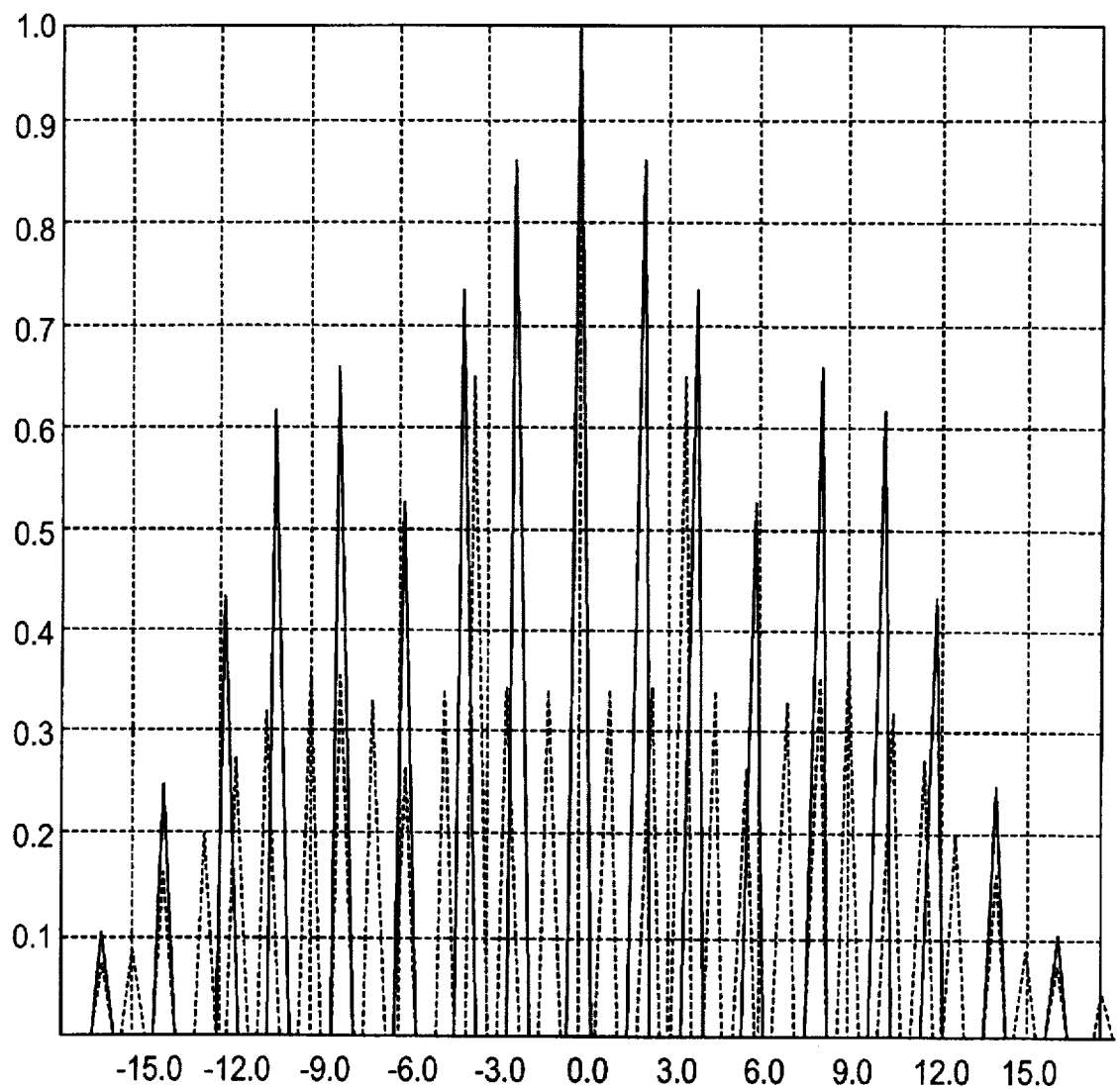
Figure 97:
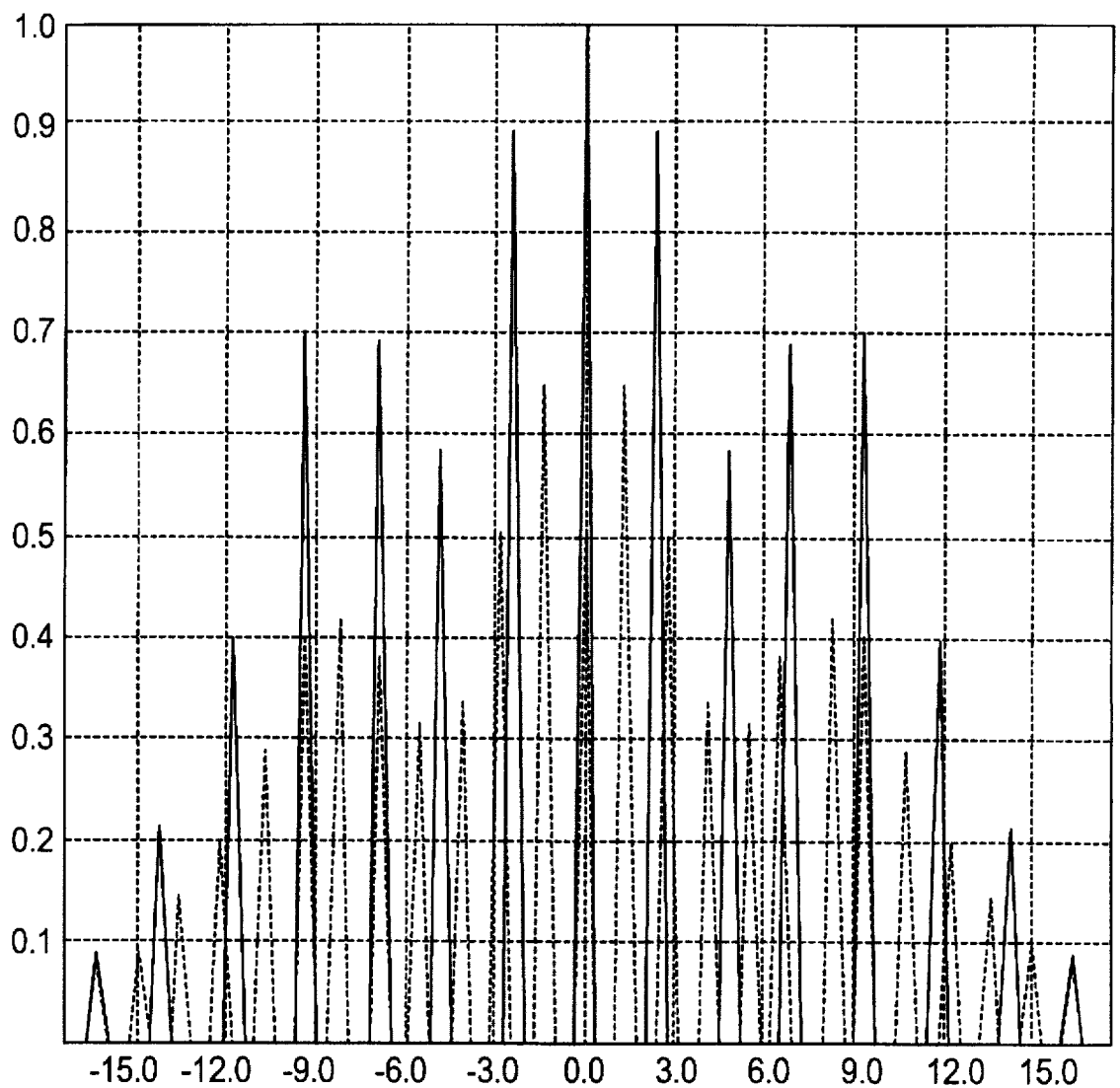

FIGS. 95 through 97 show defocused image intensities of a line light source (longitudinal line light source shown at solid lines and lateral line light source shown at imaginary lines) at wavelengths of 450 nm, 550 nm, and 650 nm, respectively. The abscissae designate the radii of diffraction of the diffraction of light on the assumption that the peak intensity is 1.0.

It is possible to provide diffusion plates having various optical properties, including, e.g., those of the diffusion plate shown in FIG. 40 by making φ=6.78°, and those of the diffusion plate shown in FIG. 26 by making φ=15°, by varying the angle φ. A photographer can optionally select, for example, φ=15° for improved diffusion characteristics, φ=6.78° for a smoother mat structure, or φ=−15° for an intentional off-axis aberration to confirm a focus state.

As can be understood from the above discussion, it is possible to prepare a light diffusion plate having improved diffusion characteristics and less irregularity of color by superimposing basic patterns having microstructures f in a two dimensional periodic arrangement.

The present invention also is directed to the elimination of moire fringes. Specifically, if the diffusion plate is used as a focusing screen 100 in a single lens reflex camera, there is a possibility that moire fringes will occur between the resultant pattern and the pattern of the Fresnel lens which is located in front of the focusing screen as a condenser lens, since the resultant pattern has periodicity even when the non-periodic patterns are superimposed. The moire fringes have an adverse influence on the determination of composition or the visual confirmation of defocus.

Figure 98:
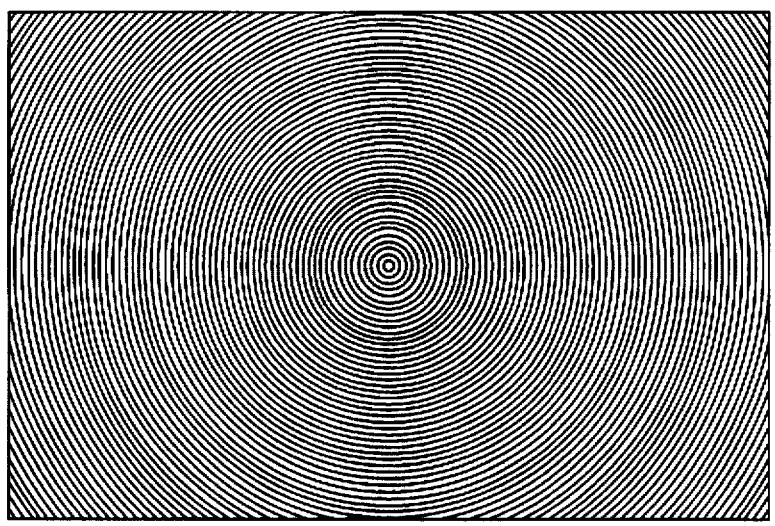
FIG. 98 is a schematic view of a Fresnel lens having a range of 36×24 mm.
Figure 99:
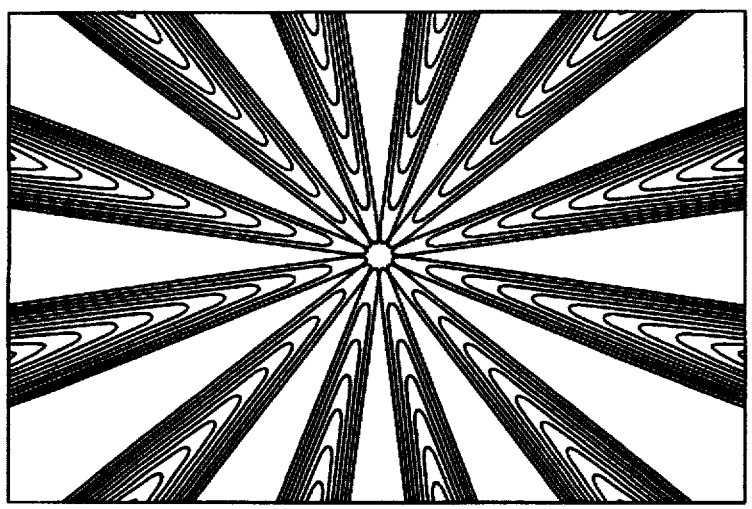
FIG. 99 is a schematic view of a moire pattern which is produced when a diffusion plate, as shown in FIG. 26, and a Fresnel lens, as shown in FIG. 98, are superimposed.

FIG. 98 shows a Fresnel lens F within an area of 36 mm×24 mm. FIG. 99 shows moire fringes which appear when the diffusion plate having the basic patterns shown in FIG. 26 and the Fresnel lens F are superimposed.

To solve the problem mentioned above, the microstructures of at least one of the superimposed basic patterns are rearranged by randomly fluctuating the positions along two dimensions, so that a non-periodic superimposed pattern is formed to prevent the moire fringes.

Figure 100:
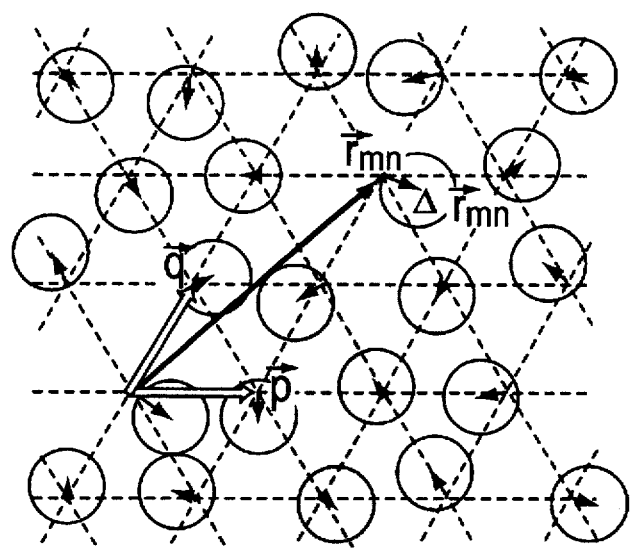
FIG. 100 is an explanatory view of the random positional fluctuation of microstructures added to a two dimensional periodic arrangement.

The coordinates of the lattice points in the two dimensional periodic arrangement are represented by $r_{mn}=mp+nq$, wherein p and q designate the lattice vectors, as shown in FIG. 100. If the random positional fluctuation $\Delta r_{mn}$ is added to this coordinate, the coordinate $g(r)$ of the microstructures is given by $(r_{mn}=mp+\Delta r_{mn})$. The transmission function $f(r)$ of the basic pattern is mathematically obtained by the following equation.

$$f(r) = \sum_{n=-\infty}^{\infty} \sum_{m=-\infty}^{\infty} g(r_{nm} + \Delta r_{nm})$$

$$= \sum_{n=-\infty}^{\infty} \sum_{m=-\infty}^{\infty} g(mp + nq + \Delta r_{nm})$$

For instance, in case of the highest density arrangement in which the microstructures are located at the center and apexes of a regular hexagon, |p|=|q|, and |p|·|q|=|p|·|q|/2, and in case of the square arrangement in which the micro structures are located at the apexes of a square, |p|=|q|, and |p|·|q|=0.

When the fluctuation increases, the moire fringes disappear. The increased fluctuation however deteriorates the quality of the focusing screen. Namely, the screen surface becomes undesirably rough.

According to the inventors' experiments, for the diffusion plate having the basic patterns superimposed in the highest possible density with an angular phase difference of 90°, wherein the length of the lattice vectors was 16 μm, the relationship between the standard deviation σ (μm) of fluctuation, the inconspicuousness of the more fringes, and the surface smoothness of the screen is as shown in Table 1 below. In Table 1, "x" designates that the moire fringes are conspicuous and the screen surface is rough, "Δ" that the moire fringes are only a little conspicuous and the screen surface is fairly smooth, and "○" that the moire fringes are completely inconspicuous and the screen surface is smooth, respectively.

TABLE 1

| standard deviation of fluctuation σ | 0.0 | 0.7 | 1.4 | 2.1 | 2.8 | 3.5 |
|---|---|---|---|---|---|---|
| inconspicuousness | x | Δ | ○ | ○ | ○ | ○ |
| smoothness | ○ | ○ | ○ | Δ | Δ | Δ |

As can be seen from the foregoing, there are limits in the extent to which random positional fluctuations will produce a diffusion plate having the appropriate optical properties. Namely, the standard deviation σ of the fluctuation preferably satisfies the following relationship with respect to the mean value ρ of the lengths of the lattice vectors.

$$0.04 < \sigma/\rho < 0.2$$

$$\sigma = \left| \frac{\sum_k \sum_{mk} \sum_{nk} |\Delta r_{mk,nk}|^2}{\sum_k \sum_{mk} \sum_{nk} 1} \right|^{1/2}$$

$$\rho = \frac{\sum_k (|p_k| + |q_k|)}{\sum_k 2}$$

wherein $\Delta r_{mk,nk}$ designates the fluctuation vector of the $(m_k, n_k)$-th microstructure contained in the k-th basic pattern, $p_k$, $q_k$ the lattice vector of the two dimensional period of the k-th basic pattern, $$\sum_k$$

the sum of the vectors of the basic patterns to be superimposed, and $$\sum_{nk} \sum_{mk}$$

the sum of the vectors of the microstructures contained in the statistical area for the k-th basic pattern, respectively.

Embodiment 8

Figure 101:
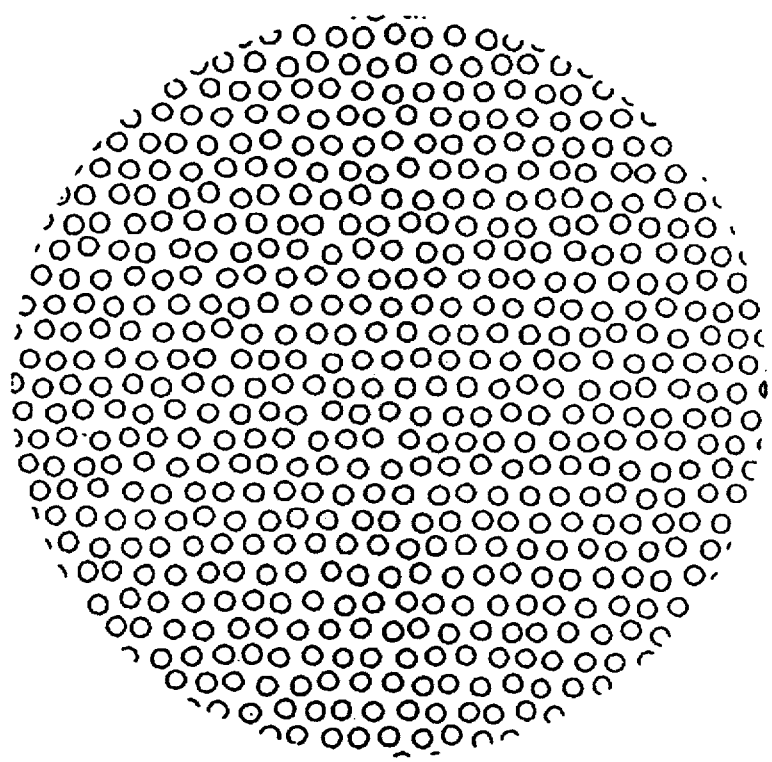
FIGS. 101 and 102 are schematic diagrams of two different basic patterns in an eighth embodiment of the present invention.

FIG. 101 shows a basic pattern of a diffusion plate according to an eighth embodiment, in which the micro lenses (microstructures) of 1.2 μm height and 10 μm diameter are arranged with the highest possible density at a pitch of 16 μm. The lattice vector is represented by p=(16, 0) (μm) and q=(8, 8·3$^{1/2}$) (μm), and the standard deviation ρ of the fluctuation is ρ=1.4 (μm).

Figure 102:
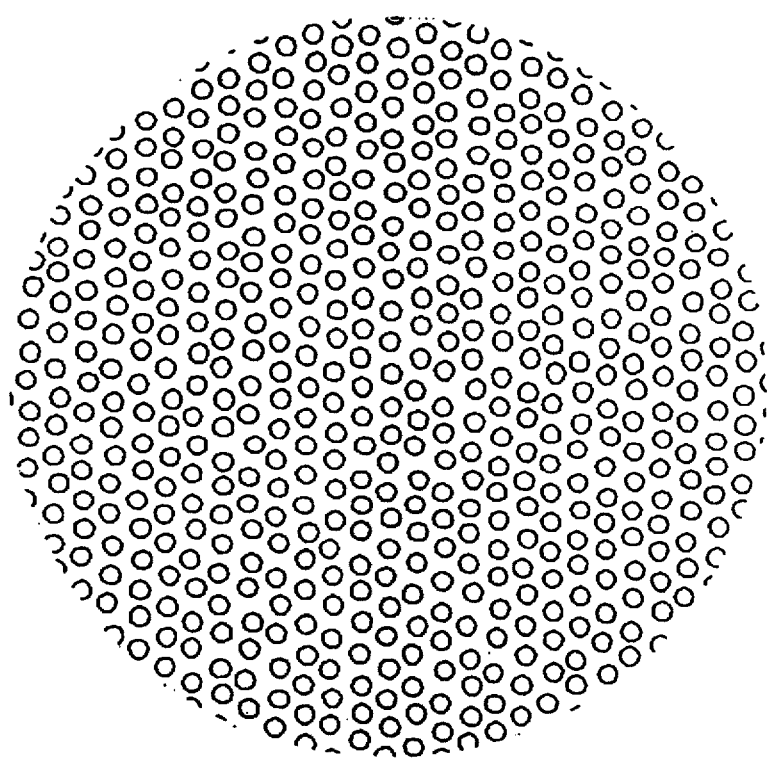

FIG. 102 shows another basic pattern of a diffusion plate according to an eighth embodiment, in which the micro lenses (microstructures) of 1.2 μm height and 10 μm diameter are arranged with the highest possible density at a pitch of 16 μm. The lattice vector is represented by p=(16, 0) (μm) and q=(-8·3$^{1/2}$) 8 (μm), and the standard deviation ρ of the fluctuation is ρ=1.4 (μm). The basic pattern, as shown in FIG. 102, is obtained by turning the basic pattern, as shown in FIG. 101, by 90°.

Figure 103:
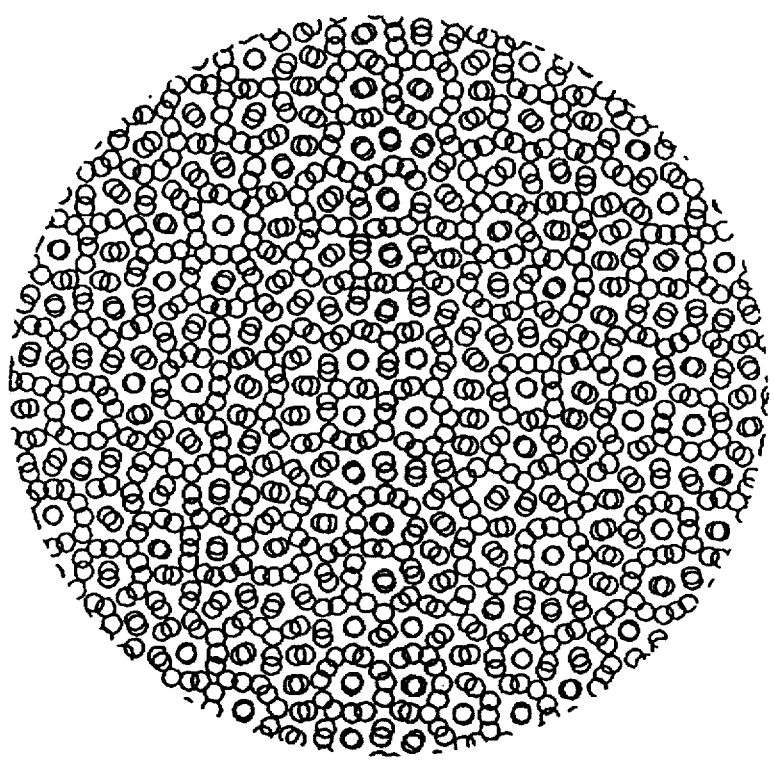
FIG. 103 is a schematic view of a diffusion plate structure made by a combination of the arrangements, as shown in FIGS. 101 and 102, according to an eighth embodiment of the present invention.

FIG. 103 shows a resultant pattern of a diffusion plate which is a combination of the basic patterns shown in FIGS. 101 and 102. In the resultant pattern, σ/ρ=0.088.

Embodiment 9

Figure 104:
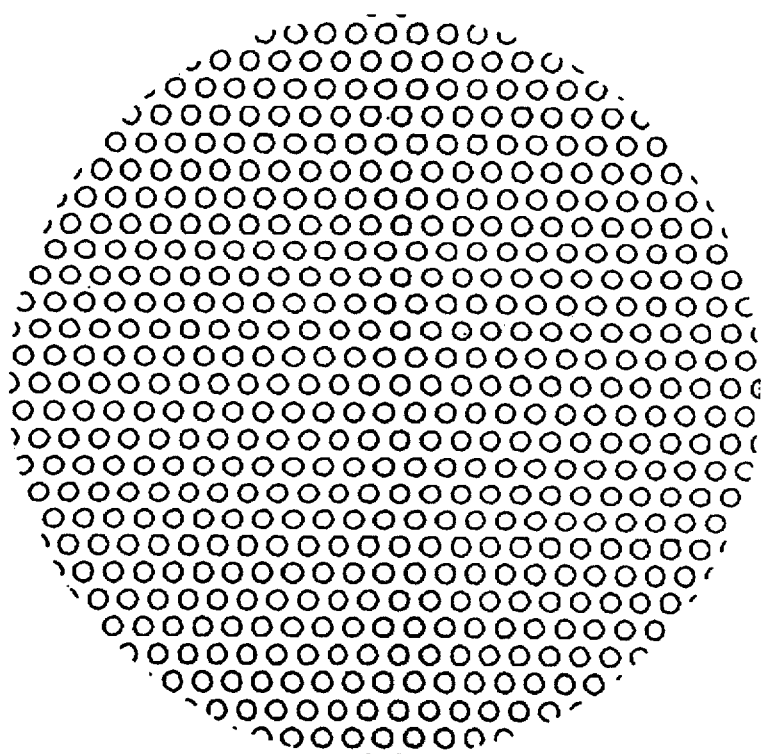
FIGS. 104 and 105 are schematic diagrams of two different basic patterns in a ninth embodiment of the present invention.

FIG. 104 shows a basic pattern of a diffusion plate according to a ninth embodiment, in which the micro lenses (micro structures) of 1.2 μm height and 10 μm diameter are arranged with the highest possible density at a pitch of 16 μm. The lattice vector is represented by p=(16, 0) (μm) and q=(8, 8·3$^{1/2}$) (μm), and the standard deviation ρ of the fluctuation is ρ=0 (μm).

Figure 105:
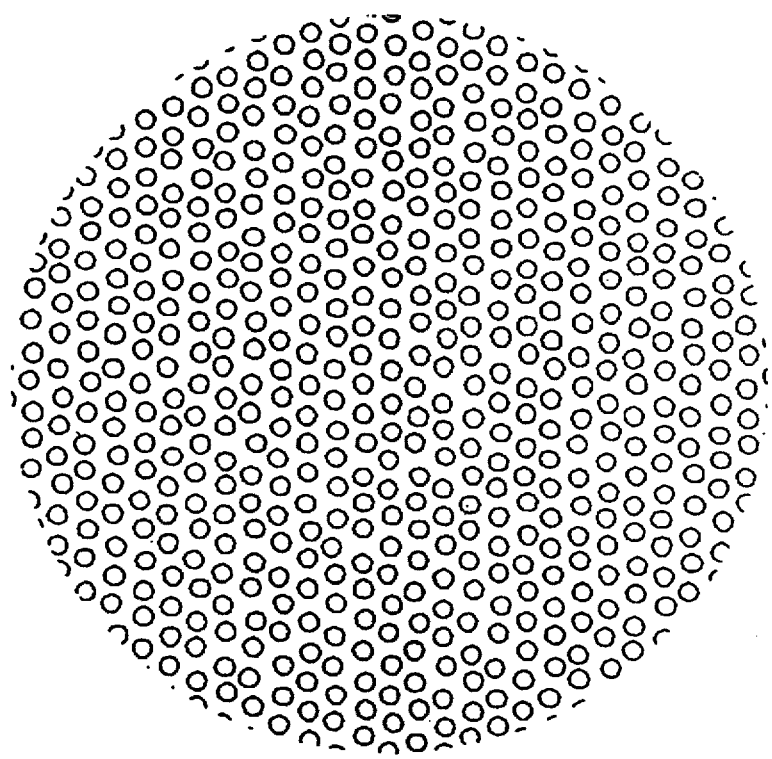

FIG. 105 shows another basic pattern of a diffusion plate according to a ninth embodiment, in which the micro lenses (microstructures) of 1.2 μm height and 10 μm diameter are arranged with the highest possible density at a pitch of 16 μm. The lattice vector is represented by p=(0, 16) (μm) and q=(-8·3$^{1/2}$, 8) (μm), and the standard deviation ρ of the fluctuation is ρ=1.4 (μm), similar to the basic pattern shown in FIG. 102.

Figure 106:
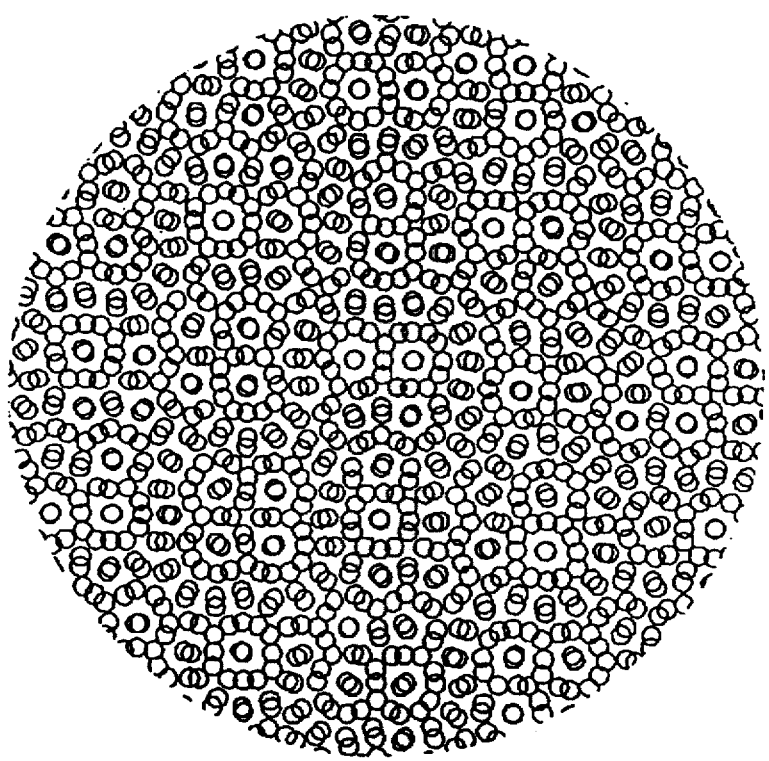
FIG. 106 is a schematic view of a diffusion plate structure made by a combination of the arrangements, as shown in FIGS. 104 and 105, according to a ninth embodiment of the present invention.

FIG. 106 shows a resultant pattern of a diffusion plate which is a combination of the basic patterns shown in FIGS. 104 and 105. In the resultant pattern, σ/ρ=0.044.

As can be understood from the above discussion, if a fluctuation is added to at least one of the basic patterns to be superimposed, the resultant pattern obtained by superimposing the basic patterns is irregular, so that little or no moire fringes occur between the resultant pattern and the pattern of the Fresnel lens. Better diffusion characteristics and less color irregularity can be expected from the resultant pattern thus obtained in comparison with the diffusion plate which is obtained by superimposing the basic patterns having no fluctuation added thereto.

Embodiment 10

Figure 107:
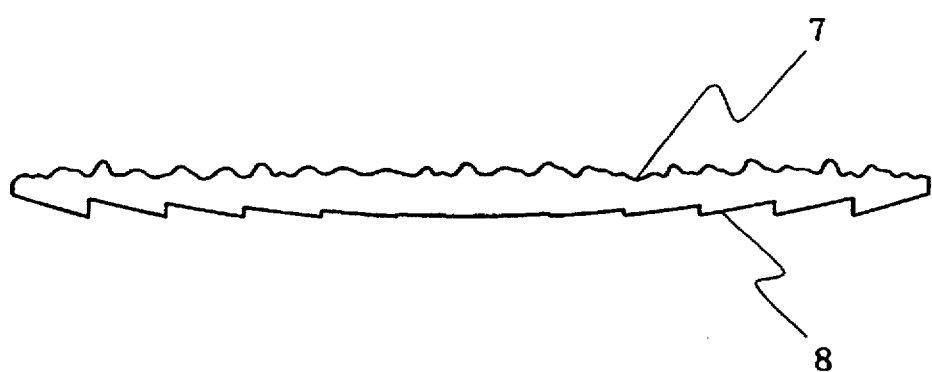
FIG. 107 is a sectional view of a focusing screen according to a tenth embodiment of the present invention.

FIG. 107 shows a cross sectional view of a focusing screen of a diffusion plate according to a tenth embodiment, in which a diffusion surface 7 is formed on one of opposite surfaces of a plate and a Fresnel lens 8 is formed on the other surface of the same plate, respectively.

Embodiment 11

Figure 108:
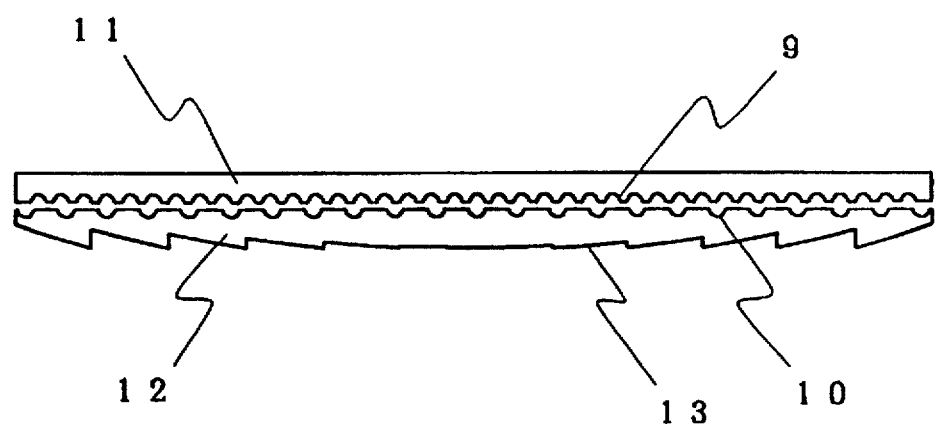
FIG. 108 is a sectional view of a focusing screen according to an eleventh embodiment of the present invention.

FIG. 108 shows a cross sectional view of a focusing screen of a diffusion plate according to an eleventh embodiment, in which the diffusion surfaces, having basic patterns 9 and 10, are provided on opposed diffusion plates 11 and 12. The Fresnel lens 13 is formed on the surface of the diffusion plate 12 opposite to the diffusion surface.

Embodiment 12

The following discussion will be directed to a method for manufacturing a master die for a diffusion plate according to the present invention.

Figure 109:
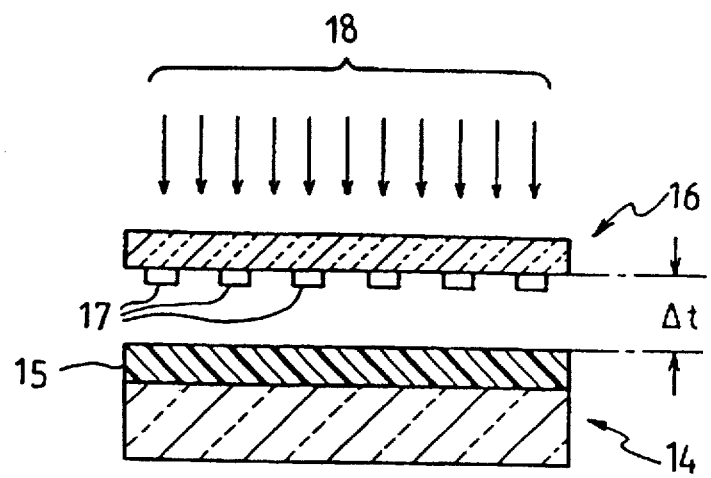
FIG. 109 is a sectional view of a substrate and a mask.

In FIG. 109, a substrate 14, which is made of, for example, glass, is provided with a positive photoresist film 15 of a uniform thickness (e.g., 2~3 μm thickness) coated thereon by a spin-coat method, for example, as a photosensitive material.

Figure 110:
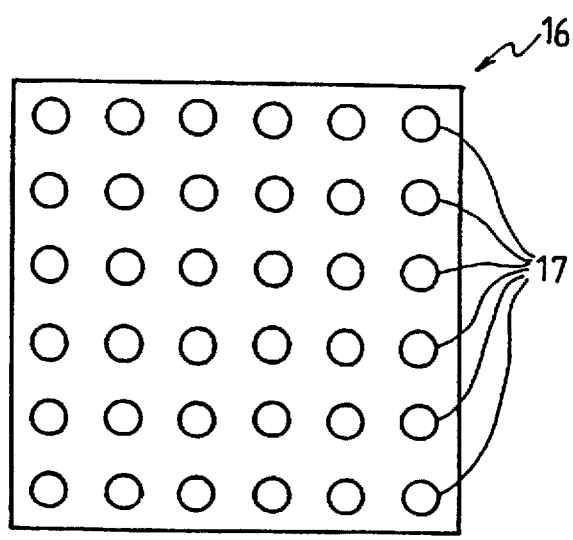
FIG. 110 is a plan view of a micro pattern formed on a mask shown in FIG. 109.

An exposing glass mask 16, which is used to form a predetermined pattern exposed onto the positive photoresist film 15, is provided with a dot pattern 17 of chrome in the shape of micro projections, as shown in FIG. 110. The micro pattern 17 is made of micro lenses having a diameter of 10~20 μm and spaced from one another at a pitch of 15~20 μm.

The mask 16 is spaced from the substrate 14 at a distance Δt (e.g., about 75 μm). Thereafter, the mask 16 is illuminated with UV (ultra violet) light 18 from behind the micro pattern 17 of the mask 16 for a predetermined time to project and expose the micro pattern 17 onto the surface of the positive photoresist film 15.

Figure 111:
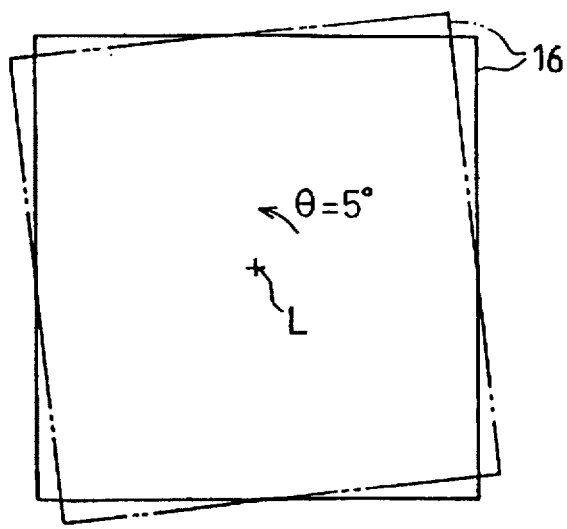
FIG. 111 is a plan view showing the relative rotation of a mask.

After that, as shown in FIG. 111, the mask 16 is rotated in a predetermined direction by an angle Θ (e.g., Θ=5°) about an axis L perpendicular to the sheet of the drawing within the small plane, and the exposure is then effected again.

Figure 112A:
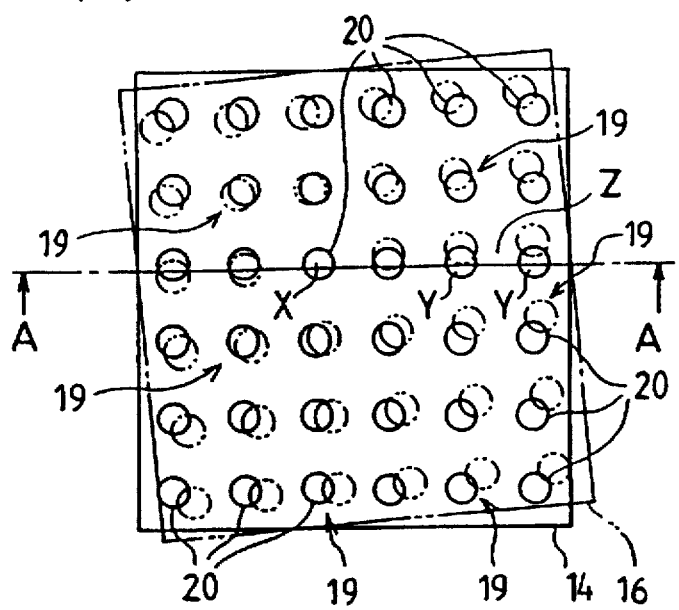
FIGS. 112a and 112b are a plan view of a projected micro pattern which is produced when regular micro patterns are superimposed, and a sectional view of an uneven micro relief formed by a projected micro pattern, as shown in FIG. 112a, respectively; and, FIG. 113 is a schematic view of the main components of a single lens reflex camera to which the present invention is applied, by way of example.
Figure 112B:
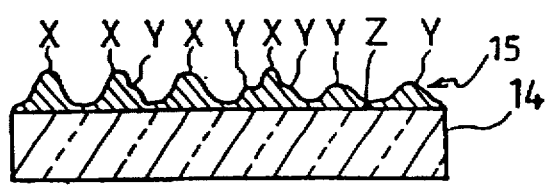

After these operations are finished, the substrate 14 is subject to the development process, so that the uneven relief pattern 19 (micro projections and indentations), as shown in FIG. 112a, is formed on the positive photoresist film 15.

The relief pattern 19, thus obtained, is not regular and includes different heights and shapes of micro projections and depressions. Namely, highest portions X are formed by the projected and overlapped dots 20 which constitute the micro pattern 19, intermediate portions Y are formed by the projected dots 20 without being overlapped, and lowest portions Z are formed by the portions other than the dots 20.

Since the distance Δt between the position photoresist film 15 and the mask 16 is 75 μm, so that the scattered UV light 18 can reach the micro pattern 17, the portions other than the dots 20 are not linear and are smoothly curved, so that the whole micro pattern 19 defines a smoothly curved surface.

The substrate 14 can be thus manufactured by copying the master die. The electroforming die is prepared by the substrate 14, and the pattern can be transferred to an optical resin material using injection molding, for example, to manufacture a light diffusion plate having an improved diffusibility, less granularity and an improved diffusion characteristic.

The mask 16 is usually formed by a photolithography process which is per se known. A regular pattern, as shown in FIG. 1, or a pattern having a positional fluctuation, as shown in FIG. 101, is drawn by a photo plotter or the like to prepare a reticle. The reticle is then projected by reduced magnification and discontinuously moved to be repeatedly exposed, so that a desired size of mask can be prepared. The size and the pitch, etc., of the micro patterns 19 can be optionally selected depending on the required properties of the diffusion plate. The random positional deviation can also be controlled in pseudo-random numbers by a computer.

In the illustrated embodiment, the diffusion plate is formed by superimposing the two dimensional periodic patterns of microstructures or superimposing a random positional fluctuation of microstructures to at least one of the two dimensional periodic patterns, as mentioned above. Nevertheless, the diffusion plate does not necessarily have uniform periodicity as a whole. Namely, it is possible to use a diffusion plate which has different basic patterns at the center portion and peripheral portion thereof.

Although the master die is prepared by multi-exposure while relatively rotating the mask, in the illustrated embodiment, it is possible to prepare a master die by one exposure using a mask on which the overlapped pattern is drawn in advance.

The number of the basic patterns to be superimposed is not limited to two and can be more than two in the present invention.

As can be seen from the above discussion, according to the present invention, a light diffusion plate is obtained whose diffusion property can be controlled so as not to produce a rough surface visual effect when used as a focusing screen. The light diffusion plate thus obtained is substantially free from an off-axis aberration and an irregularity in color. No moire fringe occurs between the Fresnel lens and the diffusion plate of the present invention.

Furthermore, unlike the periodic diffusion plate in which even a slight constitutional fault of the microstructure is conspicuous, a diffusion plate of the present invention prevents such a fault from being conspicuous, thus resulting in an increased yield of good products.

We claim:

1. A method for preparing a master die for a diffusion plate, comprising:

providing a substrate having a coating of a photosensitive material;

positioning a mask having a pattern at a predetermined distance from the substrate and at a first relative angular position with respect to the substrate;

illuminating the mask to project the pattern onto the photosensitive material;

rotating one of the substrate and the mask through a predetermined angle relative to the other in a predetermined direction within a plane to define a second relative angular position of the mask with respect to the substrate;

again illuminating the mask said second relative angular position to project the pattern onto the photosensitive material to form a composite patterned structure in said photosensitive material on the substrate; and developing said photosensitive material to form a structure on the substrate.

2. A method for manufacturing a master die for a diffusion plate, comprising the steps of:

providing a substrate having a photoresist;

providing a mask having a mask pattern;

illuminating the photoresist through said mask, forming a first image of the mask pattern in the photoresist;

rotating the mask by a predetermined angle; and again illuminating the photoresist through the mask, forming a second image of the mask pattern in the photoresist, thereby forming a combined pattern in the photoresist.

3. The method of manufacturing a master die according to claim 2, wherein the combined pattern is periodic.

4. The method of manufacturing a master die according to claim 2, wherein the combined pattern is not periodic.

5. The method of manufacturing a master die according to claim 2, wherein the mask pattern includes a plurality of circles arranged with a maximum density.

6. The method of manufacturing a master die according to claim 5, wherein the mask pattern has a positional fluctuation.

7. The method of manufacturing a master die according to claim 2, wherein the mask pattern includes a plurality of hexagonal shapes having maximum density.

8. The method of manufacturing a master die according to claim 2, wherein said combined pattern is a curved smooth surface having an irregular curvature.

9. A method for manufacturing a diffusion plate, comprising the steps of:
 providing a substrate having a photoresist;
 providing a mask having a mask pattern;
 illuminating the photoresist through the mask to form a first image of the mask pattern in the photoresist;
 rotating the mask by a predetermined angle about an axis perpendicular to a plane defined by said substrate;
 again illuminating the photoresist through the mask, forming a second image of the mask pattern in the photoresist to form a combined pattern in the photoresist;
 developing the photoresist to form a master die with an uneven relief pattern; and
 transferring the uneven relief pattern to an optical material to form the diffusion plate.

10. The method of manufacturing a master die according to claim 9, wherein the combined pattern is periodic.

11. The method of manufacturing a master die according to claim 9, wherein the combined pattern is non-periodic.

12. The method of manufacturing a master die according to claim 9, wherein the mask pattern includes a plurality of circles arranged with a maximum density.

13. The method of manufacturing a master die according to claim 12, wherein the mask pattern has a positional fluctuation.

14. The method of manufacturing a master die according to claim 9, wherein the mask pattern includes a plurality of hexagonal shapes having maximum density.

15. The method of manufacturing a master die according to claim 9, wherein the combined pattern is a smooth curved surface having an irregular curvature.

* * * * *

UNITED STATES PATENT AND TRADEMARK OFFICE
CERTIFICATE OF CORRECTION

PATENT NO. : 5,733,710
DATED : March 31, 1998
INVENTOR(S) : Hiroshi KUBOYA et al.

It is certified that error appears in the above-indentified patent and that said Letters Patent is hereby corrected as shown below:

Title page, item [57] ABSTRACT, the Abstract should read as follows:

---A method is provided for manufacturing a master die for a diffusion plate. A substrate having a photoresist and a mask having a pattern are provided. The photoresist is illuminated through the mask to form an image in the photoresist. The mask is then rotated by a predetermined angle, whereupon the photoresist is again illuminated through the mask. The two illumination steps form a combined pattern in the photoresist.---

Signed and Sealed this

First Day of June, 1999

Attest:

Attesting Officer

Q. TODD DICKINSON

Acting Commissioner of Patents and Trademarks